(12) United States Patent
Watanabe et al.

(10) Patent No.: US 9,105,444 B2
(45) Date of Patent: *Aug. 11, 2015

(54) ELECTRO-OPTICAL INSPECTION APPARATUS AND METHOD WITH DUST OR PARTICLE COLLECTION FUNCTION

(71) Applicant: Ebara Corporation, Tokyo (JP)

(72) Inventors: Kenji Watanabe, Tokyo (JP); Masahiro Hatakeyama, Tokyo (JP); Yoshihiko Naito, Tokyo (JP); Tatsuya Kohama, Tokyo (JP); Kenji Terao, Tokyo (JP); Takeshi Murakami, Tokyo (JP); Takehide Hayashi, Tokyo (JP); Kiwamu Tsukamoto, Tokyo (JP); Hiroshi Sobukawa, Tokyo (JP); Norio Kimura, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 0 days.
This patent is subject to a terminal disclaimer.

(21) Appl. No.: 14/096,361

(22) Filed: Dec. 4, 2013

(65) Prior Publication Data
US 2014/0091215 A1 Apr. 3, 2014

Related U.S. Application Data

(63) Continuation of application No. 13/195,927, filed on Aug. 2, 2011, now Pat. No. 8,624,182.

(30) Foreign Application Priority Data

Aug. 3, 2010 (JP) .................................. 2010/174338
Aug. 20, 2010 (JP) .................................. 2010/184629

(51) Int. Cl.
*H01J 37/24* (2006.01)
*H01J 37/02* (2006.01)
(Continued)

(52) U.S. Cl.
CPC ............... *H01J 37/22* (2013.01); *H01J 37/265* (2013.01); *H01J 37/29* (2013.01);
(Continued)

(58) Field of Classification Search
CPC ........... H01J 37/04; H01J 37/05; H01J 37/10; H01J 37/141; H01J 37/145; H01J 37/26; H01J 37/261; H01J 37/28
USPC ................................. 250/306, 307, 310, 311
See application file for complete search history.

(56) References Cited

U.S. PATENT DOCUMENTS 5,159,196 A * 10/1992 Kolbenschlag ................... 850/9
5,591,971 A * 1/1997 Shahar et al. ................. 250/310
(Continued)

FOREIGN PATENT DOCUMENTS

JP 4-249248 9/1992
JP 11-108864 4/1999
(Continued)

*Primary Examiner* — Jack Berman
*Assistant Examiner* — David E Smith
(74) *Attorney, Agent, or Firm* — Wenderoth, Lind & Ponack, L.L.P.

(57) ABSTRACT

An electro-optical inspection apparatus is provided that is capable of preventing adhesion of dust or particles to the sample surface as much as possible. A stage (100) on which a sample (200) is placed is disposed inside a vacuum chamber (112) that can be evacuated to vacuum, and a dust collecting electrode (122) is disposed to surround a periphery of the sample (200). The dust collecting electrode (122) is applied with a voltage having the same polarity as a voltage applied to the sample (200) and an absolute value that is the same or larger than an absolute value of the voltage. Thus, because dust or particles such as particles adhere to the dust collecting electrode (122), adhesion of the dust or particles to the sample surface can be reduced. Instead of using the dust collecting electrode, it is possible to form a recess on a wall of the vacuum chamber containing the stage, or to dispose on the wall a metal plate having a mesh structure to which a predetermined voltage is applied. In addition, adhesion of dust or particles can be further reduced by disposing a gap control plate (124) having a through hole (124a) at the center above the sample (200) and the dust collecting electrode (122).

8 Claims, 45 Drawing Sheets

(51) Int. Cl.
*H01J 37/22* (2006.01)
*H01J 37/26* (2006.01)
*H01J 37/29* (2006.01)

(52) U.S. Cl.
CPC ..... *H01J 2237/004* (2013.01); *H01J 2237/022* (2013.01); *H01J 2237/24495* (2013.01); *H01J 2237/24564* (2013.01); *H01J 2237/2817* (2013.01)

(56) References Cited

U.S. PATENT DOCUMENTS

| | | | |
|---|---|---|---|
| 6,011,262 | A | 1/2000 | Hamashima et al. |
| 8,624,182 | B2 * | 1/2014 | Watanabe et al. ............ 250/307 |
| 2002/0070340 | A1 | 6/2002 | Veneklasen et al. |
| 2002/0148960 | A1 * | 10/2002 | Todokoro et al. ............ 250/310 |
| 2007/0194235 | A1 | 8/2007 | Kimba et al. |
| 2008/0173814 | A1 * | 7/2008 | Watanabe et al. ............ 250/310 |
| 2008/0237465 | A1 | 10/2008 | Hatano et al. |
| 2008/0251718 | A1 * | 10/2008 | Kaga et al. ................... 250/310 |
| 2010/0019149 | A1 * | 1/2010 | Watanabe et al. ............ 250/310 |
| 2011/0155905 | A1 | 6/2011 | Hatakeyama et al. |

FOREIGN PATENT DOCUMENTS

| | | | |
|---|---|---|---|
| JP | 2005-235777 | | 9/2005 |
| JP | 2005-292157 | | 10/2005 |
| JP | 2007-149449 | A | 6/2007 |
| JP | 2008-211018 | | 9/2008 |
| JP | 2008211018 | A * | 9/2008 |
| JP | 2009-4161 | | 1/2009 |
| JP | 2009-87893 | | 4/2009 |
| JP | 2010-56270 | | 3/2010 |
| WO | 2009/125603 | | 10/2009 |
| WO | WO 2009125603 | A1 * | 10/2009 |

* cited by examiner

DIAGRAM VIEWED FROM UNDERSIDE OF MOVABLE NA

| L.E[eV] | CONDUCTIVE MATERIAL | INSULATION MATERIAL | CONTRAST |
|---|---|---|---|
| 5 | 15 | 10 | 0.3 |
| 2 | 45 | 20 | 0.6 |
| −1 | 200 | 50 | 0.8 |
| −2 | 210 | 190 | 0.1 |
| −5 | 220 | 220 | 0.0 |

| DOSE [mC/cm$^2$] | CONTRAST |
|---|---|
| 0 | 0 |
| 0.2 | 0.1 |
| 0.4 | 0.4 |
| 0.6 | 0.6 |
| 0.8 | 0.7 |
| 1 | 0.8 |
| 1.2 | 0.8 |
| 1.4 | 0.8 |

| L.B [kV] | Cu | SiO$_2$ | CONTRAST |
|---|---|---|---|
| 0.01 | – | – | 0.333 |
| 0.1 | 0.8 | 1.2 | 0.269 |
| 0.15 | 0.95 | 1.3 | 0.241 |
| 0.2 | 1.1 | 1.45 | 0.253 |
| 0.25 | 1.12 | 1.6 | 0.231 |
| 0.27 | 1.13 | 1.47 | 0.207 |
| 0.3 | 1.15 | 1.45 | 0.129 |
| 0.4 | 1.22 | 1.4 | 0.111 |
| 0.5 | 1.2 | 1.35 | 0.106 |
| 0.6 | 1.18 | 1.32 | 0.115 |
| 0.7 | 1.15 | 1.3 | 0.115 |
| 1 | 0.9 | 1.2 | 0.250 |
| 1.5 | 0.6 | 1 | 0.400 |
| 2 | 0.5 | 0.85 | 0.412 |
| 3 | 0.45 | 0.75 | 0.400 |

| AREA RATIO(CONDUCTOR:INSULATOR) | LEEM | SEM |
|---|---|---|
| 1:2 | 0.5 | 0.2 |
| 1:4 | 0.6 | 0.18 |
| 1:6 | 0.7 | 0.16 |
| 1:8 | 0.75 | 0.1 |
| 1:10 | 0.8 | 0.05 |

| L.B [kV] | CONTRAST | LUMINANCE OF CONDUCTIVE MATERIAL [DN] | LUMINANCE OF INSULATION MATERIAL [IN] |
|---|---|---|---|
| 1.2 | 0.00 | 233.44 | 238.19 |
| 1.4 | 0.00 | 233.75 | 239.94 |
| 1.6 | 0.00 | 231.81 | 237.88 |
| 1.8 | 0.00 | 231.94 | 237.56 |
| 2 | 0.00 | 230.06 | 234.06 |
| 2.2 | 0.00 | 229.44 | 231.06 |
| 2.4 | 0.03 | 231.50 | 225.00 |
| 2.6 | 0.04 | 227.31 | 217.13 |
| 2.8 | 0.10 | 213.94 | 193.13 |
| 3 | 0.29 | 190.63 | 135.00 |
| 3.2 | 0.41 | 134.56 | 80.00 |
| 3.4 | 0.29 | 84.44 | 60.00 |
| 3.6 | 0.17 | 42.19 | 35.00 |
| 3.8 | 0.05 | 9.45 | 9.00 |
| 4 | 0.01 | 6.07 | 6.00 |
| 4.2 | 0.00 | 1.58 | 1.58 |

| BEAM DOSE [mC/cm$^2$] | CONTRAST | LUMINANCE OF CONDUCTIVE MATERIAL [DN] | LUMINANCE OF INSULATION MATERIAL [IN] |
|---|---|---|---|
| 0.10 | 0.415 | 65 | 38 |
| 0.20 | 0.538 | 65 | 30 |
| 0.30 | 0.615 | 65 | 25 |
| 0.40 | 0.692 | 65 | 20 |
| 0.60 | 0.738 | 65 | 17 |
| 1.00 | 0.815 | 65 | 12 |
| 1.50 | 0.831 | 65 | 11 |
| 2.00 | 0.831 | 65 | 11 |

| BEAM DOSE [mC/cm²] | 35nmL&S | 43nmL&S | 65nmL&S |
|---|---|---|---|
| 0.1 | 0.09 | 0.100 | 0.11 |
| 0.2 | 0.135 | 0.150 | 0.165 |
| 0.3 | 0.18 | 0.200 | 0.22 |
| 0.4 | 0.225 | 0.250 | 0.275 |
| 0.5 | 0.27 | 0.300 | 0.33 |
| 1.0 | 0.495 | 0.550 | 0.605 |
| 1.5 | 0.72 | 0.800 | 0.88 |
| 2.0 | 0.9 | 1.000 | 1.1 |

| L.E [eV] | CONTRAST | LUMINANCE OF CONDUCTIVE MATERIAL [DN] | LUMINANCE OF INSULATION MATERIAL [IN] |
|---|---|---|---|
| 1.2 | 0.01 | 233.44 | 231.06 |
| 1.4 | 0.04 | 233.75 | 225.00 |
| 1.6 | 0.06 | 231.81 | 217.13 |
| 1.8 | 0.17 | 231.94 | 193.13 |
| 2 | 0.41 | 230.06 | 135.00 |
| 2.2 | 0.65 | 229.44 | 80.00 |
| 2.4 | 0.79 | 210.00 | 45.00 |
| 2.6 | 0.70 | 100.00 | 30.00 |
| 2.8 | 0.18 | 11.00 | 9.00 |
| 3 | 0.03 | 6.20 | 5.00 |
| 3.2 | 0.00 | 1.58 | 1.58 |
| 3.4 | 0.00 | 1.00 | 1.00 |
| 3.6 | 0.00 | 1.00 | 1.00 |

| NA POSITION [NORMALIZED] | LUMINANCE OF CONDUCTIVE MATERIAL [DN] | LUMINANCE OF INSULATION MATERIAL [DN] | CONTRAST |
|---|---|---|---|
| 1 | 10 | 65 | 0.733 |
| 0.8 | 20 | 40 | 0.333 |
| 0.6 | 30 | 30 | 0.000 |
| 0.4 | 40 | 25 | 0.231 |
| 0.2 | 50 | 18 | 0.471 |
| 0 | 58 | 12.5 | 0.784 |

FIG. 47A

| DEFECT SIZE [nm] | 50 | 45 | 40 | 35 | 30 | 25 | 20 | 15 |
|---|---|---|---|---|---|---|---|---|
| SHORT DEFECT | ○ | ○ | ○ | ○ | ○ | ○ | ○ | × |
| OPEN DEFECT | ○ | ○ | ○ | × | × | × | × | × |

FIG. 47B

| DEFECT SIZE [nm] | 50 | 45 | 40 | 35 | 30 | 25 | 20 | 15 |
|---|---|---|---|---|---|---|---|---|
| SHORT DEFECT | ○ | ○ | × | × | × | × | × | × |
| OPEN DEFECT | ○ | ○ | ○ | ○ | ○ | ○ | × | × |

FIG. 47C

| DEFECT SIZE [nm] | 50 | 45 | 40 | 35 | 30 | 25 | 20 | 15 |
|---|---|---|---|---|---|---|---|---|
| SHORT DEFECT | ◎ | ◎ | ○ | ○ | ○ | ○ | ○ | × |
| OPEN DEFECT | ◎ | ◎ | ◎ | ○ | ○ | ○ | × | × |

BRIGHTNESS DISTRIBUTION

DISTRIBUTION OF ΔV
CONVERTED FROM ΔDN

ELECTRO-OPTICAL INSPECTION APPARATUS AND METHOD WITH DUST OR PARTICLE COLLECTION FUNCTION

TECHNICAL FIELD

The present invention relates to an electro-optical inspection apparatus and method for inspecting a sample surface using an electron beam, and more particularly, to an electro-optical inspection apparatus and method that is capable of inspecting a sample surface at high sensitivity using an electron beam while preventing adhesion of dusts or particles to sample surfaces (of front and back sides and peripheral edges).

BACKGROUND ART

The electro-optical inspection apparatus is used for obtaining an image of a sample surface of a semiconductor wafer or the like by irradiating the sample surface with a primary electron beam, and detecting secondary electrons or mirror electrons emitted from the sample surface, to perform inspection of defects on the sample surface and/or pattern evaluation of the sample surface on the basis of the obtained image.

In addition, it is known that while a sample such as a semiconductor wafer is conveyed in the air or in vacuum for inspection or processing, if adhesion of dusts such as particles having a diameter of 100 nm or smaller to the sample surface can be prevented to reduce adhesion of dusts or particles to be killer defects on a pattern to the sample surface, production yield can be greatly improved. In a semiconductor or LSI manufacturing process, if the killer defects are on the sample surface, a width of wiring or insulation resistance becomes insufficient so that performance is significantly deteriorated. Therefore, it is necessary to take measures against the killer defects, such as correction or detection of the defects.

In particular, the electro-optical inspection apparatus can provide a measurement or inspection result with high accuracy by reducing adhesion of dusts or particles generated by the inspection apparatus to a sample surface. Thus, a process of dusts or particle adhesion to the sample surface can be identified and improved so that defects in an exposure process can be reduced, for example.

Conventionally, in relation to conveyance of samples, measures have been taken for reducing generation of dusts or particles as much as possible. For instance, as to an air conveyance system, a mini-environment having a high-performance filter and down flow is provided, and the air conveyance system is housed in the mini-environment. Further, a static electricity remover removes static electricity of the sample so as to prevent particles from adhering to the sample surface. In addition, in a vacuum conveyance system for samples, control of fluctuation of pressure is performed by a load lock. However, it is usually difficult to reduce dusts or particles having very small sizes, in particular, of 100 nm or smaller.

In view of this problem, the applicant has proposed a method of removing dusts or particles from a sample surface (refer to Japanese Patent Application Publication No. 2009-4161 (Patent Document 1)). In this method, the dusts or particles on the sample surface are detected, the sample is moved in a horizontal direction, a collection electrode disposed close and opposite to the sample surface is charged to have the polarity opposite to the charge polarity of the dusts or particles, and hence approaching dusts or particles are electro-statically attracted by the xollection electrode. Thus, the dusts or particles on the sample surface are detected, and the detected dusts or particles are removed from the sample surface.

In addition, there is also proposed a particle monitor (refer to Japanese Patent Application Publication No. 2010-56270 (Patent Document 2)), in which particles floating in a plasma processing apparatus are collected actively by a dusts or particle collecting electrode and are accumulated in a specific place using a quadrupole linear trap or the like so that the particles are detected electrically or by using laser scattered light.

As a design rule of LSI has become very fine, a size of dusts or particles to be prevented from adhering to a sample surface has become very small. Adhesion of dusts or particles generated by an operation of the inspection apparatus to the sample surface has become a critical problem, and it is necessary to take a countermeasure.

However, in the conventional dusts or particle adhesion prevention mechanism, it is difficult to prevent dusts or particles such as fine particles of 100 nm or smaller, for example, from adhering to the sample surface. In particular, if a sample is placed on a stage or the like in a vacuum chamber for inspecting the sample surface by the electro-optical inspection apparatus, there has been no consideration about suppressing generation of dusts or particles from the apparatus itself.

The prior art described in Patent Document 1 detects that dusts or particles have adhered to the sample surface, and afterward removes the adhered dusts or particles from the sample surface. Therefore, conventional example described in Patent Document 1 cannot prevent dusts or particles from adhering to the sample surface. In addition, in the prior art described in Patent Document 2, the dusts collecting electrode is provided to the tip of the particle monitor, for collecting particles floating in the plasma processing apparatus. Therefore, adhesion of particles to the sample surface cannot be prevented.

In addition, there is a case that, when a vacuum chamber is evacuated, air flow causes static electricity, which electrifies dusts or particles remaining in the vacuum chamber, and the electrified dusts or particles such as particles are electro-statically attracted by the sample surface to be inspected and adhere thereto so that the sample surface is contaminated. A conventional vacuum chamber used for inspecting a sample surface has no countermeasure against the electrostatic attraction of dusts or particles remaining in the vacuum chamber to the sample surface, and cleaning has been the only way to cope with such remaining particles. Therefore, it is strongly required to prevent such remaining particles in the vacuum chamber that could not be removed by cleaning from adhering to the sample surface.

The present invention has been made in view of the above-mentioned problem, and a first object thereof is to provide a method of preventing as many dusts or particles as possible from adhering to a sample surface, and an electro-optical inspection apparatus for inspecting a sample surface using an electron beam while preventing as many dusts or particles as possible from adhering to the sample surface.

Japanese Patent Application Publication No. 2005-235777 (Patent Document 3) describes a method of observing a sample surface using an electro-optical inspection apparatus. This conventional method utilizes gradation differences of an image generated in a part where an open defect or a short defect exists. In the part where a defect such as an open defect or a short defect exists, gradation differences appear in the image, which never appear in a normal part. Therefore, in the conventional method, a wafer surface image obtained from a semiconductor wafer surface is compared with an original surface image (of a wafer without any defect). If a gradation difference, which must not appear when using a normal wafer, appears in a part, it is determined that the part has an open defect or a short defect.

However, in an observation method disclosed in Patent Document 3, there is a problem that the gradation difference in an observation part is originally small depending on a structure or material of the sample to be observed, and that it is difficult to detect a short defect or an open defect in some cases.

In addition, particularly in the case of the open defect, the image of the part where the open defect exists becomes darker (blacker) than the image of the normal part in one case, and becomes lighter (whiter) than that of the normal part in another case. Therefore, there has been a problem that it is very difficult to detect a defect and/or to classify a type of the defect.

In view of this problem, the inventors of the present invention have studied to provide a sample surface observation method that can obtain a sample surface image having large gradation differences between a defect part and a normal part in defect detection of a wiring structure and a clear difference between gray levels of white and black, so that a defect can be easily detected. As a result, the inventors of the present invention have found that the problem of the sample surface observation method disclosed in Patent Document 3 is due to simultaneous detection of a short defect and an open defect in the same condition. Hence, they have proposed a new sample surface observation method (see Japanese Patent Application Publication No. 2009-87893 (Patent Document 4)).

Patent Document 4 discloses a sample surface observation method in which an electron beam irradiates a sample surface on which a wiring pattern containing insulation material and conductive material is formed, and hence electrons having structural information of the sample surface are detected so that an image of the sample surface is obtained for observing the sample surface. The sample surface is irradiated by the electron beam in the state where the insulation material and the conductive material have the same luminance in the sample surface image so that a part other than the insulation material and the conductive material can be easily and reliably detected. In addition, a point having a luminance which is different from the luminance of the insulation material and the conductive material in the sample surface image is detected as an open defect on the sample surface, so that the open defect can be easily and reliably detected.

In addition, Patent Document 4 also discloses a sample surface observation method that can effectively detect a short defect, in which an electron beam irradiates a sample surface in a state that a luminance difference between the insulation material and the conductive material becomes maximum in the sample surface image, and hence the sample surface image that facilitates distinction between the short defect and its surrounding part is obtained, so that the short defect can be easily and reliably detected. In addition, a state that the luminance difference becomes the maximum is determined in a mirror electron region in which electrons having the structural information of the sample surface become mirror electrons.

However, the inventors of the present invention have further studied a method and apparatus that enables observation of a sample surface with high contrasts in a case where an insulation region and a conductive region are formed on the sample surface, and facilitates not only detection of a short defect or an open defect but also classification of a type of the defect. As a result, the inventors of the present invention have reached a conclusion that the method disclosed in Patent Document 4 still has room for improvement.

Therefore, a second object of the present invention is to provide a sample observation method and apparatus that can achieve the above-mentioned first object, and further enables high contrast observation of a sample surface on which an insulation region and a conductive region are formed, and facilitates detection of a short defect or an open defect as well as classification of a type of the defect, and to provide a sample inspection method and apparatus using the sample observation method and apparatus.

SUMMARY OF INVENTION

To achieve the first object, the invention provides an electro-optical inspection apparatus for inspecting a surface of a sample using an electron beam, which comprises:

an electron beam source;

a primary electro-optical system comprising at least a primary lens for inducing a primary electron beam emitted from the electron beam source;

a stage for mounting the sample thereon, the surface of the sample being irradiated with the primary electron beam induced through the primary electro-optical system;

a secondary electro-optical system comprising at least a secondary lens and an aperture for defining NA (Numerical Aperture), for inducing secondary electrons and mirror electrons, the secondary electrons being emitted from the sample surface when irradiating the sample surface with the primary electron beam, and the mirror electrons being reflected from the sample surface and its vicinity when irradiating the sample surface with the primary electron beam;

a detector for detecting at least either of the secondary electrons or mirror electrons induced through the secondary electro-optical system;

a first power source for supplying a first voltage to the sample mounted on the stage;

at lest a first electrode located to surround the sample mounted on the stage, for collecting dusts or particles; and a second power source for supplying a second voltage to the first electrode, the second voltage having the same polarity as that of the first voltage and an absolute value which is equal to and larger than that of the first voltage.

In the above electro-optical inspection apparatus according to the invention, it is preferable to further comprise at least a second electrode located to surround the first electrode, for collecting dusts or particles, and a third power source for supplying a third voltage to the second electrode, the third voltage having the same polarity as that of the first voltage and an absolute value which is equal to or larger than that of the first voltage. In addition, it is preferable to further comprise a plate located over the sample mounted on the stage, to cover the sample, the plate having an aperture through which an electron beam passes to/from the sample surface, and a cover surrounding the stage for preventing dusts or particles from flowing to the stage.

In the above electro-optical inspection apparatus according to the invention, it is preferable to further comprise a first terminal plate comprising at least two terminals, one of which is connected to the first power source and the other of which is connected to the second power source, a cable including two electrical wires, first ends of the electrical wires being connected to the terminals of the first terminal plate, respectively, a box containing the terminal plate, a portion of the cable and a second electrode for collecting dusts or particles in the box, the portion of the cable being supported as flexibly bending, and a second terminal plate fixed at the stage and comprising at least two terminals connected to second ends of the electrical wires, the terminals being used to supply the first and second voltages to the sample and the first electrode, wherein a portion of the cable between the box and the second plate is supported to extend linearly, and the flexibly bending portion in the box bends or extends as the stage is moving.

To achieve the first object, the invention also provides an electro-optical inspection apparatus for inspecting a surface of a sample using an electron beam, which comprises:

an electron beam source;

a primary electro-optical system comprising at least a primary lens for inducing a primary electron beam emitted from the electron beam source;

a stage for mounting the sample thereon, the surface of the sample being irradiated with the primary electron beam induced through the primary electro-optical system;

a secondary electro-optical system comprising at least a secondary lens and an aperture for defining NA (Numerical Aperture), for inducing secondary electrons and mirror electrons, the secondary electrons being emitted from the sample surface when irradiating the sample surface with the primary electron beam, and the mirror electrons being reflected from the sample surface and its vicinity when irradiating the sample surface with the primary electron beam;

a detector for detecting at least ones of the secondary electrons and mirror electrons induced through the secondary electro-optical system;

a chamber capable of being evacuated and containing the stage therein; and a device for performing electrolytic dissociation gases in the chamber during a process of vacuuming the chamber to eliminate static electricity which exists on structures in the chamber and materials on the structures.

To achieve the first object, the invention further provides an electro-optical inspection apparatus for inspecting a surface of a sample using an electron beam, which comprises:

an electron beam source;

a primary electro-optical system comprising at least a primary lens for inducing a primary electron beam emitted from the electron beam source;

a stage for mounting the sample thereon, the surface of the sample being irradiated with the primary electron beam induced through the primary electro-optical system;

a secondary electro-optical system comprising at least a secondary lens and an aperture for defining NA (Numerical Aperture), for inducing secondary electrons and mirror electrons, the secondary electrons being emitted from the sample surface when irradiating the sample surface with the primary electron beam, and the mirror electrons being reflected from the sample surface and its vicinity when irradiating the sample surface with the primary electron beam;

a detector for detecting at least ones of the secondary electrons and mirror electrons induced through the secondary electro-optical system; and a chamber capable of being evacuated and containing the stage therein, inner walls of the chamber having at least a hole, or comprising mesh-metallic plates attached thereto, the plates being supplied with a predetermined voltage.

In each of the above electro-optical inspection apparatuses according to the invention, it is preferable that the electron beam source is adapted to emit a primary electron beam a cross section of which has a substantial area.

Further, in the electro-optical inspection apparatus according to the invention, it is further preferable to comprise an energy control means for setting energy of the electron beam directing to the sample surface and energy supplied to the sample such that electrons directing from the sample surface to a detector within a transition band which contains mirror electrons and secondary electrons, and an aperture adjustment mechanism for adjusting a location of at least an aperture on a plane perpendicular to an axis of a secondary electro-optical system of the inspection apparatus, so that electrons from a conductive material region of the sample surface and electrons from a nonconductive material region of the sample surface are selectively induced to the detector. By the apparatus comprising the energy control means and aperture adjustment mechanism, the second object of the invention can be achieved. That is, the apparatus enables high contrast observation of a sample surface on which an insulation region and a conductive region are formed, and facilitates detection of a short defect or an open defect as well as classification of a type of the defect, while achieving the first object.

In the electro-optical inspection apparatus comprising the aperture adjustment mechanism, it is preferable that the secondary electro-optical system of the inspection apparatus comprises a plurality of apertures having different diameters, respectively, and the aperture adjustment mechanism selects one of the apertures and adjusts its location such that electrons from either of the conductive material region and the nonconductive material region pass through the selected aperture to the detector.

When using a primary electron beam having the cross section with a substantial area, it is preferable that the detector comprises EB-CCD(s) or EB-TDI(s).

To achieve the first object, the invention also provides a method of inspecting a surface of a sample using an electro-optical inspection system, comprising the steps of:

setting the sample on a stage;

supplying a first voltage to the sample on a stage;

supplying a second voltage to a first electrode located to surround the sample on the stage to collect dusts and particles, the second voltage having the same polarity as that of the first voltage and an absolute value which is equal to or larger than that of the first voltage;

emitting a primary electron beam from an electron beam source, and irradiating the sample surface with the electron beam through a primary electro-optical system; and detecting, at a detector, at least ones of secondary electrons and mirror electrons, the secondary electrons being emitted from the sample surface when irradiating the sample surface with the primary electron beam, and the mirror electrons being reflected from the sample surface and its vicinity when irradiating the sample surface with the primary electron beam.

In the above method according to the invention, it is preferable further comprise the step of supplying a third voltage to a second electrode located to surround the first electrode, the third voltage having the same polarity as that of the first voltage and an absolute value which is equal to or larger than that of the first voltage.

To achieve the first object, the invention further provides a method of inspecting a surface of a sample using an electro-optical inspection apparatus, comprising the steps of:

setting the sample on a stage;

supplying a first voltage to the sample on a stage;

vacuuming a chamber containing the stage;

dissociating electrolytically gases in the chamber which have existed during the step of vacuuming the chamber to eliminate static electricity on structures in the chamber and materials on the structures;

emitting a primary electron beam from an electron beam source, and irradiating the sample surface with the electron beam through a primary electro-optical system; and detecting, at a detector, at least ones of secondary electrons and mirror electrons, the secondary electrons being emitted from the sample surface when irradiating the sample surface with the primary electron beam, and the mirror electrons being reflected from the sample surface and its vicinity when irradiating the sample surface with the primary electron beam.

In the above method according to the invention, it is preferable that the electron beam source emits a primary electron beam a cross section of which has a substantial area, and the method further comprises the steps of setting energy of the electron beam directing to the sample surface and energy supplied to the sample such that electrons directing from the sample surface to a detector are within a transition band which contains mirror electrons and secondary electrons, and adjusting a location of an aperture defining NA (Numerical Aperture), on a plane perpendicular to an axis of the secondary electro-optical system of the inspection apparatus, so that electrons from a conductive material region of the sample surface and electrons from a nonconductive material region of the sample surface are selectively induced to the detector by the adjustment.

In addition, it is preferable in this method that the secondary electro-optical system comprises a plurality of apertures having different diameters, respectively, and the step of adjusting comprises the steps of selecting one of the apertures, and adjusting a location of the selected aperture such that electrons from either of the conductive material region and the nonconductive material region pass through the selected aperture to the detector.

BRIEF DESCRIPTION OF THE DRAWINGS

FIG. 47A is a table showing results of defect inspection performed by the production test according to the method of the present invention, and showing whether or not a defect can be detected by the image obtained in the condition where the luminance of the conductive region is higher than the luminance of the insulation region;

FIG. 47B is a table showing results of defect inspection performed by the production test according to the method of the present invention, and showing whether or not a defect can be detected by the image obtained in the condition where the luminance of the insulation region is higher than the luminance of the conductive region;

FIG. 47C is a table showing whether or not a defect can be detected as a combination of the defect detection results shown in FIGS. 47A and 47B;

DESCRIPTION OF EMBODIMENTS

Hereinafter, with reference to the attached drawings, embodiments of the present invention are described.

Figure 1:
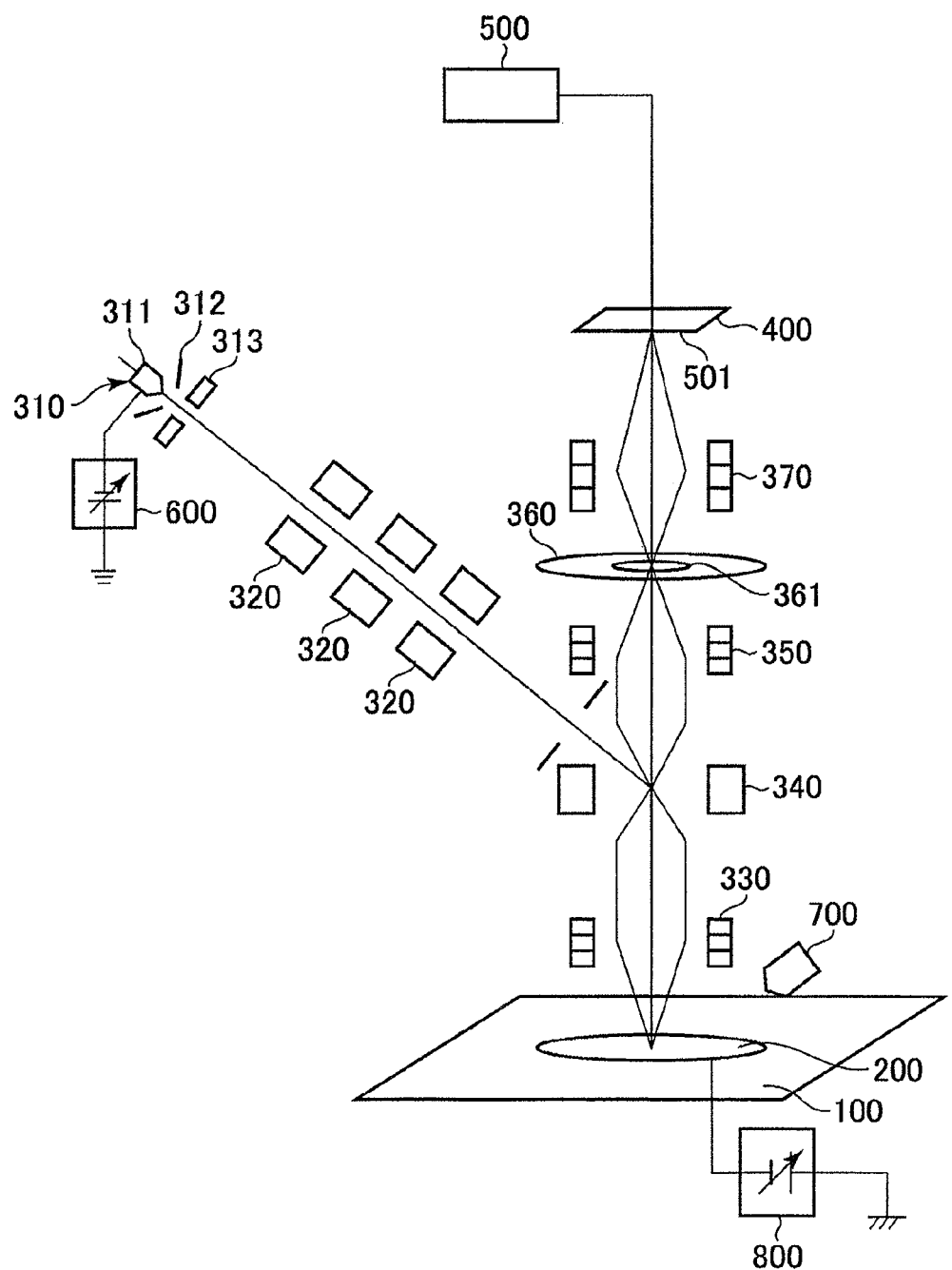
FIG. 1 is a diagram illustrating an overview of an electro-optical inspection apparatus to which the present invention can be applied.

FIG. 1 illustrates a structural example of an electro-optical inspection apparatus to which the present invention can be applied. This electro-optical inspection apparatus is a mapping projection type low acceleration electron beam apparatus, which includes an electron beam source 310, primary lenses 320, a condenser lens 330, electromagnetic field generation means (E×B) 340, a transfer lens 350, an NA adjustment aperture plate 360 for adjusting a numerical aperture (NA), a projection lens 370, a detector 400, an image processing device 500, a stage 100 on which a sample 200 to be observed is placed, and a landing energy adjust/supply unit 600.

At least one NA aperture 361 is formed in the NA adjustment aperture plate 360, and the NA aperture 361 determines the numerical aperture (NA). A position of the NA aperture 361 can be adjusted in a plane, and hence electrons having structural information of a conductive region and electrons having structural information of an insulation region, which are directed in different directions by the function of the E×B 340 which will be described later, can be selectively guided to the detector 400. Note that, this electro-optical inspection apparatus may have a structure including charged electron beam irradiation means 700 for irradiating the surface of the sample 200 with an electron beam to electrify the sample surface as necessary.

The surface of the sample 200 has insulation and conductive regions, and observation of the sample surface is performed by irradiating with an electron beam from the electron beam source 310. The electron beam source 310 includes, for example, an electron source 311, a Wehnelt electrode 312, and an anode 313. The electron source 311 generates electrons, which are led out by the Wehnelt electrode 312 and are accelerated by the anode 313 so that the sample surface is irradiated with the electrons.

The electron beam source 310 may have a structure to generate a surface electron beam having a predetermined area including a plurality of pixels so that a plurality of pixels can be imaged simultaneously. Thus, a plurality of pixels can be imaged simultaneously by one irradiation of the sample surface with the electron beam, and hence a two-dimensional image of a large area can be obtained at high speed.

The landing energy adjust/supply unit 600 is used to set landing energy of the electron beam emitted from the electron beam source 310. The landing energy adjust/supply unit 600 includes a variable voltage source having a negative electrode connected to the electron source and supplies electric power to the electron beam source 310 so that the electron source 311 generates electrons. The landing energy of the electron beam is determined by a difference between a potential of the sample 200 and a potential of a cathode of the electron source 311 of the electron beam source 310. Therefore, the landing energy adjust/supply unit 600 can adjust the voltage of the variable voltage source (hereinafter, referred to as an "acceleration voltage") so that the landing energy can be adjusted.

In the electro-optical inspection apparatus according to the present invention, the landing energy adjust/supply unit 600 sets the landing energy of the electron beam to an appropriate value, and contrast of an obtained image is enhanced. In the present invention, the landing energy of the electron beam is set in a transition region in which the electrons having structural information of the surface of the sample 200 by irradiation of the imaging electron beam include both the mirror electrons and the secondary electrons. A specific method of setting the landing energy is described later.

Each of the primary lenses 320 deflects the electron beam emitted from the electron beam source 310 by an electromagnetic field, to thereby guide the electron beam to a desired irradiation region on the surface of the sample 200. Note that, there may be a plurality of primary lenses 320 or a single primary lens 320. For example, a quadrupole lens can be used as each of the primary lenses 320.

The ExB deflector 340 applies an electric field and a magnetic field to the electron beam or the electrons, and directing the electron beam or the electrons by Lorentz force so that the electron beam or the electrons are directed in a predetermined direction. The ExB deflector 340 sets the electric field and the magnetic field so as to generate the Lorentz force that directs the electron beam emitted from the electron beam source 310 to the surface of the sample 200.

In addition, the ExB deflector 340 sets the electric field and the magnetic field so that the electrons having the structural information of the sample surface by irradiation of the sample surface with the electron beam propagate straight upward and are directed to the direction of the detector 400. As described later, the electrons having the structural information of the sample surface emitted by irradiation of the sample surface with the imaging electron beam are directed by the electric field and the magnetic field as the function of the ExB deflector 340 according to propagation speed of the electron beam in the direction opposite to the incident direction.

By the function of the ExB deflector 340, it is possible to separate the electron beam entering the sample surface from the electrons that are generated from the sample surface and propagate in the direction opposite to the incident electron beam. Note that, the ExB deflector may be referred to as a Wien filter.

The condenser lens 330 is a lens that forms an image of the electron beam on the surface of the sample 200 and condenses electrons having structural information of the sample surface. Therefore, the condenser lens 330 is disposed closest to the sample 200.

The transfer lens 350 guides the electrons after passing through the ExB deflector 340 to the direction of the detector 400 and forming a crossover in a vicinity of the NA aperture 361 of the NA adjustment aperture plate 360.

The NA adjustment aperture plate 360 can adjust the number of passing electrons. The NA adjustment aperture plate 360 has the NA aperture 361 in the center portion, which is an aperture determining the numerical aperture (NA). The NA aperture 361 transmits the electrons that are emitted from the sample surface and are guided by the transfer lens 350, to be a passage to the detector 400. The NA aperture 361 can prevent electrons which may be noise in imaging, from propagating to the detector 400 and adjusts the number of passing electrons. In addition, as described above, a position of the NA aperture 361 in the plane can be adjusted, and hence electrons having structural information of a conductive region and electrons having structural information of an insulation region, which are directed in different directions by the function of the ExB deflector 340, can be selectively guided to the detector 400. Details thereof are described later. There may be disposed a plurality of types of the NA apertures 361 having different aperture diameters. In this case, an NA aperture having a desired aperture diameter is selected by an NA aperture moving mechanism (not shown).

The projection lens 370 is final focus adjusting means for forming an image of electrons that have passed the NA adjusting aperture 361 on a detection surface of the detector 400.

The detector 400 detects electrons having structural information of the sample surface when the electron beam irradiates the sample surface so as to obtain an image of the sample surface. Various detectors can be used as the detector 400. For example, a charge coupled device (CCD) detector capable of obtaining parallel images or a time delay integration (TDI)-CCD detector can be used. Using a two-dimensional imaging type detector 400 such as a CCD or a TDI-CCD, and using a surface beam that can irradiate a predetermined area including a plurality of pixels as the electron beam source 310, it is possible to obtain an image of wide area by parallel imaging with beam irradiation in one spot so that the sample surface can be observed at high speed. The CCD or the TDI-CCD is a detection element that detects light and outputs an electric signal. If the CCD or the TDI-CCD is used as the detector 400, a fluorescent screen that converts electrons into light or a micro channel plate (MCP) that multiplies electrons is necessary and should be included in the detector 400.

An EB-CCD or an EB-TDI may be used as the detector 400. The EB-CCD and the EB-TDI are two-dimensional imaging type detectors similarly to the CCD and the TDI-CCD, but directly detect electrons and output the electric signal as it is without conversion between light and electrons. Therefore, the above-mentioned fluorescent screen or MCP is not necessary, and a signal loss in the process is reduced so that an image with high resolution can be obtained.

The image processing device 500 is a device that stores the electric signal output from the detector 400 and generates an image of the surface of the sample 200 based on the stored signal. Specifically, a two-dimensional image is generated based on coordinate information and luminance information output from the detector 400. In order to observe the sample 200 having the surface containing insulation material and conductive material, it is preferred that a luminance difference be generated between the insulation region and the conductive region so that an image with high contrast is obtained. The image processing device 500 performs necessary image processing and image generation so that a good image can be obtained.

The stage 100 has an upper surface on which the sample 200 placed so that the sample 200 is supported. The stage 100 can be moved in the X direction and in the Y direction of the horizontal plane (X-Y plane) and can be rotated in the horizontal plane so that the electron beam can irradiate the entire region to be observed of a sample surface 201. In addition, it is possible to constitute the stage 100 to be movable in the vertical direction (Z direction) as necessary so that a height of the surface of the sample 200 can be adjusted. In order to constitute the stage 100 to be movable, for example, moving means such as a motor or an air actuator should be disposed.

The charged electron beam irradiation means 700 is provided for electrifying the sample 200 before the sample 200 is irradiated with the imaging electron beam for imaging from the electron beam source 310. The charged electron beam irradiation means 700 is provided as necessary. Assuming that the sample surface is irradiated with the electron beam in advance before imaging of the sample surface, the conductive region is not electrified so that the potential thereof remains to be the ground potential, while the insulation region is negatively electrified. Therefore, it is possible to form a potential difference between the conductive region and the insulation region according to their materials. Then, the potential difference can enhance the contrast between the conductive region and the insulation region. Therefore, if it is desired to irradiate the sample surface with the charged electron beam before the imaging electron beam irradiates, the charged electron beam irradiation means 700 should be disposed.

It is possible that the electron beam source 310 works also as the charged electron beam irradiation means without separately providing the charged electron beam irradiation means 700. In other words, the charged electron beam may be irradiated from the electron beam source 310 instead of using the charged electron beam irradiation means 700. Then, after irradiation with the charged electron beam, the surface of the sample 200 may be irradiated with the electron beam for imaging.

Therefore, charged electron beam irradiation means 700 may be disposed, for example, in the case where the charged electron beam should irradiate the sample surface 201 and the electron beam for imaging should be irradiated promptly after the irradiation with the charged electron beam. In general, the imaging electron beam and the charged electron beam have different landing energy. By disposing the charged electron beam irradiation means 700, adjustment of landing energy between the charged electron beam irradiation and the imaging electron beam irradiation becomes unnecessary so that the imaging can be performed promptly. Therefore, if there is high requirement for reducing observation time, the charged electron beam irradiation means 700 should be disposed to satisfy the requirement for reducing observation time.

The surface of the sample 200 usually includes an insulation region made of insulation material and a conductive region made of conductive material. Samples 200 having various shapes can be used. For instance, a wafer-like sample such as a semiconductor wafer or a reticle is used. It is preferred that the electro-optical inspection apparatus according to the present invention have a structure in which the sample surface can be observed appropriately also in the case where an area ratio of the insulation region to the sample surface is larger than that of the conductive region. With this structure, an image of the sample surface can be obtained and observed appropriately also for a contact plug of a semiconductor wafer or a contact structure of a reticle, for example.

Various materials can be used as the conductive material or the insulation material. For instance, plug material such as tungsten (W) can be used as the conductive material, and silicon oxide film ($SiO_2$) that is used as an insulation layer of a semiconductor wafer can be used as the insulation material.

The electro-optical inspection apparatus illustrated in FIG. 1 is the mapping projection type electro-optical inspection apparatus as described above, but an SEM type electro-optical inspection apparatus can also be used as the electro-optical inspection apparatus of the present invention.

Figure 2:
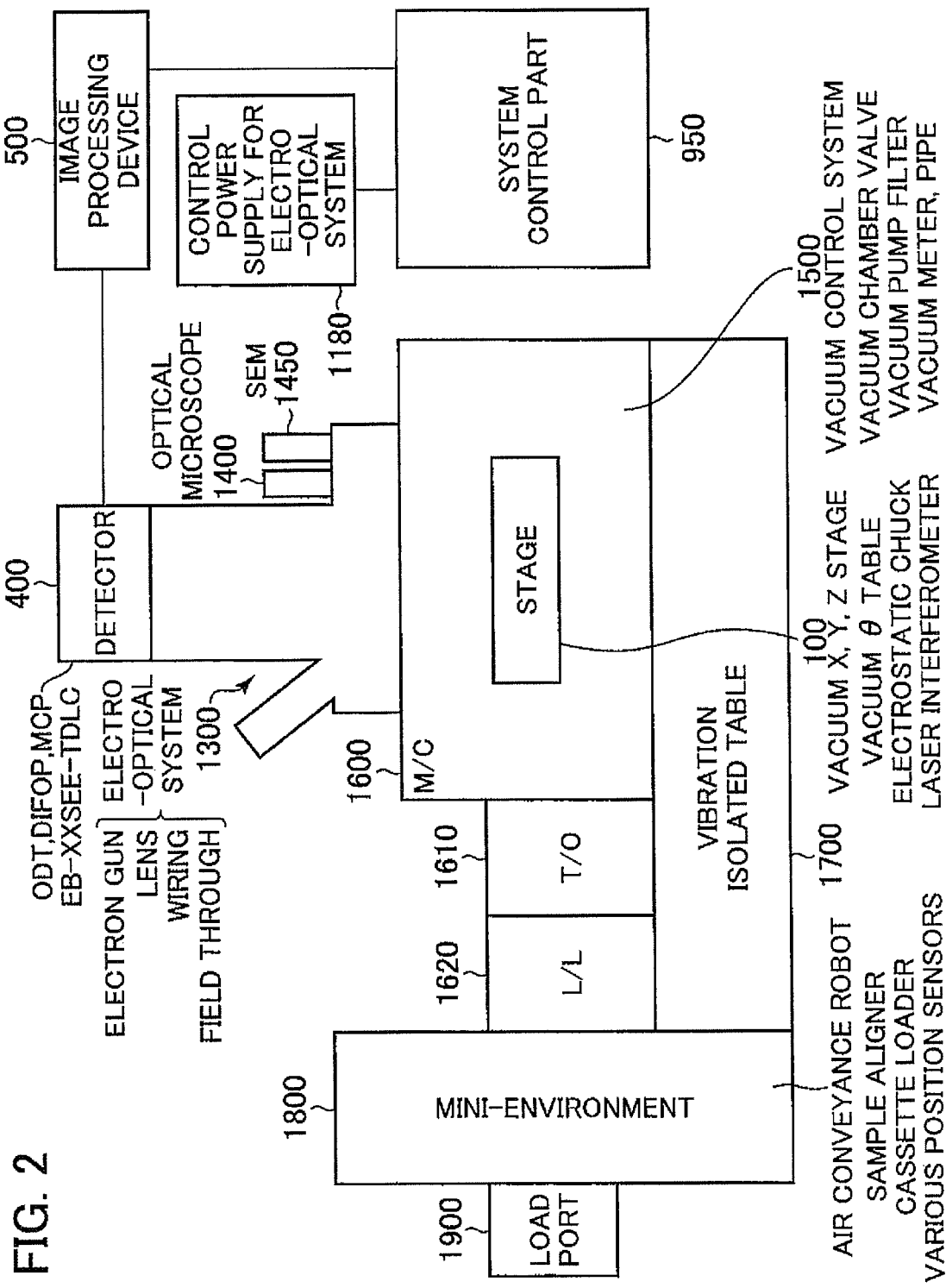
FIG. 2 is a diagram illustrating an overview of a sample observation system of a first embodiment to which the present invention can be applied.

FIG. 2 is a diagram illustrating a general structural example of a sample observation system (inspection system) of the first embodiment including an electro-optical inspection apparatus according to the present invention. This sample observation system is constituted as a combination type sample observation system capable of observing a sample with the mapping projection type electro-optical system and an optical microscope and of observing a sample with the SEM type electro-optical system.

The combination type sample observation system illustrated in FIG. 2 includes a load port 1900, a mini-environment 1800, a load lock 1620, a transfer chamber 1610, a main chamber 1600, a mapping projection type electro-optical system 1300, and the image processing device 500. The mini-environment 1800 is provided with an air conveyance robot, a sample alignment device, a clean air supply mechanism, and the like (not shown). In addition, the transfer chamber 1610 that is always in a vacuum state is provided with a vacuum conveyance robot (not shown), which can suppress occurrence of particles due to pressure fluctuation to a minimum level.

The main chamber 1600 is provided with the stage 100 that can move in the X direction, in the Y direction, and in θ (rotational) direction in the horizontal plane (XY plane). On the stage 100, there is disposed an electrostatic chuck (denoted by 120 in FIG. 3). The sample itself or the sample placed on a palette or a jig is placed on the stage 100 by the electrostatic chuck.

The inside pressure of the main chamber 1600 is controlled by a vacuum control system 1500 so that the vacuum state is maintained. In addition, the main chamber 1600, the transfer chamber 1610, and the load lock 1620 are placed on a vibration isolation table 1700 so that vibration is not transmitted from the floor.

The main chamber 1600 is provided with the electro-optical system 1300. This electro-optical system 1300 is equipped with a primary optical system including the electron beam source 310 and the primary lens 320 illustrated in FIG. 1, a secondary optical system including the condenser lens 330, the E×B deflector 340, the transfer lens 350, the NA adjustment aperture plate 360, and the projection lens 370, and the detector 400 for detecting secondary electrons and mirror electrons from the sample 200. In addition, as elements related to the electro-optical system 1300, there are disposed an optical microscope 1400 that is used for alignment of the sample, and an SEM 1450 that is used for review observation.

A signal from the detector 400 is sent to the image processing device 500 for signal processing. The signal processing can be performed both in real time process for a currently observed image and in off line process in which an image is obtained and is later processed. The data processed by the image processing device 500 is stored in a recording medium such as a hard disk or a memory. In addition, it is possible to display on a monitor of a console as necessary, for example, as an observation region, a defect map, a defect classification, a patch image, and the like. In order to perform the signal processing, there is disposed a system control part 950. In addition, in order to supply electric power to the electro-optical system 1300, there is disposed an electro-optical system control power supply 1180. The electro-optical system control power supply 1180 includes a power supply 600 for supplying electric power to the electron source 311 of the electron beam source 310, and landing energy control means for controlling the power supply. The electro-optical system control power supply 1180 also includes a power supply for setting a potential of the sample, which is described later, and control means thereof, and a power supply for a voltage to be applied to a dust collecting electrode, which is described later, and control means thereof.

Next, a conveyance mechanism for the sample is described. The sample such as a wafer or a mask is conveyed from the load port 1900 to the mini-environment 1800, in which alignment is performed. Further, the sample is conveyed by the air conveyance robot to the load lock 1620. In the load lock 1620, air is exhausted by a vacuum pump (not shown) from the atmospheric state to a vacuum state. When the pressure inside the load lock 1620 becomes a predetermined pressure (for example, approximately 1 Pa) or lower by this exhaustion, the sample is conveyed from the load lock 1620 to the main chamber 1600 by the vacuum conveyance robot disposed in the transfer chamber 1610 and is placed on an electrostatic chuck mechanism of the stage 100.

In the system of FIG. 2, the sample 200 is placed on the stage 100 that is common to the mapping projection type electro-optical apparatus, namely the electro-optical system 1300, and the SEM type electro-optical system 1450. Therefore, when the sample 200 moves between the mapping projection type electro-optical system 1300 and the SEM type electro-optical system 1450, the coordinate relationship is uniquely determined so that the same part can be identified easily with high accuracy.

In other words, when the sample is moved between separate inspection apparatuses, it is necessary to place the sample on separate stages. Therefore, it is necessary to perform alignment of the sample individually, and even if the sample alignment is performed in this way, specific error of the same place becomes 5 to 10 μm or larger. In particular, if the sample has no pattern, a position reference cannot be specified so that the error is further increased.

According to this example, if the sample 200 moves between the mapping projection type electro-optical system 1300 and the SEM type electro-optical system 1450, the same place can be identified with high accuracy. Therefore, a place can be identified with high accuracy, for example, an accuracy of 1 μm or smaller. Thus, if the inspection of a pattern and a pattern defect is performed by the mapping projection type electro-optical system 1300, it is very effective to perform identification and detailed observation (review) of the detected defect with the SEM type electro-optical system 1450. In other words, because a place can be identified, it is possible to detect presence or absence of defect (pseudo-detection in the case of absence), and accurate size and shape of the defect can be detected at high speed. If separate apparatuses are used, detection of a pattern defect and identification thereof take much time.

According to the present invention, because a system in which the mapping projection type electro-optical system and the SEM type electro-optical system are disposed in the same chamber, is used, it is possible to perform inspection, decision, and classification of an ultrafine pattern of 100 nm or smaller, in particular, with high efficiency and at high speed.

Next, with reference to FIGS. 3 to 23, the structure for preventing dust or particles such as particles from adhering to a sample surface according to the present invention is described in detail. In the example described below, a rectangular mask or a circular semiconductor wafer having a conductive thin film, for example, Si (including dope), Cr, TaN, TaBN, CrN, Ru, Ta, W, or Cu thin film as a surface layer is used as the sample 200. The uppermost surface of the thin film may be an insulation film made of TaBO, TaO, $SiO_2$, or the like. In addition, the mask may be constituted of a quartz substrate on which a thin film is formed, for example, or a Si wafer on which a circuit pattern film structure for LSIs is formed.

Figure 3:
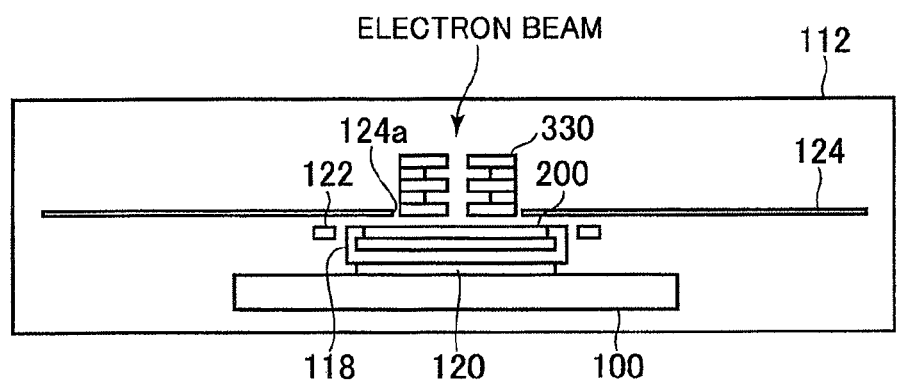
FIG. 3 is a front vertical sectional view illustrating an overview of a main part of the electro-optical inspection apparatus of an embodiment of the present invention.
Figure 4:
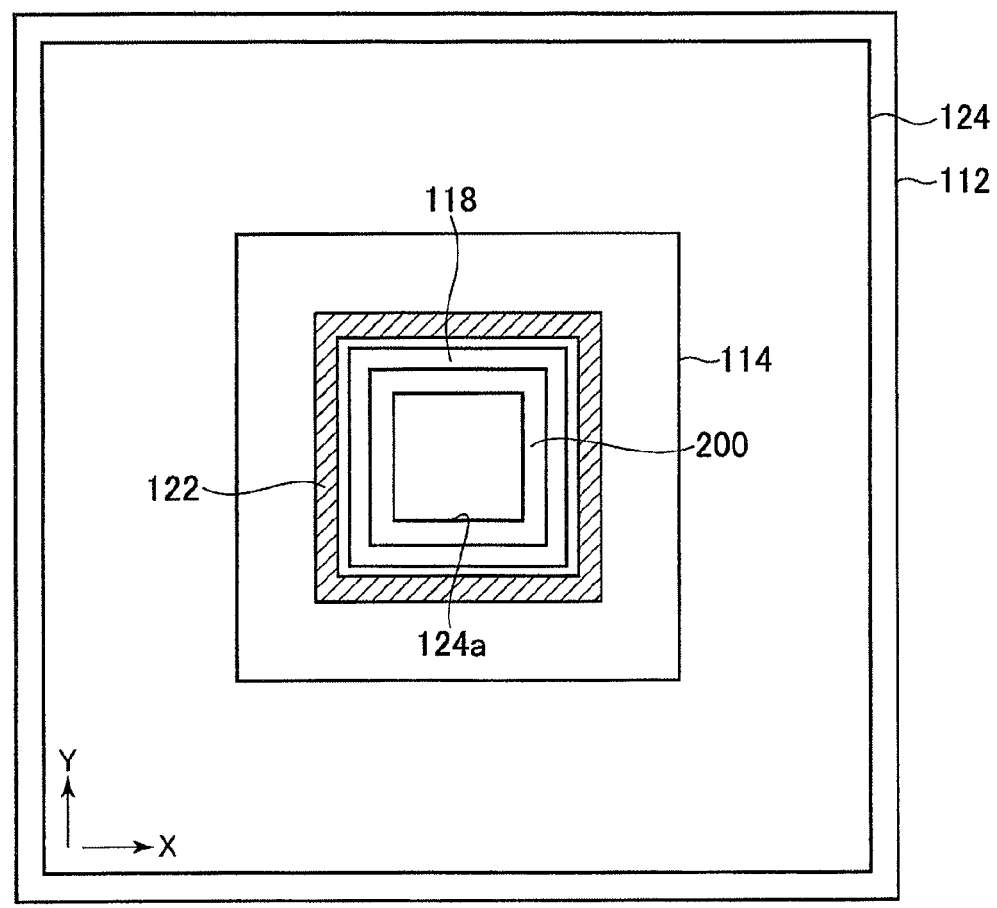
FIG. 4 is a cross sectional plan view of the structure in FIG. 3, illustrating a relationship among a stage, a sample, and a dust collecting electrode of the first embodiment.

FIG. 3 is a front vertical cross sectional view that illustrates in detail the stage 100 and its peripheral portions of the electro-optical inspection apparatus according to the present invention illustrated in FIG. 1. FIG. 4 is a cross sectional plan view of FIG. 3. As illustrated in FIGS. 3 and 4, the electro-optical inspection apparatus according to the present invention includes a vacuum chamber 112 that can perform vacuum evacuation. Inside the vacuum chamber 112, there is disposed the stage 100 that can move in the X direction and in the Y direction. Then, on the upper surface of the stage 100, in this example, a holder 118 holding the sample 200, which is a rectangular mask, is placed via the electrostatic chuck 120.

The stage 100 has a stroke movement region of an effective distance of the sample 200 plus a run-up distance (inspection maximum speed x speed stabilization time) so that imaging of an effective region of the sample (mask) 200 and the defect inspection can be performed. For instance, supposing that the effective distances of the sample 200 in the X direction and in the Y direction are 300 mm each, and the run-up distance is 50 mm (=100 mm/s×0.5 sec), the stage 100 has the stroke movement region of 400 mm.

A dust (or particle) collecting electrode 122 that has a rectangular cross section and extends continuously in a shape of a rectangular frame is disposed at a position surrounding the entire periphery of the sample 200 with a predetermined interval between the dust collecting electrode 122 and the sample 200 placed on the stage 100. Further, a gap control plate 124 having a center through hole 124a is disposed above the sample (mask) 200 placed on the stage 100 and the dust collecting electrode 122 in a horizontal posture with a small gap between the inner surface of the vacuum chamber 112 and the gap control plate 124. In this through hole 124a, there is an optical system element, namely the condenser lens 330 of the electro-optical inspection apparatus. The electron beam is irradiated through this condenser lens 330 to the surface of the sample 200 placed on the stage 100. A size of the through hole 124a is set to be slightly larger than the outside shape of the condenser lens 330.

The dust collecting electrode 122 is made of non-magnetic material such as phosphor bronze or Ti so as to eliminate a curve of the electron beam or a change of orbit due to the magnetic field. The electron beam includes a primary irradiating electron beam, a secondary emission electron beam emitted from the sample 200, a mirror electron beam reflected in a vicinity of the sample 200, and the like.

The gap control plate 124 is made of phosphor bronze, Ti, or SUS sheet having a thickness of 0.3 to 5 mm, for example. It is preferred that the gap control plate 124 be coated with Au, Pt, Ru, or Os so that the potential is stabilized and contamination is prevented. Further, the gap control plate 124 has a size that is set so that the dust collecting electrode 122 covers a region that does not go out of the region of the gap control plate 124 when the stage 100 moves within its movement region. Thus, it is prevented that the electric field distribution is disturbed and that the orbit of the particle changes when the stage 100 moves and the sample 200 placed on the stage 100 moves to the most distant position in the vacuum chamber 112. Thus, it is possible to prevent the particles from moving to the sample 200 and adhering to the sample surface. Note that, the gap control plate 124 is not always necessary. The same is true in the following examples.

In this example, as illustrated in FIG. 4, the dust collecting electrode 122 that is continuous in a shape of a rectangular frame is used, and the entire periphery of the sample 200 placed on the stage 100 is surrounded integrally by the dust collecting electrode 122. Thus, it is possible to prevent particles from entering the inside surrounded by the dust collecting electrode 122 through a so-called electric field gap when a gap occurs at a position along a length direction of the dust collecting electrode 122 so that an uneven part of the electric field occurs.

Figure 5:
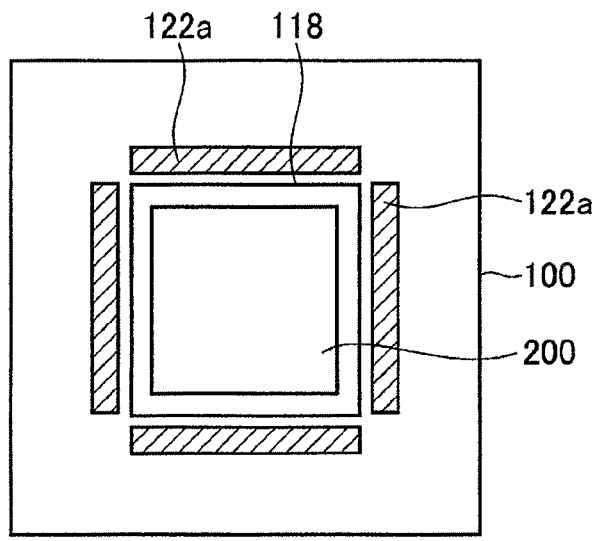
FIG. 5 is a plan view illustrating a relationship among a stage, a sample, and dust collecting electrodes of a second embodiment according to the present invention.

It is not always necessary that the dust collecting electrode 122 surrounds the entire periphery of the sample 200. It is sufficient that the electric field formed by the dust collecting electrode 122 can surround the periphery of the sample 200. For instance, as illustrated in FIG. 5, four dust collecting electrodes 122a extending linearly may be disposed along substantially the entire length of the individual sides of the sample 200 so that the dust collecting electrodes 122a surround substantially the entire periphery of the sample 200 except for the vicinities of the corners. Alternatively, though not illustrated, it is possible that the dust collecting electrodes extending linearly are separated from each other at a mid position. In this case, a distortion of electric field occurs between adjacent dust collecting electrodes, but it is sufficient if necessary potential distribution is obtained by the dust collecting electrode. For instance, in a two-dimensional case, when a width of the dust collecting electrode is denoted by D, and a distance between dust collecting electrodes is denoted by L, there is no problem if $D/L \geq 4$ is satisfied. The same is true in the following examples.

Figure 6:
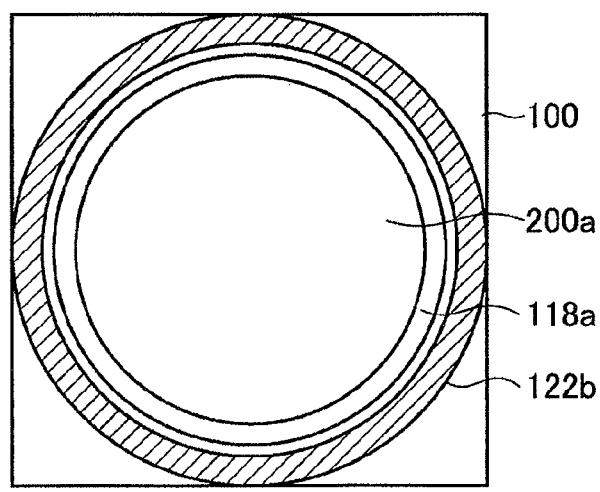
FIG. 6 is a plan view illustrating a relationship among a stage, a circular sample, and a dust collecting electrode of a third embodiment according to the present invention.
Figure 7:
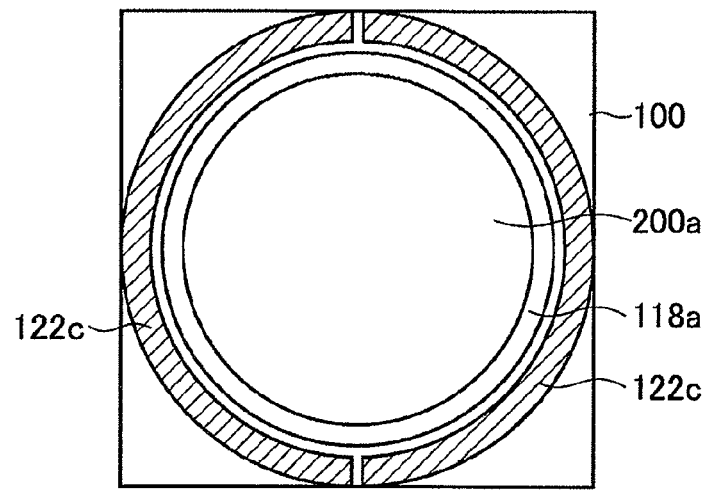
FIG. 7 is a plan view illustrating a relationship among a stage, a circular sample, and dust collecting electrodes of a fourth embodiment according to the present invention.

In the examples illustrated in FIGS. 3 to 5, the rectangular mask is used as the sample 200. When the circular semiconductor wafer is used as the sample, a circular sample (semiconductor wafer) 200a held by a circular holder 118a is placed on the stage 100 as illustrated in FIG. 6, and a dust collecting electrode 122b that is continuous in a shape of a ring is disposed around the sample so that the entire periphery of the sample 200a is surrounded integrally. In this case, as illustrated in FIG. 7, it is possible to dispose a pair of semicircular dust collecting electrodes 122c to be opposed to each other to form a circle, to thereby surround substantially the entire periphery of the circular sample (semiconductor wafer) 200a placed on the stage 100 by the dust collecting electrodes 122c. In addition, though not illustrated, it is possible to dispose three or more dust collecting electrodes extending along circumferential direction of a circle with a space between adjacent dust collecting electrodes.

In any case, a predetermined voltage is applied to all of one or more dust collecting electrodes 122 surrounding the sample 200 placed on the stage 100 so as to collect dust, and afterward the electron beam source 310 (see FIG. 1) generates the electron beam, which irradiates the sample 200 on the stage 100. Thus, secondary electrons emitted from the sample or mirror electrons reflected from the sample surface and its vicinity are detected by the detector 400 (see FIG. 1), and the image processing device 500 performs image processing so that an image of the sample surface is obtained.

Figure 8:
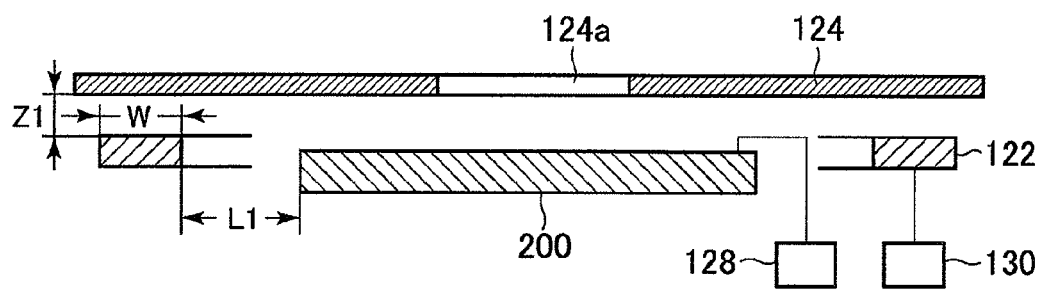
FIG. 8 is an enlarged cross sectional view illustrating the sample, the dust collecting electrode, and a gap control plate according to the present invention.

FIG. 8 is an enlarged view of the sample 200, the dust collecting electrode 122, and the gap control plate 124. As illustrated in FIG. 8, the sample 200 is connected to a first power supply 128 for applying a predetermined voltage to the sample surface, and the dust collecting electrode 122 is connected to a second power supply 130 for applying a predetermined voltage to the dust collecting electrode. A thickness of the dust collecting electrode 122 is 0.1 to 5 mm, for example. It is better as a width W1 of the dust collecting electrode 122 is larger. However, as the width W1 of the dust collecting electrode 122 is larger, a size of the dust collecting electrode 122 occupying the space in the vacuum chamber 112 becomes larger. Therefore, the width W1 of the dust collecting electrode 122 is usually set to 5 to 50 mm. A distance L1 between the sample 200 and the dust collecting electrode 122 is related to the width W1 of the dust collecting electrode 122, and it is preferred that the relationship of $0.5L1 < W1 < 5L1$ be satisfied, for example.

In this example, a voltage of $-1$ to $-5$ kV is applied to the surface of the sample 200 via the first power supply 128, and a voltage having the same polarity as the voltage applied to the sample 200 and an absolute value larger the voltage applied to the sample 200 by 0.5 to 5 kV, for example, is applied to the dust collecting electrode 122 via the second power supply 130. In other words, when a voltage of, for example, $-3$ kV is applied to the sample 200, a voltage of $-3.5$ to $-8$ kV, for example, $-5$ kV is applied to the dust collecting electrode 122.

The vacuum chamber 112 is made of metal such as iron or aluminum, and has the ground potential. Further, when dust or particles such as particles existing inside the vacuum chamber 112 are electrified by static electricity or the like, if a potential of the sample 200 is negative, the dust or particles such as particles that are positively electrified are attracted by the electric field and move toward the sample 200.

According to this example, the entire periphery of the sample 200 to which a negative potential is applied is surrounded by the dust collecting electrode 122, and a voltage more negative than the voltage applied to the sample 200 is applied to the dust collecting electrode 122. Therefore, most undesired objects such as dust or particles attracted by the electric field can be trapped by the dust collecting electrode 122. Thus, a probability that the dust or particles such as particles reach the sample 200 and adhere to the sample surface can be largely reduced. In this way, adhesion of dust or particles to the surface of the sample 200 can be reduced largely.

In this example, the gap control plate 124 is further disposed, which prevents dust or particles such as particles from moving along an orbit distant from the dust collecting electrode 122 and adhering to the surface of the sample 200. By disposing the gap control plate 124, attraction force of the dust collecting electrode 122 for dust or particles such as particles moving along an orbit distant from the dust collecting electrode 122 is decreased, and for this reason, a probability that the dust or particles such as particles are trapped by the dust collecting electrode 122 is decreased in inverse proportion to a distance. In order to prevent the decrease of probability of trapping the dust or particles, when a negative voltage is applied to the sample 200, electric field intensity A between the sample 200 and the dust collecting electrode 122 is set to be negative ($A<0$). Thus, attraction force of the dust collecting electrode 122 is increased, and hence the probability that the dust collecting electrode 122 traps the dust or particles such as particles can be increased. In addition to that, electric field intensity (absolute value) B between the gap control plate 124 and the dust collecting electrode 122 is adjusted so that $0.1 \leq B$ (absolute value)$\leq 10$ kV/mm is satisfied. Thus, the probability that the dust collecting electrode 122 traps the dust or particles such as particles can be further increased.

For instance, a negative voltage of $-1$ to $-5$ kV is applied to the sample 200, and a negative voltage of $-1.5$ to $-10$ kV that is more negative than the negative voltage applied to the sample 200 by $-0.5$ to $-5$ kV is applied to the dust collecting electrode 122. It is supposed that the gap control plate 124 has the ground potential, the distance L1 between the sample 200 and the dust collecting electrode 122 is 10 mm, and a distance Z1 between the gap control plate 124 and the dust collecting electrode 122 is 8 mm. Then, the electric field intensity A between the sample 200 and the dust collecting electrode 122 becomes negative ($A<0$), and the electric field intensity (absolute value) B between the gap control plate 124 and the dust collecting electrode 122 becomes 0.19 to 1.25 kV/mm ($=1.5$ to 10 kV/8 mm). In particular, when a voltage of $-5$ kV is applied to the dust collecting electrode 122, the electric field intensity (absolute value) B becomes 0.625 kV/mm ($=5$ kV/8 mm), which is an effective condition. In this case, the voltage is set not to exceed 10 kV/mm as a withstand voltage of the space so that occurrence of discharge in the space can be prevented.

Figure 9:
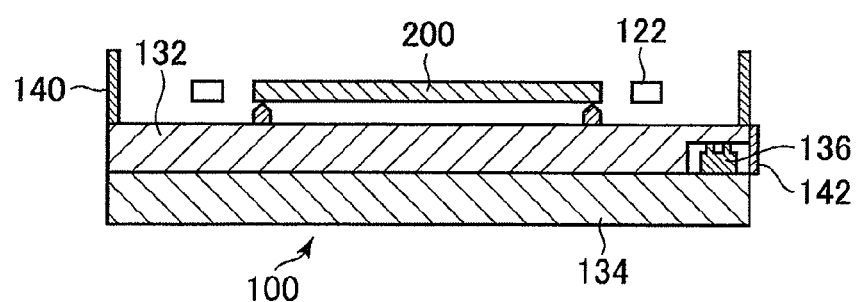
FIG. 9 is a diagram illustrating details of the stage according to the present invention.

FIG. 9 illustrates details of the stage 100. As illustrated in FIG. 9, the stage 100 is constituted of an X stage 132 and a Y stage 134 that are stacked on each other. An ultrasonic motor 136 is disposed between the X stage 132 and the Y stage 134. In a position surrounding the outside of the dust collecting electrode 122 on the upper surface of the stage 100, there is disposed a first dust cover 140 whose upper edge reaches above the dust collecting electrode 122, and there is disposed a second dust cover 142 on the outside of the ultrasonic motor 136 so as to close an open end of a housing portion for the ultrasonic motor 136.

By disposing the first dust cover 140 is disposed, it is possible to prevent dust or particles such as particles from scattering toward the surface of the sample 200 and adhering to the sample surface. In addition, by disposing the second dust cover 142 on the outside of the ultrasonic motor 136 to be a source of particles, it is possible to prevent dust or particles such as particles scattering from the ultrasonic motor 136 from entering inside the vacuum chamber 112. Prevention of dust or particles such as particles from scattering from the source thereof to the inside of the vacuum chamber 112 is effective particularly in the case where a wall friction drive type motor such as a Piezo-actuator is used.

Figure 10:
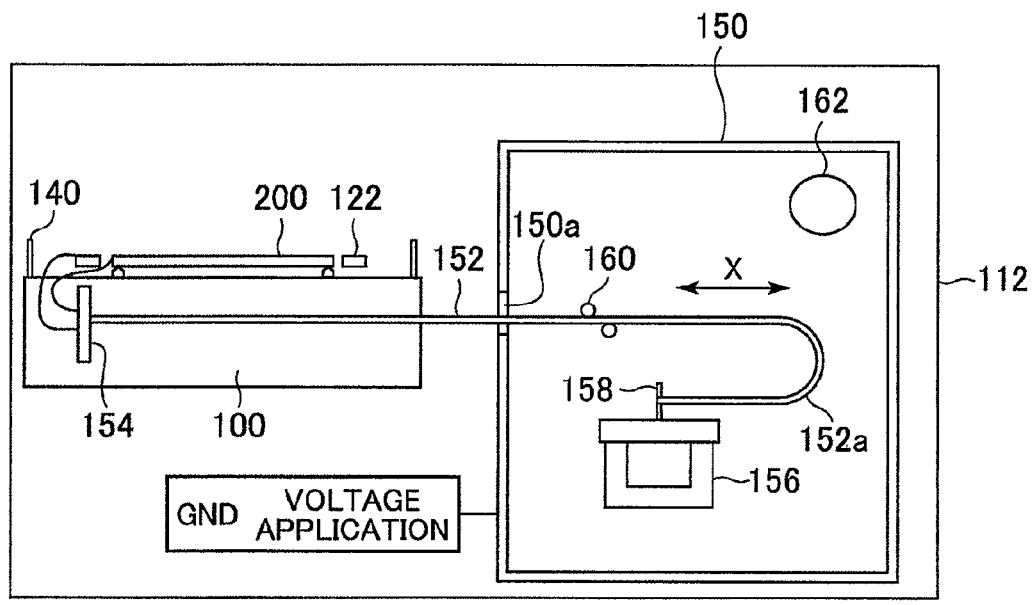
FIG. 10 is a diagram illustrating an overview of a wiring box and a stage disposed in a vacuum chamber according to the present invention.

In this example, as illustrated in FIG. 10 in detail, a wiring box 150 having an airtight structure is disposed inside the vacuum chamber 112. This wiring box 150 is used for preventing undesired objects such as particles generated from cables due to bending or friction of the cables from scattering inside the vacuum chamber 112. In this example, portions of cables 152 that are bent accompanying movement of the stage 100 on which the sample 200 is placed are all housed inside the wiring box 150. More specifically, the power supply for applying a predetermined voltage to the sample 200 (800 illustrated in FIG. 1, and 128 illustrated in FIGS. 11 to 14) and the power supply for applying a predetermined voltage to the dust collecting electrode 122 (130 illustrated in FIGS. 11 to 13) are disposed outside the wiring box 150. These external power supplies and a terminal strip 156 are electrically connected via a cable (not shown) extending from the terminal strip 156 and a feed-through disposed in the vacuum chamber 112. The terminal strip 156 includes two pairs of terminals for applying power supply voltages to the sample and to the dust collecting electrode. In addition, the cable 152 includes two pairs of power supply lines for transferring power supply voltages, and one end of each of the two pairs of power supply lines is connected electrically to corresponding one of the two pairs of terminals of the terminal strip 156. Note that, one end of the cable 152 is mechanically fixed to a movement plate 158 disposed in a vicinity of the terminal strip 156 in a movable manner as illustrated in the figure. A length of the cable between the movement plate 158 and the terminal strip 156 has a margin in view of a movement range of the movement plate 158. On the other hand, a fixing plate 154 is fixed to the stage 100, and the fixing plate also includes two pairs of terminals for applying voltages to the sample and the dust collecting electrode. These terminals are electrically and mechanically connected to the corresponding power supply lines of the cable 152.

Further, as illustrated in the figure, the cable 152 connected to the fixing plate 154 fixed to the stage 100 extends linearly from the stage 100 to the wiring box 150, passes through a slit 150a provided to the wiring box 150 to enter the inside of the wiring box 150, and then turns downward and is reversed by 180 degrees. Then, as described above, the other end of the cable 152 is mechanically fixed to the movement plate 158 disposed inside the wiring box 150, and the tip thereof is connected to the terminal strip 156. Thus, when the stage 100 moves in the X direction, the cable 152 is bent only at the flexion part 152a in the wiring box 150.

Inside the wiring box 150, there is disposed guide rollers 160 extending in the Y direction (perpendicular to the paper plane of FIG. 10) so as to guide the cable 152. When the stage 100 moves in the Y direction, the cable 152 moves along the guide rollers 160 in the Y direction, and hence the movement plate 158 moves. Therefore, a stress in the Y direction is not applied to the cable 152 extending to the movement plate 158.

Note that, the movement plate 158 is disposed in a movable manner in the above-mentioned embodiment, but it is possible to absorb a variation of the cable 152 due to movements of the stage 100 in the X direction and in the Y direction only by expansion and contraction of the flexion part 152a of the cable 152. Then, a fixing plate may be used instead of the movement plate to fix the cable 152 mechanically.

In this way, the bending part of the cable 152 is entirely inside the wiring box 150, and the hole communicating inside and outside of the wiring box 150 is small. Therefore, the probability that dust or particles generated in the wiring box 150 go outside the wiring box 150 is significantly decreased, and most of the dust or particles adhere to the inner wall of the wiring box 150. Further, in this example, a dust collecting electrode 162 for wiring box is disposed inside the wiring box 150, and a voltage for attracting the dust or particles is applied to the dust collecting electrode 162. Thus, the probability that the dust or particles such as particles scatter from the wiring box 150 to the outside can be reduced more.

It is possible to take measures of (1) using cables of equal length, (2) fixing and correcting cables with an insulock tie or the like, or (3) using a flat cable as cables. Thus, generation of particles due to friction among cables can be reduced. In other words, when a plurality of cables of equal length are fixed, the cables become one bunch. When the stage moves, flexion occurs in the cables. In this case, friction among cables can be reduced so that occurrence of dust or particles such as particles can be reduced. Alternatively, if a flat cable is used instead of the cables, a plurality of wires can be replaced by one cable so that friction among cables can be eliminated. If a flat cable having many wires is not immediately available, it is effective to combine the above-mentioned (1) and (2).

Figure 11:
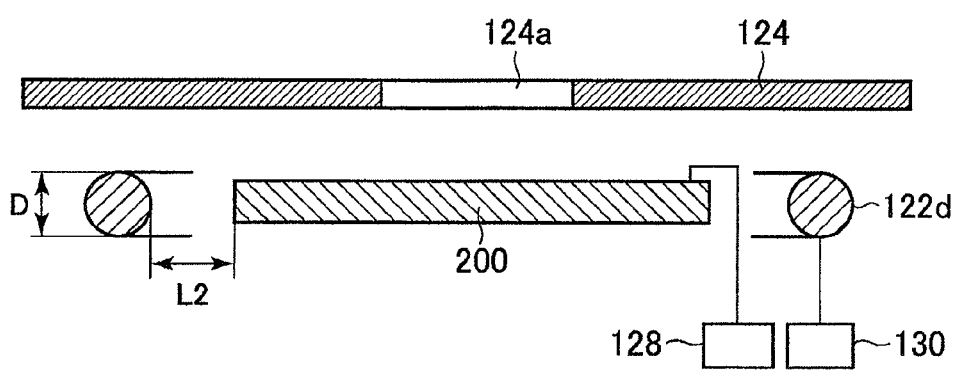
FIG. 11 is an enlarged cross sectional view of the sample, another dust collecting electrode, and the gap control plate according to the present invention.

In the example described above, the dust collecting electrode 122 having a rectangular cross section is used, but a dust collecting electrode 122d having a circular cross section may be used as illustrated in FIG. 11. A diameter D of this dust collecting electrode 122d is related to a distance L2 between the sample 200 and the dust collecting electrode 122d, and it is preferred to satisfy the relationship 0.5L2<D<5L2. If the diameter D of the dust collecting electrode 122d is smaller than 0.5L2, the trapping probability of the dust collecting electrode 122d is decreased. If the diameter D of the dust collecting electrode 122d is larger than 5L2, the trapping probability of the dust collecting electrode 122d does not change, and the trapping of excessive dust or particles such as particles may be induced in some cases.

Figure 12:
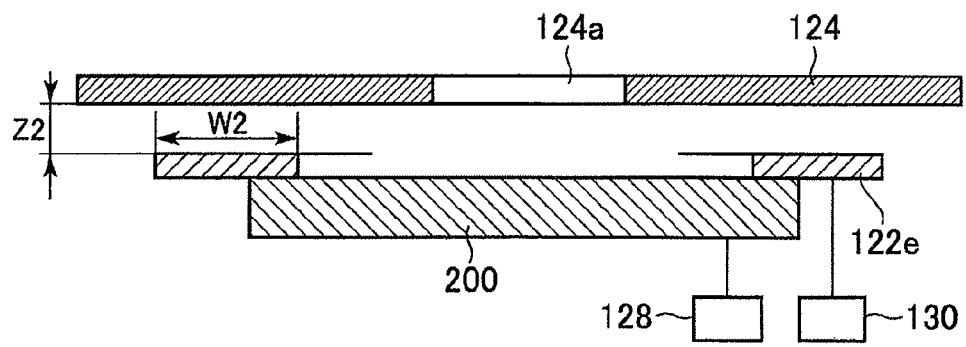
FIG. 12 is an enlarged cross sectional view of the sample, still another dust collecting electrode, and the gap control plate according to the present invention.

In addition, in the above-mentioned example, the dust collecting electrode 122 is disposed at a position having a predetermined interval from the sample 200, and a voltage having the same polarity as the voltage applied to the sample 200 and an absolute value larger than the voltage applied to the sample 200 is applied to the dust collecting electrode 122. However, as illustrated in FIG. 12, it is possible to dispose a dust collecting electrode 122e that has a rectangular cross section so that the inner edge portion thereof contacts with the outer edge portion of the sample 200, and is continuous in a shape of a rectangular frame so as to surround the entire periphery of the sample. Further, a voltage that is the same as the voltage applied to the sample 200 via the first power supply 128 may be applied to the dust collecting electrode 122e via the second power supply 130. A thickness of this dust collecting electrode 122e is 0.1 to 5 mm, for example, and a width W2 is the same as that of the above-mentioned dust collecting electrode 122, for example, 5 to 50 mm.

Figure 13:
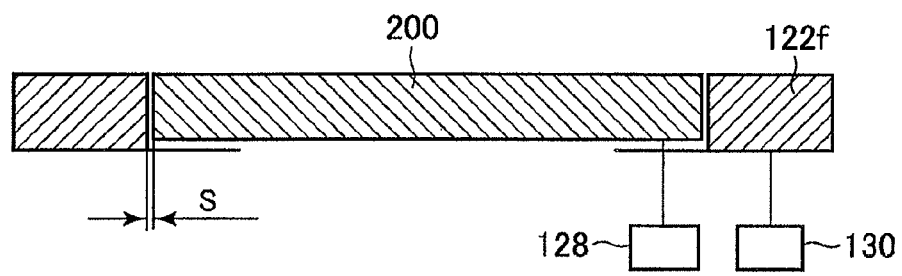
FIG. 13 is an enlarged cross sectional view of the sample, and still another dust collecting electrode according to the present invention.

In the example illustrated in FIG. 12, the dust collecting electrode 122e having an inner shape smaller than an outer shape of the sample 200 is used so that the inner edge portion of the dust collecting electrode 122e contacts with the outer edge portion of the sample 200. However, as illustrated in FIG. 13, it is possible to use a dust collecting electrode 122f in a shape of a rectangular frame having an inner shape slightly larger than an outer shape of the sample 200 and to dispose the dust collecting electrode 122f so as to surround the entire periphery of the sample 200 with a slight gap S between the dust collecting electrode 122f and the sample 200. This gap S is 1 to 500 µm, for example.

In the example illustrated in FIG. 12, a voltage of −1 to −5 kV is applied to the sample 200 via the first power supply 128, and a voltage that is the same as the voltage applied to the sample 200 is applied to the dust collecting electrode 122e via the second power supply 130. In other words, when a voltage of, for example, −3 kV is applied to the sample 200, a voltage of −3 kV is applied to the dust collecting electrode 122e.

Similarly to the above-mentioned example, if a potential of the sample 200 is negative, the dust or particles that are positively electrified are attracted by the electric field and move toward the sample 200. According to the example illustrated in FIG. 12, because the dust collecting electrode 122e having the same potential as the sample 200 is disposed to surround the entire periphery of the sample 200, most of the dust or particles, which are attracted by the electric field and move toward the sample 200, are trapped by the dust collecting electrode 122e. In this way, because the dust collecting electrode 122e disposed around the sample 200 can trap most of the dust or particles, it is possible to reduce dust or particles that scatter to the surface of the sample 200 and adhere to the sample surface. Thus, it is possible to prevent the dust or particles from adhering to the surface of the sample 200.

In the example of FIG. 12, the distance between the dust collecting electrode 122e and the gap control plate 124 is denoted by Z2, and in terms of a relationship between Z2 and the width W2 of the dust collecting electrode 122e, the effect becomes large particularly when W2>4Z2 is satisfied. In addition, the effect becomes even larger when a value of voltage density B (absolute value) between the dust collecting electrode 122e and the gap control plate 124 is larger than 0.1 kV/mm (B (absolute value)>0.1 kV/mm).

Figure 14:
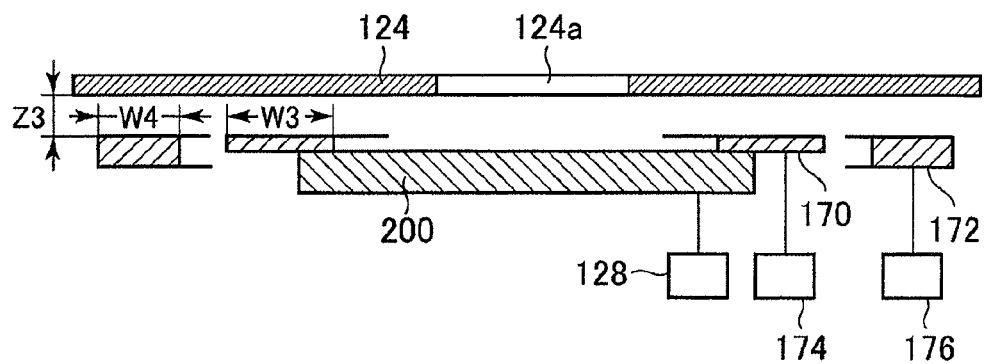
FIG. 14 is an enlarged cross sectional view of the sample, still another dust collecting electrode, and the gap control plate according to the present invention.

FIG. 14 illustrates still another example in which the above-mentioned example illustrated in FIG. 8 and the above-mentioned example illustrated in FIG. 12 are combined. In this example, a first dust collecting electrode 170 that has a rectangular cross section and is continuous in a shape of a rectangular frame, for example, is disposed so as to surround the entire periphery of the sample and so that the inner edge portion contacts with the outer edge portion of the sample 200. Further, a second dust collecting electrode 172 that has a rectangular cross section and is continuous in a shape of a rectangular frame, for example, is disposed at a position separated from the first dust collecting electrode 170 by a predetermined interval so as to surround the entire periphery of the first dust collecting electrode 170. Then, the first dust collecting electrode 170 is connected to a second power supply 174, and the second dust collecting electrode 172 is connected to a third power supply 176.

Note that, as described above, second dust collecting electrodes extending linearly may be disposed along substantially the entire length of the individual sides of the first dust collecting electrode so that the second dust collecting electrodes surround substantially the entire periphery of the first dust collecting electrode. Alternatively, it is possible that the second dust collecting electrodes extending linearly are separated from each other at a mid position.

In the example of FIG. 14, similarly to the above-mentioned example, a voltage of −1 to −5 kV, for example, is applied to the sample 200 via the first power supply 128, and a voltage that is the same as the voltage applied to the sample 200 is applied to the first dust collecting electrode 170. For instance, when −3 eV is applied to the sample 200, −3 eV is applied to the first dust collecting electrode 170. Further, a voltage having the same polarity as the voltage applied to the sample 200 and an absolute value larger than the voltage applied to the sample 200 by 0.5 to 5 kV, for example, is applied to the second dust collecting electrode 172. In other words, when a voltage of −3 kV is applied to the sample 200, for example, a voltage of −3.5 to −8 kV, for example, −5 kV is applied to the second dust collecting electrode 172.

Also in this example, in a manner substantially similar to the example illustrated in FIG. 8 and the like described above, when a negative voltage is applied to the sample 200, electric field intensity A between the sample 200 and the second dust collecting electrode 172 is set to be negative (A<0). Thus, attraction force of the second dust collecting electrode 172 is increased, and hence the probability that the second dust collecting electrode 172 traps the dust or particles such as particles can be increased. In addition to that, electric field intensity (absolute value) B between the gap control plate 124 and the second dust collecting electrode 172 is adjusted so that 0.1≤B (absolute value)≤10 kV/mm is satisfied. Thus, the probability that the second dust collecting electrode 172 traps the dust or particles such as particles can be further increased.

The first dust collecting electrode 170 has a thickness of, for example, 0.1 to 5 mm and a width W3 of, for example, 5 to 50 mm similarly to the above-mentioned dust collecting electrode 122e illustrated in FIG. 11. In addition, the second dust collecting electrode 172 has a thickness of, for example, 0.1 to 50 mm and a width W4 of, for example, 5 to 50 mm similarly to the above-mentioned dust collecting electrode 122 illustrated in FIG. 6.

For instance, a negative voltage of −1 to −5 kV is applied to the sample 200 and the first dust collecting electrode 170, and a negative voltage of −1.5 to −10 kV that is more negative than the negative voltage applied to the sample 200 and the first dust collecting electrode 170 by −0.5 to −5 kV is applied to the second dust collecting electrode 172. It is supposed that the gap control plate 124 has the ground potential, and the distance Z8 between the gap control plate 124 and the second dust collecting electrode 172 is 8 mm. Then, the electric field intensity A between the sample 200 and the dust collecting electrode 172 becomes negative (A<0), and the electric field intensity (absolute value) B between the gap control plate 124 and the second dust collecting electrode 172 becomes 0.19 to 1.25 kV/mm (=1.5 to 10 kV/8 mm). In particular, when a voltage of −5 kV is applied to the dust collecting electrode 122, the electric field intensity (absolute value) B becomes 0.625 kV/mm (=5 kV/8 mm), which is an effective condition. In this case, the voltage is set not to exceed 10 kV/mm as a withstand voltage of the space so that occurrence of discharge in the space can be prevented.

Figure 15:
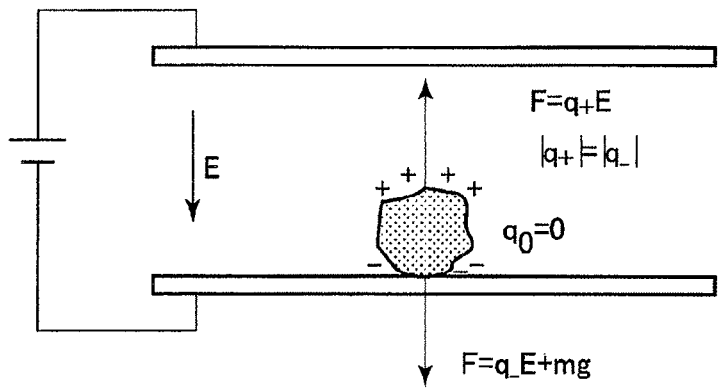
FIG. 15 is a diagram illustrating a relationship of forces acting by dielectric polarization on a particle formed of insulation material existing in a uniform electric field between parallel electrode plates.
Figure 16:
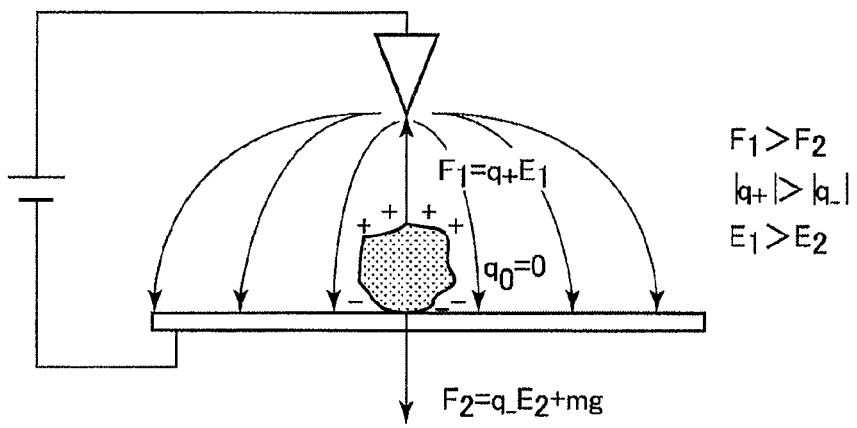
FIG. 16 is a diagram illustrating a relationship of forces acting by dielectric polarization on a particle formed of insulation material existing in an ununiform electric field between a flat electrode plate and another electrode.
Figure 17:
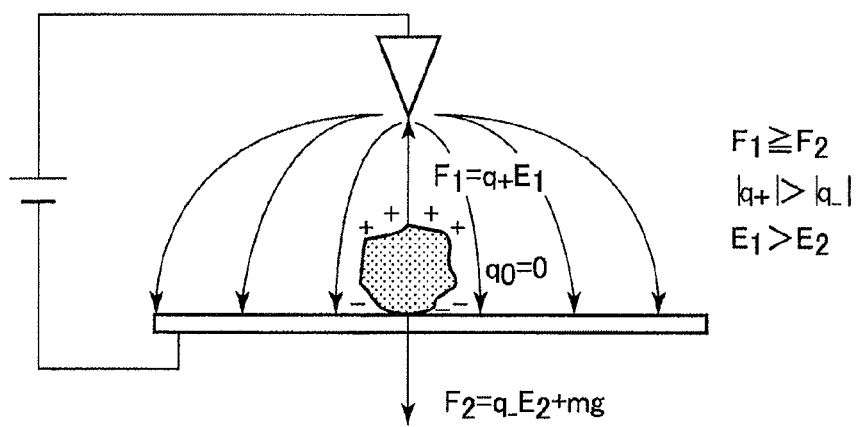
FIG. 17 is a diagram illustrating a relationship of forces acting by dielectric polarization on a particle formed of insulation material existing in a uniform electric field between a flat electrode plate and another electrode.

With reference to FIGS. 15 to 17, the prevention of adhesion of dust or particles such as particles is described in more detail.

As illustrated in FIG. 15, if a particle made of insulation material exists in a uniform electric field (q+=q−) between electrodes constituted of parallel plates, the particle does not scatter though the particle is polarized by electrostatic induction from the electric field. However, if the electric field is a non-uniform electric field, a particle is scattered by the charge generated by the dielectric polarization. In addition, if a particle made of insulation material exists in a non-uniform electric field (q+≠q−) between a pair of electrodes one of which is a plate as illustrated in FIG. 16, the particle is polarized and scattered by electrostatic induction from the electric field. If a particle made of insulation material exists in a uniform electric field (q+=q−) between a pair of electrodes one of which is a plate as illustrated in FIG. 17, the particle does not scatter though the particle is polarized by electrostatic induction from the electric field.

In this way, as illustrated in FIGS. 16 and 17, it is considered that probability that dust or particles' scatter is highly dependent on initial charge q0 of the dust or particles such as particles before dielectric polarization. It is considered that the initial charge q0 of the remaining matters is given by static electricity generated mainly by air flow when the vacuum evacuation is performed.

Figure 18:
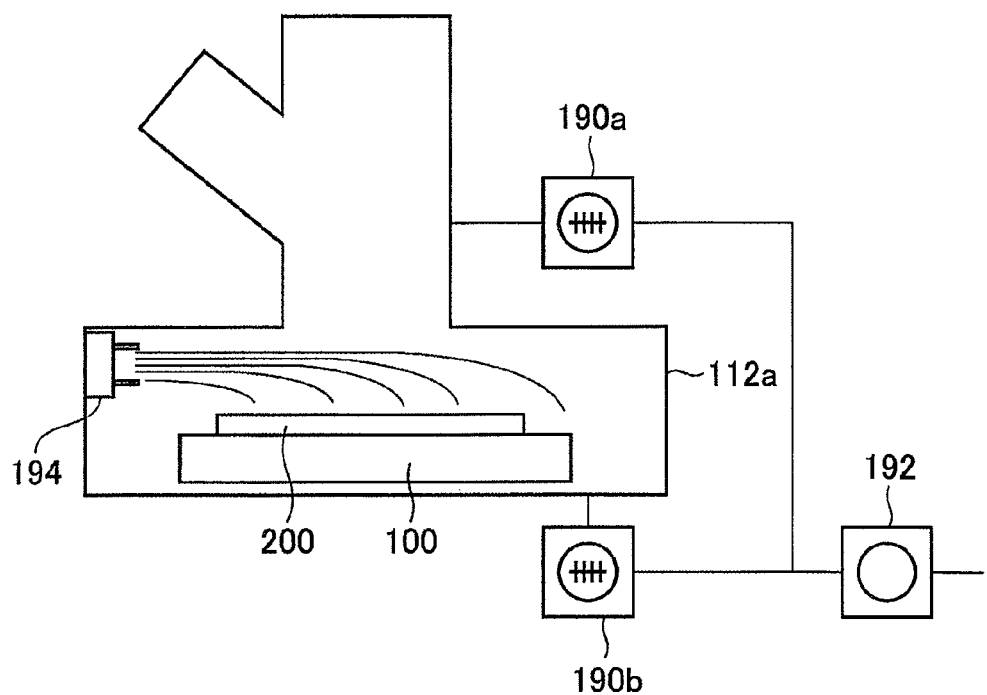
FIG. 18 is a schematic diagram illustrating another vacuum chamber provided to the electro-optical inspection apparatus according to the present invention.

FIG. 18 illustrates another vacuum chamber 112a provided to the electro-optical inspection apparatus. Inside the vacuum chamber 112a, there are disposed the stage 100 on which the sample 200 is placed, and a primary electro-optical system and a secondary electro-optical system of the electro-optical inspection apparatus. The vacuum chamber 112a is connected two vacuum pumps 190a and 190b, which are connected to a common dry pump 192. Further, inside the vacuum chamber 112a, there is disposed a static electricity remover 194 that ionizes gas with X-rays or UV-ray and uses the ionized gas for removing static electricity on a surface of a substance existing in the ionized gas so that dust or particles such as particles (remaining matters) that cannot be removed by cleaning of the vacuum chamber 112a are not electrified by the static electricity.

According to the example of FIG. 18, the static electricity remover 194 is activated at the same time as the vacuum evacuation inside the vacuum chamber 112a is started or before the vacuum evacuation. In addition, also during the vacuum evacuation of the inside of the vacuum chamber 112a, the static electricity remover 194 is continued to work. In other words, until there is no air flow in the vacuum chamber 112a and no generation of static electricity by the air flow, the static electricity remover 194 is continued to work. In this way, dust or particles (remaining undesired objects) in the vacuum chamber 112a are prevented from being electrified so that the initial charge q0 thereof is 0 (see FIG. 16). Thus, probability of scattering caused by dielectric polarization of the non-uniform electric field can be decreased.

In addition, even if the amount of the dust or particles such as particles is small, remaining in the vacuum chamber without being removed by cleaning of the vacuum chamber, the dust or particles are deposited on the upper surface of the planar structure in the vacuum chamber by action of gravity.

Figure 19:
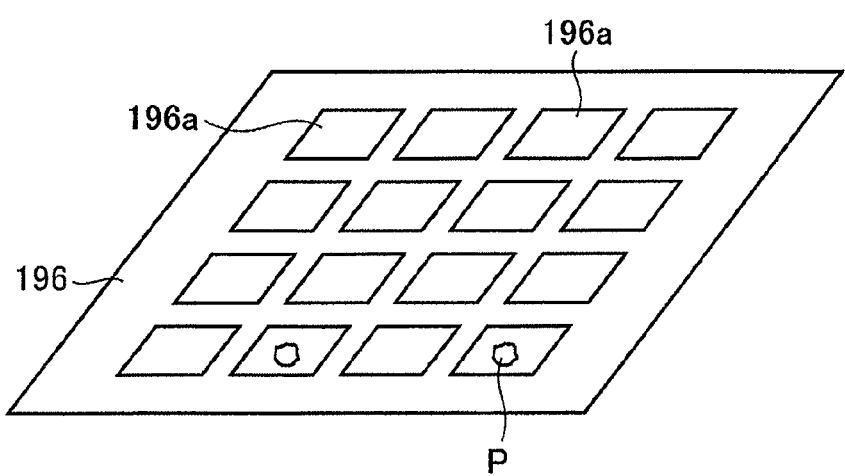
FIG. 19 is a perspective view illustrating an example of a wall constituting a planar structure in the vacuum chamber according to the present invention.
Figure 20:
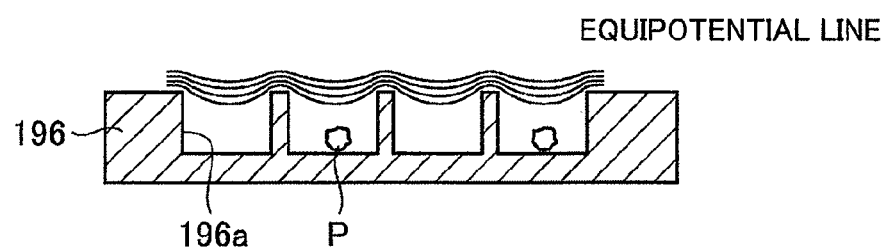
FIG. 20 is a cross sectional view of the structure in FIG. 19.

FIG. 19 is a perspective view illustrating an example of the planar structure constituting the upper surface, the bottom surface, and the side surfaces on the inside of the vacuum chamber 112 illustrated in FIG. 2 or the vacuum chamber 112a illustrated in FIG. 18, for example. FIG. 20 is a cross sectional view of FIG. 19. As illustrated in FIGS. 19 and 20, the planar structure of the vacuum chamber 112 or 112a (see FIGS. 2 and 18), for example, is constituted of a wall body 196 having a number of holes 196a formed in grating on the inner surface. In this way, because a number of holes 196a are formed in grating on the inner surface of the wall body 196, dust or particles P such as particles remaining in the vacuum chamber are deposited on the bottom of the holes 196a by the gravity. As illustrated in FIG. 20, the electrostatic shield effect of the grating holes 196a prevents the electric field from entering the bottom of the grating holes 196a. Therefore, the dust or particles (remaining matters) P deposited on the bottom of the grating holes 196a are not attracted by the static electricity and do not scatter. Thus, it is possible to prevent dust or particles such as particles remaining in the vacuum chamber 112 or 112a from adhering to the surface of the sample 200 placed in the vacuum chamber 112 or 112a, for example.

In the example illustrated in FIG. 19, a plurality of holes 196a are formed on the wall body 196 in grating, namely in matrix. The number of holes may be any number, namely, one or larger, and a size of the hole should be set so that the particles or the like deposited in the hole are not scattered by the electrostatic shield effect. In addition, when a plurality of holes are formed, any arrangement can be adopted instead of the grating arrangement.

Figure 21:
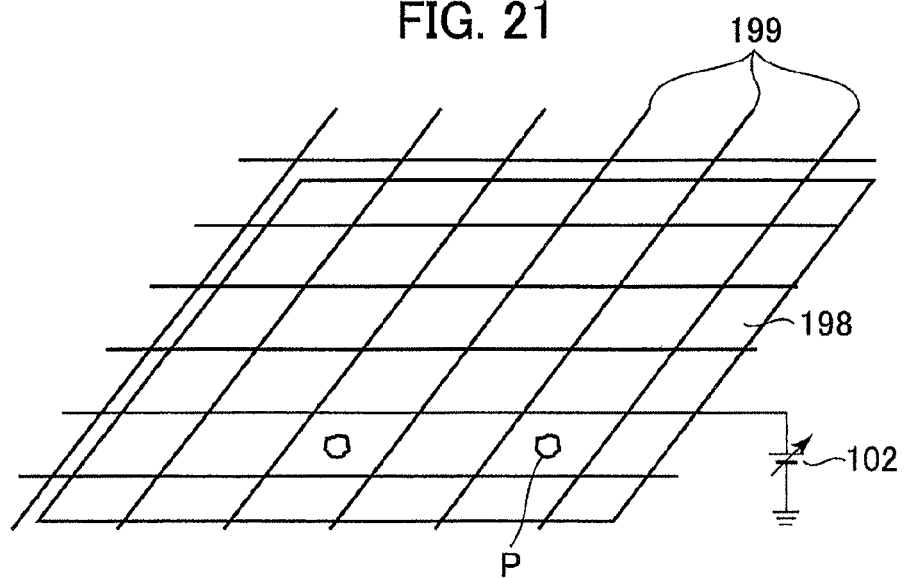
FIG. 21 is a perspective view illustrating another example of the wall constituting the planar structure in the vacuum chamber according to the present invention.
Figure 22:
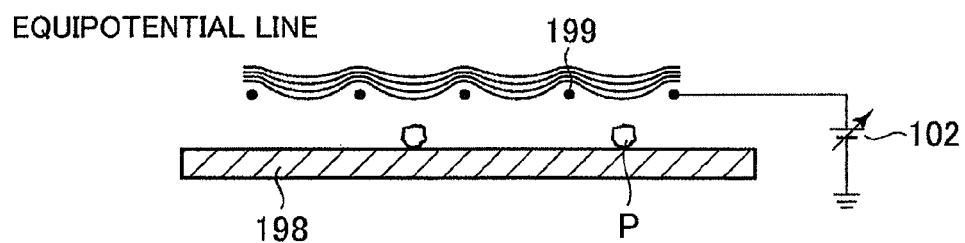
FIG. 22 is a cross sectional view of the structure in FIG. 21.

FIG. 21 is a perspective view illustrating another example of the wall constituting the planar structure of the vacuum chamber 112 illustrated in FIG. 1 or the vacuum chamber 112a illustrated in FIG. 18. FIG. 22 is a cross sectional view of FIG. 21. As illustrated in FIGS. 21 and 22, the planar structure of the vacuum chamber 112 or 112a (FIGS. 2 and 18) is constituted of a plate-like wall body 198 and a plate 199 having a mesh structure disposed in parallel to the wall body 198 with a predetermined interval between them. The plate 199 having a mesh structure is constituted of a mesh-like or net-like metal plate and is connected to an independent power supply 102.

In the example illustrated in FIGS. 21 and 22, dust or particles P remaining in the vacuum chamber 112 or 112a are allowed to pass through the plate 199 having a mesh structure and reach the surface of the wall body 198 by the gravity. The wall body 198 is covered with the plate 199 having the mesh structure, and hence the electric field is blocked by the plate 199 having a mesh structure and does not reach the surface of the wall body 198. Therefore, the dust or particles (remaining matters) P reaching the surface of the wall body 198 are not attracted by the static electricity and are not scattered. Thus, it is possible to prevent dust or particles remaining in the vacuum chamber 112 or 112a from adhering to the surface of the sample placed in the vacuum chamber 112 or 112a, for example.

In particular, by applying the voltage independently to the plate 199 having the mesh structure, dust or particles P remaining in the vacuum chamber can be positively attracted by the plate 199 having the mesh structure, and together with gravity action of the dust or particles P, the dust or particles P can be deposited and fixed to the surface of the wall body 198 constituting the planar structure of the vacuum chamber 112 or 112a, for example.

Next, there is described a structure for enabling to image the sample surface with high contrast in the case where the insulation region and the conductive region are formed on the surface of the sample 200 according to the present invention.

Figure 23A:
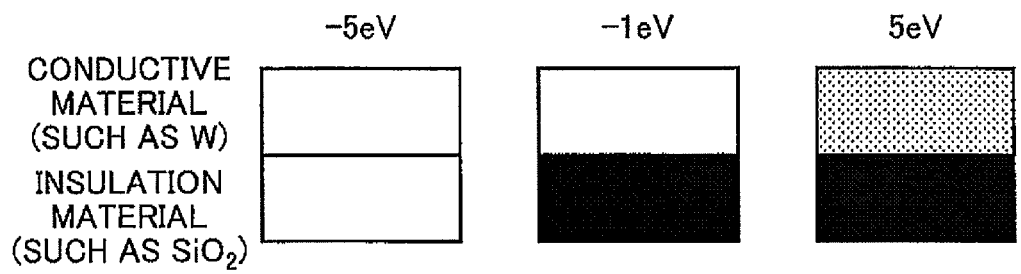
FIG. 23A is a diagram illustrating an example of a relationship between landing energy of an imaging electron beam and material contrast in an obtained image, and illustrating an example of different images obtained depending on a landing energy band.
Figure 23B:
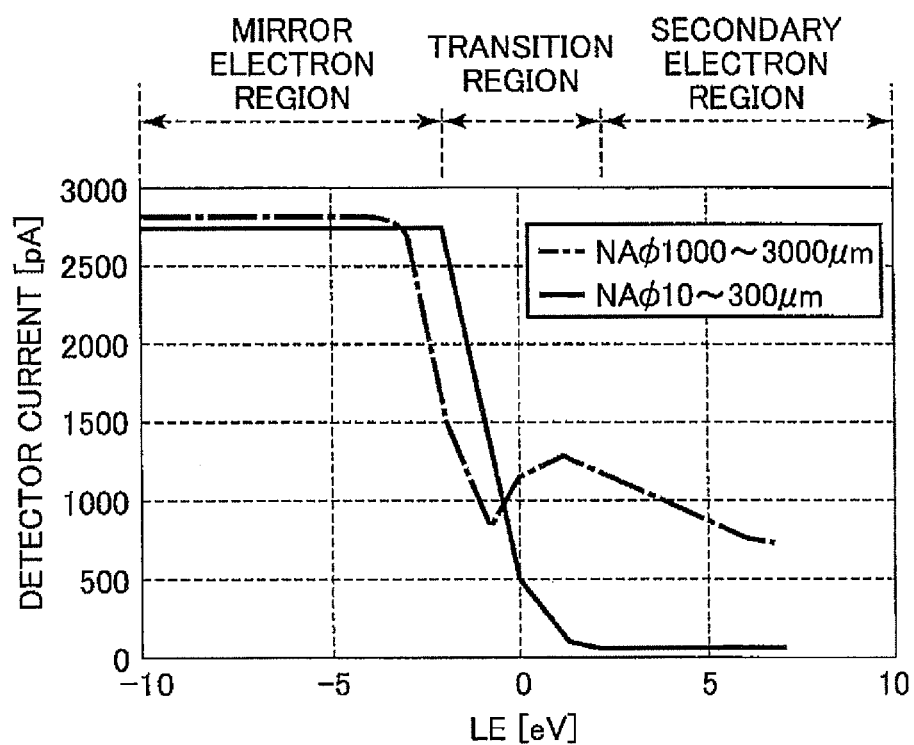
FIG. 23B is a graph illustrating an example of a relationship between landing energy of an imaging electron beam and material contrast in an obtained image, and illustrating a correlation between landing energy of the imaging electron beam and detector current.

FIGS. 23A and 23B are diagrams illustrating an example of a relationship between landing energy of the electron beam for imaging and material contrast in the obtained image when the image is obtained using the mapping projection type electro-optical inspection apparatus illustrated in FIG. 1. The material contrast means contrast due to a difference between electrons generated from the conductive material and electrons generated from the insulation material. FIG. 23A is a diagram illustrating an example of the image obtained depending on the landing energy band, and FIG. 23B is a graph illustrating correlation between the landing energy of the electron beam for imaging and detector current.

In FIG. 23B, the horizontal axis represents landing energy (LE) of the electron beam for imaging, and the vertical axis represents a value of the detector current of the detector 400. In addition, in FIG. 23B, the solid line is a characteristic curve in a case where the NA adjustment aperture plate 360 having an aperture diameter of 10 to 300 µm is used. The dot-dashed line is characteristic curve in a case where the NA adjustment aperture plate 360 having an aperture diameter of 1,000 to 3,000 µm is used. In the example illustrated in this diagram, the landing energy (LE) of 2 to 10 eV is a "secondary electron region", the same of −2 to 2 eV is the "transition region", and the same of −2 eV or lower is the "mirror electron region".

The term "secondary electron" means an electron emitted from the sample 200 when the electron beam collides with the surface of the sample 200. The secondary electrons may include reflection electrons having reflection energy that is substantially the same as incident energy and backward scattering electrons that scatter backward in addition to the so-called secondary electrons, as long as the electrons are emitted from the sample 200 when the electron beam collides with the sample surface. Electrons that are mainly detected in the "secondary electron region" are secondary electrons that are emitted from the sample 200 in a manner according to the cosine rule.

In addition, the "mirror electron" means an electron that is reflection of the electron beam that is irradiated toward the surface of the sample 200 and does not collide with the sample surface but changes the propagation direction oppositely in the vicinity of the sample surface. For instance, if the sample surface has a negative potential and landing energy of the electron beam is small, there is a phenomenon that the electron beam does not collide with the sample surface but changes the propagation direction oppositely due to the electric field near the sample surface. In the sample observation apparatus and the sample observation method according to the present invention, such electrons that do not collide with the sample surface but change the propagation direction oppositely as reflection are referred to as mirror electrons.

In FIG. 23B, in the secondary electron region having a landing energy (LE) of 2 to 10 eV, detection current is greatly different due to a difference of aperture diameter of the NA adjustment aperture plate 360. This is because a sample surface emission angle of the secondary electron is expressed by the cosine rule, and hence spread of electrons at a position of the NA adjusting aperture 360 is large.

Then, as the landing energy (LE) is decreased to 2 eV or lower, the mirror electrons increase gradually to be the "transition region" in which the mirror electrons and secondary electrons are mixed. As illustrated in FIG. 23B, a detector current difference due to the difference of aperture diameter of the NA adjustment aperture plate 360 is small.

In addition, when the landing energy (LE) becomes −2 eV or lower, the mirror electron region appears in which emission of the secondary electrons does not occur and emission amount of the mirror electrons is constant. In this region, the detector current does not depend on an aperture diameter of the NA adjustment aperture plate 360. Therefore, it can be considered that the mirror electrons are concentrated in a range of ϕ300 µm or smaller and ϕ10 µm or larger at the position of the NA adjustment aperture plate 360. This is because the mirror electron does not collide with the sample surface but is reflected, and therefore has good directivity and high straightness.

Note that, in the example illustrated in FIG. 23B, the characteristic curve is considered to be the same as illustrated in the solid line in the case where the aperture diameter is smaller than 10 µm and to be the same as illustrated in the broken line in the case where the aperture diameter is larger than 3,000 µm. However, it is supposed here that the aperture diameter is 10 µm or larger and 3,000 µm or smaller because of a limit of measurement due to increasing noise.

Figure 24:
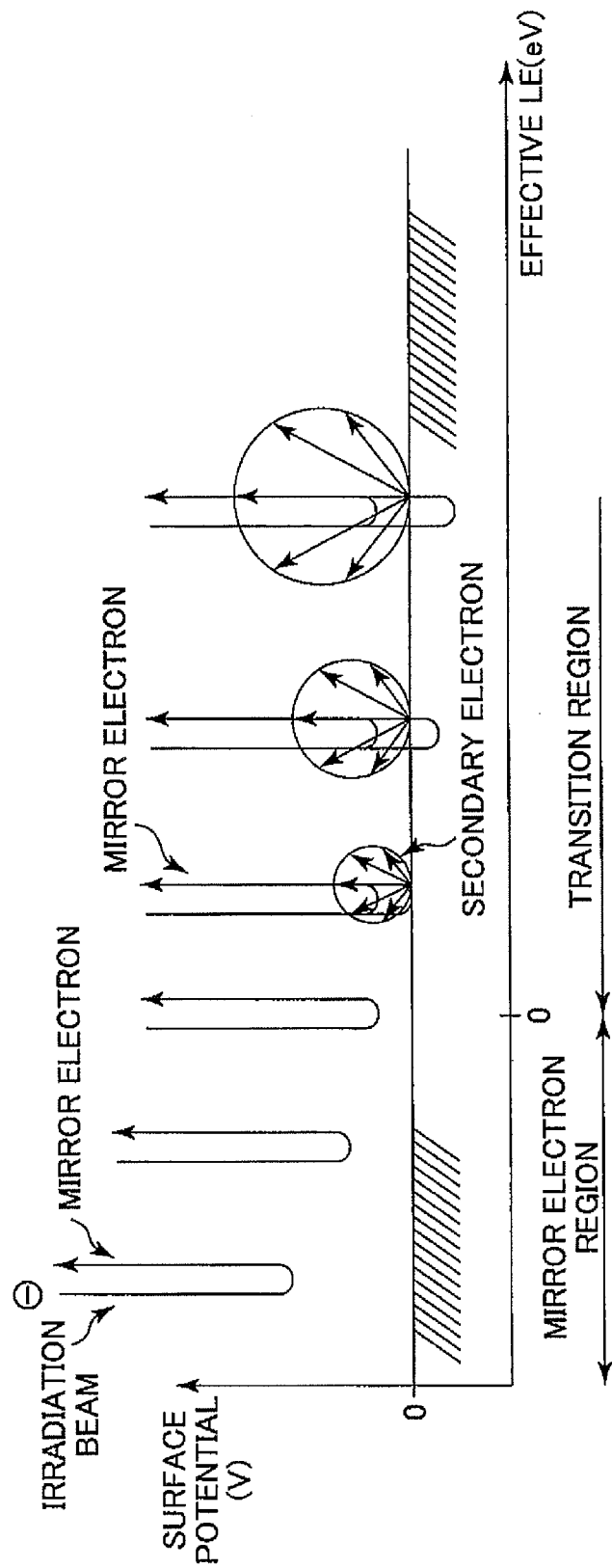
FIG. 24 is a diagram schematically illustrating an angle difference between a mirror electron having structural information of a sample surface and a secondary electron, in which the horizontal axis represents effective landing energy (LE)

FIG. 24 is a diagram schematically illustrating a difference of angle between the mirror electron having structural information of the sample surface and the secondary electron, in which the horizontal axis represents the effective landing energy (LE). In FIG. 24, a relationship between the effective landing energy and behavior of the electron is illustrated for each of the mirror electron region and the transition region.

FIG. 24 illustrates an example in which a region having effective landing energy (LE) smaller than 0 eV becomes the mirror electron region. As illustrated in this diagram, the mirror electron is generated when the irradiation electron beam does not collide with the sample surface but is reflected to the front of the sample surface. In this case, if the irradiation beam enters the sample surface perpendicularly, the mirror electron is reflected perpendicularly to the sample surface. As a result, propagation direction of the mirror electron is constant.

In contrast, in the transition region, some of the irradiation electron beams do not collide with the sample surface but are reflected to the front of the sample surface to be mirror electrons, and others of the irradiation electron beams collide with the sample surface so that the secondary electrons are emitted from the inside to the outside of the sample. Here, in the same manner as in the mirror electron region, if the irradiation beam enters the sample surface perpendicularly, the mirror electron is reflected perpendicularly to the sample surface so that the propagation direction of the mirror electron is constant. On the other hand, the secondary electrons are emitted in various directions so that the emission amount is proportional to cosine of an angle between the normal of the sample surface and the emission direction (observation direction), namely according to the so-called "cosine rule". Then, a ratio of the secondary electrons to the mirror electrons becomes higher as the landing energy becomes higher (toward the right side in FIG. 24).

In other words, as illustrated in FIG. 24, the mirror electrons have a constant propagation direction and good directivity, but the secondary electrons propagate in various directions according to the cosine rule so that the directivity is not high.

In the above-mentioned example, the range of landing energy from −2 eV to 2 eV corresponds to the transition region, namely the region where the mirror electrons and the secondary electrons are mixed. However, this landing energy range can change depending on the sample to be observed. The inventors of the present invention have found from various experiments that use of the irradiation electron beam having landing energy in the transition region is effective for high contrast observation of a sample surface pattern, in particular, high contrast observation of a sample surface on which an insulation region and a conductive region are formed.

According to study by the inventors of the present invention, it is found that when the lowest landing energy of the transition region is denoted by LEA while the highest landing energy is denoted by LEB, it is preferred to set the primary landing energy (LE) of the electron beam for imaging to a value that satisfies LEA≤LE≤LEB or LEA≤LE≤LEB+5 eV. Hereinafter, this is described in detail.

Figure 25:
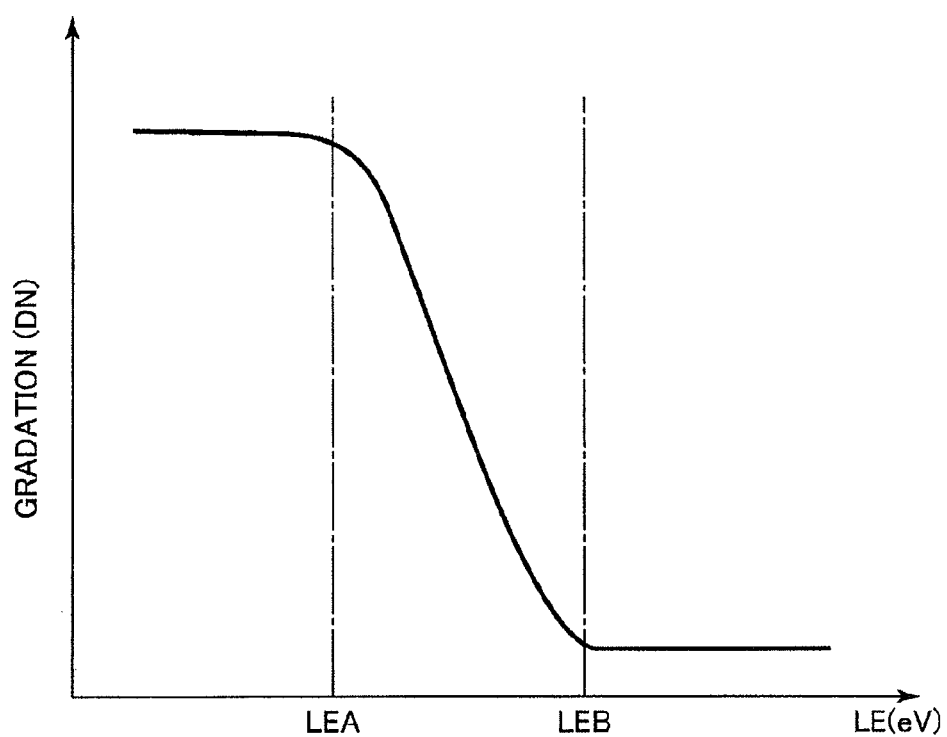
FIG. 25 is a graph illustrating a variation of gradation of the sample surface with respect to the landing energy (LE)

FIG. 25 is a diagram illustrating a variation of the gradation of the sample surface with respect to the landing energy (LE). The gradation is proportional to the number of electrons obtained by the detector 400. As illustrated in FIG. 25, the region where the landing energy (LE) is LEA or lower is the mirror electron region, the region where the landing energy (LE) is LEB or higher is the secondary electron region, and the region where the landing energy (LE) is LEA or higher and LEB or lower is the transition region.

According to various experiments carried out by the inventors of the present invention, it is confirmed that the range in which LEA to LEB is −5 eV to +5 eV is a preferred range in many cases.

Further, a gradation difference occurs due to a difference of forming state of mirror electrons between the insulation region and the conductive region. As the gradation difference is larger, higher contrast is formed. In other words, a difference of material or structure causes a difference of forming state of mirror electrons so that the gradation difference is formed. In order to generate high contrast between the insulation region and the conductive region in the obtained image, it is very important how the above-mentioned landing energy (LE) is set. Specifically, it is very effective for obtaining high contrast to use the landing energy (LE) in the region satisfying LEA≤LE≤LEB (for example, −5 eV to +5 eV) or the region satisfying LEA≤LE≤LEB+5 eV (for example, −5 eV to +10 eV (=(5+5)eV)).

With reference to FIGS. 23A and 23B again, contrast between the insulation material and the conductive material in each generated electron region is described. It should be noted that, various materials made of conductor or insulator can be used for the conductive material and the insulation material. For instance, tungsten (W) can be used for the conductive material, and silicon oxide ($SiO_2$) film can be used for the insulation material.

FIG. 23A illustrates an example of material contrast in the image obtained by the irradiation electron beam having the landing energy (LE) of each generated electron region. FIG. 23A illustrates an example of material contrast in the secondary electron region, the transition region and the mirror electron region. First, noting the material contrast in the mirror electron region, there is no difference of luminance between the conductive material and the insulation material so that the material contrast is not obtained. This is because every irradiation electron is reflected before the sample surface in the mirror electron region, and therefore there is no difference of luminance, namely no difference of the number of electrons between the conductive material and the insulation material.

In addition, there is a luminance difference between the conductive material and the insulation material in each of the transition region and the secondary electron region. The transition region has a higher luminance difference between the conductive material and the insulation material, and as a result, has a higher material contrast. The reason is considered to be that not only the secondary electrons but also mirror electrons having high directivity are detected in the transition region, and therefore the signal amount is increased so that the luminance is enhanced.

In this way, if a sample surface image is obtained in the transition region in which the secondary electrons and the mirror electrons are mixed, material contrast between the conductive material and the insulation material can be enhanced.

When the electron beam irradiates the sample surface in the transition region in advance before imaging, the potential of the conductive material remains to be the ground potential while the insulation material is electrified so that the potential is changed by a few eV negatively. As a result, energy (speed) of electron is different between the electron having structural information of the conductive material and the electron having structural information of the insulation material.

Further, when the electrons having different speeds pass through the E×B deflector 340 (see FIG. 1), an orbit shift occurs according to the speed due to the following reason.

The E×B deflector 340 is a means for generating an electric field E and a magnetic field B. An electron passing through the E×B 340 receives a force FE=e·E from the electric field and a force FB=e·(v×B) from the magnetic field. Here, e is the charge of electron that is $1.602 \times 10^{-19}$ C., and E and B are the electric field (V/m) and the magnetic field (Wb/m$^2$), respectively.

In these forces, the force FE=e·E due to the electric field does not depend on the electron speed v (m/s), but the force FB=e·(v×B) due to the magnetic field depends on the electron speed v (m/s).

Usually, a condition (Wien condition) is set for the electron emitted from the conductive substrate, namely the sample, to propagate straight through the E×B deflector 340. However, because of the above-mentioned reason, when the electron speed v (m/s) changes, the force affected by action of the magnetic field changes, and hence the orbit of the electron after passing through the E×B deflector 340 is shifted.

In other words, as described above, the E×B deflector 340 is a means for directing the orbit of the electron having structural information of the sample surface when the electron beam irradiates according to the speed of the electron beam propagating in the direction opposite to the incident direction. Further, utilizing the above-mentioned shift of the electron orbit, it is possible to guide selectively the electrons having structural information of the conductive region or the electrons having structural information of the insulation region to pass through the NA aperture 361 and to reach the detector 400.

Note that, the transition region is the energy region in which the secondary electrons and the mirror electrons are mixed. Therefore, in this energy region, electron orbits of the secondary electron and the mirror electron from the insulation region are both shifted.

Figure 26A:
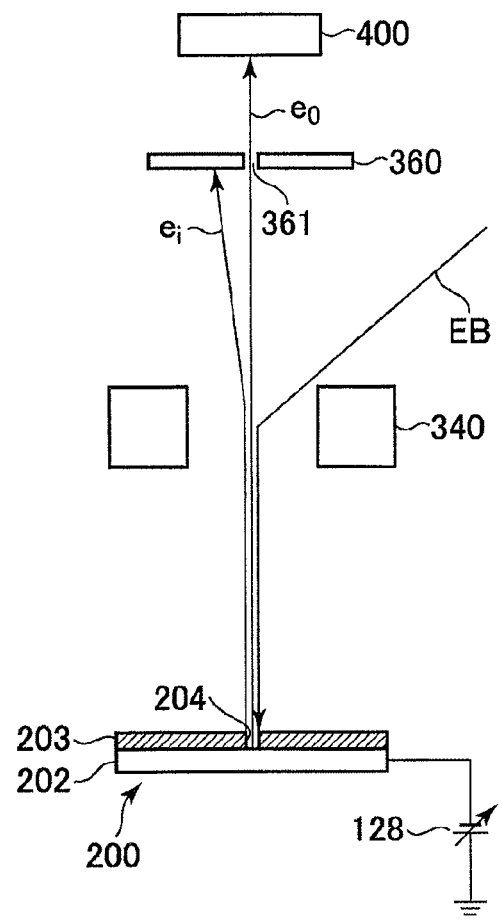
FIG. 26A is a side view illustrating an example of a locus of an electron having structural information of the sample surface.
Figure 26B:
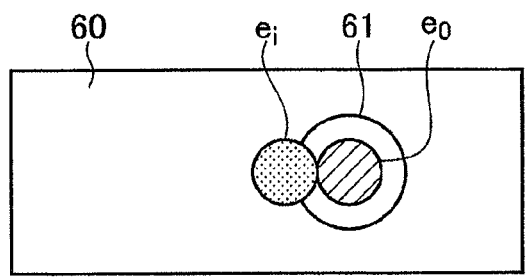
FIG. 26B is a partially enlarged diagram illustrating an example of a locus of the electron having the structural information of the sample surface viewed from an underside of a movable NA aperture.

FIGS. 26A and 26B are schematic diagrams illustrating an example of orbit of the electron having structural information of the surface of the sample 200. FIG. 26A is a side view of the electron orbit, and FIG. 26B is a partially enlarged diagram of the electron orbit viewed from the underside of the movable NA aperture.

In FIG. 26A, a negative potential is applied to the sample 200 from the power supply 128 for the sample. The sample 200 includes conductive material 202 and insulation material 203 covering the conductive material 202. The conductive material 202 is exposed at a hole 204 as a break in the insulation material 203. For instance, a reticle usually has a contact structure in which the bottom of the hole 204 is constituted of the conductive material 202 like the sample 200 illustrated in FIG. 26A. Note that, for simplification, only the E×B reflector 340, the NA adjustment aperture plate 360, and the detector 400 are illustrated as elements of the electro-optical inspection apparatus.

In FIG. 26A, an electron beam EB is emitted from the upper right and is deflected by the E×B deflector 340 so as to enter the sample 200 perpendicularly. Then, among electrons having structural information of the sample surface, the electrons ec having structural information of the conductive region 202 propagate straight and passes through the NA aperture 361 of the NA adjustment aperture plate 360. On the other hand, the electrons ei having structural information of the insulation region 203 are shifted in orbit by action of the E×B deflector 340 and collide with the NA adjustment aperture plate 360 around the NA aperture 361 so as not to pass through the NA aperture 361. As a result, the electrons ec having structural information of the conductive region 202 reach the detector 400, while the electrons ei having structural information of the insulation region 203 do not reach the detector 400.

A reticle usually has a contact structure in which most part of the surface of the sample 200 is occupied by the insulation material 203, and a part (the bottom of the hole 204) includes the conductive material 202. In this structure, only the electrons ec having surface structural information of the conductive material 202 are guided to the detector 400 while the electrons ei having surface structural information of the insulation material 203 are not allowed to reach the detector 400. Thus, an image with very high contrast can be obtained.

To the contrary, only the electrons ei having surface structural information of the insulation material 203 are guided to the detector 400 while the electrons ec having surface structural information of the conductive material 202 are not allowed to reach the detector 400. Thus, an image with very high contrast can be obtained.

This method of reverse of contrast is effective in particular for detecting a short defect and an open defect existing in a pattern in which areas of the conductive material and the insulation material are substantially the same on the sample surface. If an area of one of the conductive material and the insulation material is conspicuously smaller than an area of the other material in the pattern, material regions having the conspicuously small area are dotted in the material region of the large area. The electrons from the material region of the large area are slightly diverged in a light path to a detector. Because of this diverging action, an image obtained by the electrons from the material region having small area is smaller than an original image, and hence the defect detection becomes difficult. For instance, in a structure (contact plug structure) in which conductive regions having a contact plug shape of conspicuously small area are dotted in the large insulation region formed on a silicon substrate, an image formed by the electrons from the conductive region has an area smaller than the original area because of diffusion (diffraction) of electrons from the insulation region.

It is supposed that the electrons ec and ei include both the mirror electrons and the secondary electrons. In addition, separation and detection of the generated electrons according to a type of material can be applied not only to a reticle but also to a line/space pattern of a semiconductor wafer or the like in the same manner.

FIG. 26B is an enlarged diagram illustrating a relationship among the NA aperture 361, the electrons ec having surface structural information of the conductive material 202, and the electrons ei having surface structural information of the insulation material 203 viewed from the underside of the NA adjustment aperture plate 360.

In the example illustrated in FIG. 26B, a position of the NA aperture 361, which is formed in a part of the rectangular NA adjustment aperture plate 360, is adjusted so that the electrons ec having structural information of the conductive region 202 pass through the NA aperture 361, while most of the electrons ei having structural information of the insulation region 203 are blocked by the NA adjustment aperture plate 360 and cannot pass through the NA aperture 361.

As to the mirror electrons, electron orbits of the conductive material 202 and the insulation material 203 cross over at the position of the NA adjusting aperture plate 360, and form a minimum spot of 100 μm. Therefore, it is easy to separate the electrons ec having structural information of the conductive material 202 selectively without losing optical resolution by the NA adjustment aperture plate 360 by utilizing the orbit shift by the E×B deflector 340.

As the above-mentioned potential difference between the conductive material and the insulation material due to electrification is larger, positional movement in the position of the NA adjustment aperture plate 360 is also larger. Therefore, when the electrified potential difference is increased, even if the NA aperture 361 having a large aperture diameter is used, it is possible to separate the electrons ec having structural information of the conductive region 202 from the electrons ei having structural information of the insulation region 203. Then, by using the NA aperture 361 having a large aperture diameter, it is possible to increase the number of detected electrons for forming an image.

Note that, when the charged electron beam is to irradiate the insulation region 203 of the sample 200 before the electron beam for imaging irradiates, the charged electron beam only has to irradiate the surface of the sample 200 without performing imaging by the detector 400, while using the electron beam source 310 illustrated in FIG. 1 or the charged electron beam irradiation means 700, if disposed. In this case, it is possible to irradiate only the insulation region 203 with the charged electron beam, but the surface potential of the conductive region 202 is 0 even if it is irradiated with the charged electron beam. Therefore, without any distinction, the imaging region of the sample 200 may be irradiated with the charged electron beam having predetermined landing energy.

Figure 27A:
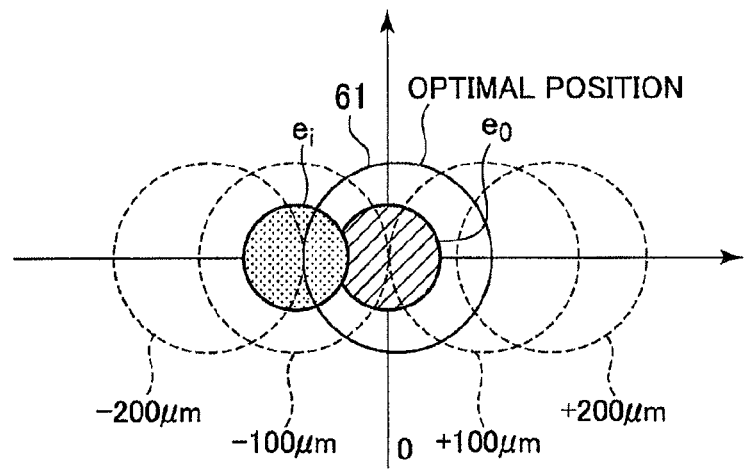
FIG. 27A is a diagram illustrating an optimal position of an NA aperture plate for obtaining high material contrast in the case of the mirror electron.
Figure 27B:
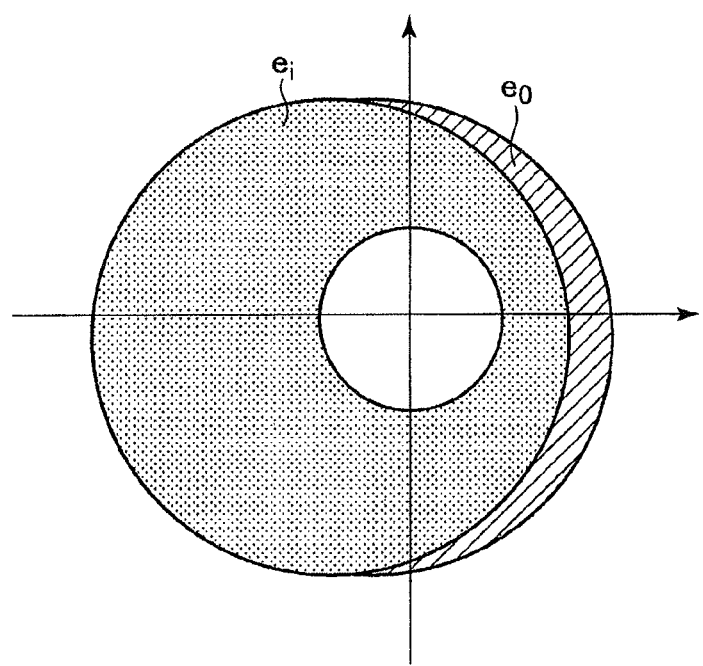
FIG. 27B is a diagram illustrating an optimal position of the NA aperture plate for obtaining high material contrast in the case of the secondary electron.

FIGS. 27A and 27B are diagrams illustrating an optimal position of the NA aperture 361 for obtaining high material contrast in the case of the mirror electrons and in the case of the secondary electrons. FIG. 27A is a diagram illustrating an optimal position of the NA aperture 361 of the NA adjustment aperture plate 360 in the case of the mirror electrons. FIG. 27B is a diagram illustrating an optimal position of the NA aperture in the case of the secondary electrons. In addition, in FIGS. 27A and 27B, a circle filled with black color indicates the electrons ec having structural information of the conductive region 202, and a circle filled with gray color indicates the electrons ei having structural information of the insulation region 203. As illustrated in these figures, the optimal position of the NA aperture 361 at the position of the NA adjustment aperture plate 360 is different depending on a difference of spread of the orbit of the mirror electrons or the secondary electrons.

In FIG. 27B, at the position of the NA adjustment aperture plate 360, a difference of electron orbit shift between the secondary electrons ec having structural information of the conductive region 202 and the secondary electrons ei having structural information of the insulation region 203 is approximately 100 μm, and the electron distributions are overlapped with each other in most part. This is because that the secondary electrons propagate in various directions according to the cosine rule so that the directivity is not high, as described above. Therefore, it is considered to be optimal to adjust the center of the NA aperture 361 of the NA adjustment aperture plate 360 to a position substantially identical to the center of the orbit of the electrons ec emitted from the conductive region 202, in order to increase the material contrast by the secondary electrons. When the center of the NA aperture 361 is adjusted to the position, the electrons ec can be detected with reference to the center of the part having the highest electron density of the electrons ec emitted from the conductive region 202 of the sample 200.

However, as illustrated in FIG. 27B, the electron orbit of the electrons ei emitted from the insulation region 203 substantially overlaps with the orbit of the electrons ec emitted from the conductive region 202, and hence the electrons cannot be detected separately. Therefore, in the secondary electron emission region, the material contrast is distinguished between the secondary electrons ec emitted from the conductive region 202 and the secondary electrons ei emitted from the insulation region 203, based on a signal difference thereof.

In contrast to the above, in FIG. 27A, there is a conspicuous difference of the electron orbit shift between the mirror electrons ec having structural information of the conductive region 202 and the mirror electrons ei having structural information of the insulation region 203. In the example illustrated in FIG. 27A, at the position of the NA adjustment aperture plate 360, a difference of electron orbit shift between the mirror electrons ec having structural information of the conductive region 202 and the mirror electrons ei having structural information of the insulation region 203 is approximately 100 μm. The electron distributions are not overlapped with each other in most part but are substantially separated. This is because the mirror electron has a constant propagation direction and good directivity as described above.

In this case, for example, it is easy to set an arrangement in which all the electrons ec having structural information of the conductive region 202 pass through the NA aperture 361 while the electrons ei having structural information of the insulation region 203 hardly pass through the NA aperture 361. Then, if the position adjustment of the NA aperture 361 is performed in such a manner, the electrons ec having structural information of the conductive region can be separated from the electrons ei having structural information of the insulation region, and many of only the electrons ec having structural information of the conductive region can be guided to the detector 400. As a result, material contrast between the conductive region 202 and the insulation region 203 can be enhanced. In other words, by using the mirror electrons generated in the transition region, the electrons ec having structural information of the conductive region can be separated from the electrons ei having structural information of the insulation region 203. As a result, it becomes easy to obtain an image with high material contrast.

Usually, in order to perform such separation, a chromatic aberration corrector (monochrometer) is necessary which is constituted of a plurality of magnetic fields and electric fields. According to the electro-optical inspection apparatus and the sample observation method of the present invention, an image with high material contrast can be obtained only by position adjustment of the NA aperture 361 formed in the NA adjustment aperture plate 360 without disposing a chromatic aberration corrector.

Note that, FIGS. 26A and 26B and 27A and 27B illustrate the case where the electrons ec having structural information of the conductive region 202 are selectively guided to the detector 400 and the electrons ei having structural information of the insulation region 203 are not guided to the detector 400. However, it is possible to adopt a structure in which the electrons ei having structural information of the insulation region 203 are selectively guided to the detector 400 and the electrons ec having structural information of the conductive region 202 are not guided to the detector 400, by setting of the E×B deflector 340, layout of the NA adjustment aperture plate 360, and adjustment of diameter of the aperture 361.

It should be set as appropriate according to the use whether the electrons ec having structural information of the conductive region 202 or the electrons ei having structural information of the insulation region 203 are selectively guided to the detector 400 to be detected.

As described above, the electro-optical inspection apparatus according to the present invention includes the electron beam source for irradiating the sample surface having the insulation region and the conductive region with the electron beam for imaging, the electromagnetic field generation means (E×B deflector) for directing, by an electric field and a magnetic field, the electrons having structural information of the sample surface by the irradiation with the electron beam for imaging, according to speed of the electrons propagating in the direction opposite to the incident direction of the electron beam for imaging, the detector for detecting the electrons directed by the electromagnetic field generation means (E×B) so as to obtain the sample surface image from the detected electrons, the landing energy setting means for setting the landing energy of the electron beam for imaging to the transition region in which the electrons include both the mirror electrons and the secondary electrons, the NA aperture moving mechanism for enabling adjustment of the NA aperture position defining the numerical aperture (NA) in the plane, and the charged electron beam irradiation means for irradiating the sample surface with the electron beam so as to electrify the insulation region. Then, through the position adjustment of the NA aperture by the NA aperture moving mechanism, the electrons having structural information of the conductive region and the electrons having structural information of the insulation region, which are directed differently by action of the E×B deflector, can be selectively guided to the detector.

In addition, the image processing device 500 is provided with a calculation function (calculation part), which determines whether or not a short defect exists from the image obtained from the electron having structural information of the conductive region, and determines whether or not an open defect exists from the image obtained from the electron having structural information of the insulation region. Thus, the electro-optical inspection apparatus can be used as a detection apparatus for a short defect and an open defect.

Further, the sample observation method of the present invention can be performed by using the electro-optical inspection apparatus having the above-mentioned structure. In the method, an image is obtained under the condition where the luminance of the conductive region is higher than the luminance of the insulation region, and another image is obtained under the condition where the luminance of the insulation region is higher than the luminance of the conductive region. Thus, the sample surface on which the insulation region and the conductive region are formed can be observed with high contrast, and detection of a short defect or an open defect, as well as classification of a type of the defect can be performed easily. Hereinafter, the sample observation method of the present invention is described.

In the sample observation method of the present invention, in the sample surface having the insulation region and the conductive region, the landing energy (LE) of the imaging electron beam is adjusted to the transition region in which the electrons having structural information of the sample surface include both the mirror electrons and the secondary electrons, and an image is obtained under the condition where the luminance of the conductive region is higher than the luminance of the insulation region while another image is obtained under the condition where the luminance of the insulation region is higher than the luminance of the conductive region. In other words, in the sample observation method of the present invention, an image is obtained under the condition of a relationship where contrast is reversed between the conductive region and the insulation region.

As described above, by using the mirror electrons generated in the transition region, the electrons ec having structural information of the conductive region can be separated from the electrons ei having structural information of the insulation region 203. As a result, it becomes easy to obtain an image with high contrast. The sample observation method of the present invention utilizes this principle. In order to easily understand the feature of the method, the results of a basic study about formation of contrast between the conductive region and the insulation region are described in advance.

Figure 28A:
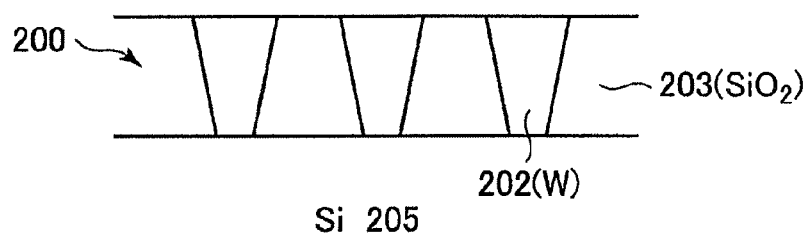
FIG. 28A is a diagram illustrating a cross sectional structure of a sample having a contact plug structure.
Figure 28B:
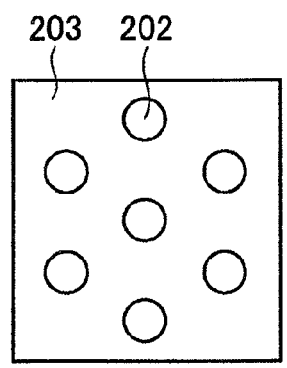
FIG. 28B is a diagram illustrating an example of an obtained image of a sample surface having a contact plug structure.

FIG. 28A is a diagram illustrating a structure of the sample 200 described above in relation to FIG. 26A and illustrates a cross sectional structure of the sample 200 having a plurality of contact plugs. FIG. 28B is a diagram illustrating an example of the obtained image of the surface of the sample 200 having the contact plug structure.

In FIG. 28A, the insulation region 203 and the conductive region 202 are formed on a silicon substrate 205 that is a semiconductor substrate. The insulation region 203 is made of $SiO_2$. In addition, the conductive region 202 is made of material of tungsten (W) to form a contact plug shape. On the sample surface, there are formed a plurality of conductive regions 202 in dots or circles in the insulation region 203 as a base.

FIG. 28B is a diagram illustrating an example of the image of the sample surface 201 obtained by sample observation. This image is obtained under the condition where the luminance of the conductive region is higher than the luminance of the insulation region in which the position of the NA aperture 361 of the NA adjustment aperture plate 360 is adjusted so that the electrons generated from the conductive region 202 are selectively detected. As a result, the black insulation region 203 occupies the base of the image, from which the white circular conductive regions 202 come to the surface, as a high contrast image.

In this way, by separating the electrons ec having structural information of the conductive region from the electrons ei having structural information of the insulation region 203, the contrast can be enhanced. As a result, it is possible to obtain an image in which the insulation region 203 can be easily distinguished from the conductive region 202, and hence observation or inspection of a defect or the like can be also performed easily.

On the contrary, if the position of the NA aperture 361 of the NA adjustment aperture plate 360 is adjusted so that the electrons generated from the insulation region 203 are selectively detected, an image is obtained under the condition where the luminance of the insulation region is higher than the luminance of the conductive region. Therefore, on the contrary to FIG. 28B, an image is obtained in which the insulation region 203 becomes white with high luminance, and the conductive region 202 becomes black with low luminance.

Next, an example of setting a condition for obtaining an image with high contrast is described.

Figures 29A, 29B:
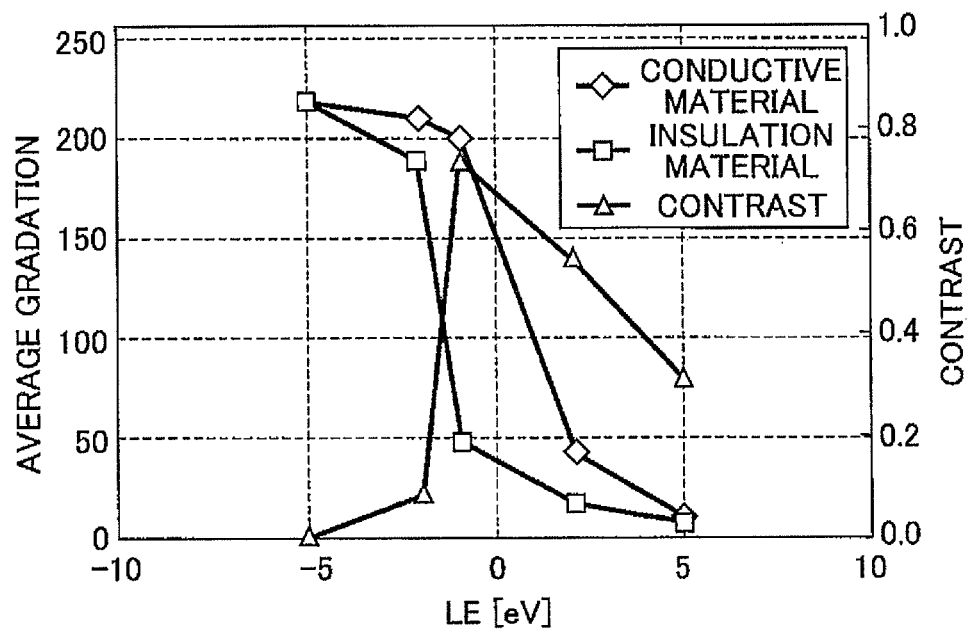
FIG. 29A is a table showing results of measurement of contrast when landing energy (LE) of the electron beam was changed to obtain a surface image of the contact plug structure illustrated in FIG. 28A in a production test.
FIG. 29B is a graph plotting the results of measurement shown in FIG. 29A.

FIGS. 29A and 29B are diagrams illustrating, by means of an example, results of studying the landing energy (LE) condition for obtaining an image with high contrast. In this example, a cathode voltage of the electron source 311 of the electron beam source 310 was set to −3,995 to −4,005 eV, and a voltage of the surface of the sample 200 was set to −4,000 eV. In addition, the transition region was optimized by setting the landing energy (LE) to −1 eV. Irradiation current density of the electron beam was set to 0.1 $mA/cm^2$, and a pixel size of the detector 400 was set to 50 nm/pix. An aperture diameter of the NA aperture 361 of the NA adjustment aperture plate 360 was set to $\phi$150 μm, and predose by the charged electron beam was set to 1 $mC/cm^2$.

FIG. 29A is a table showing results of measuring the contrast under the above-mentioned condition, in which the landing energy (LE) of the electron beam was changed to observe the contact plug having the cross sectional structure illustrated in FIG. 28A. FIG. 29B is a graph of the results of measurement shown in FIG. 29A.

In the graph illustrated in FIG. 29B, the horizontal axis represents the landing energy (LE), and the vertical axis represents the average gradation of the obtained image. The characteristic curve of the insulation region is illustrated as a curve connecting substantially-square symbols, and the characteristic curve of the conductive region is illustrated as a curve connecting rhombus symbols. In addition, results of calculating contrast from the average gradation of the insulation region and the conductive region are illustrated as a curve connecting triangle symbols. Note that, the contrast was calculated using Expression (1) described below.

Contrast=(Average Gradation of Conductive Material)−(Average Gradation of Insulation Material)/((Average Gradation of Conductive Material)+(Average Gradation of Insulation Material))    (1)

In FIGS. 29A and 29B, when the landing energy (LE) is −1 eV, the contrast is 0.8 as a highest value. The landing energy (LE) of −1 eV is in the transition region in which the mirror electron and the secondary electron are mixed as the electrons from the sample 200 as described above in relation to FIGS. 23A and 23B. In addition, as illustrated in FIGS. 23A and 23B, −5 eV is the landing energy (LE) of the mirror electron region, and 5 eV is the landing energy (LE) of the secondary electron region, in either of which regions the contrast is low.

It is understood that highest contrast is obtained when the landing energy (LE) is in the transition region.

Figures 30A, 30B:
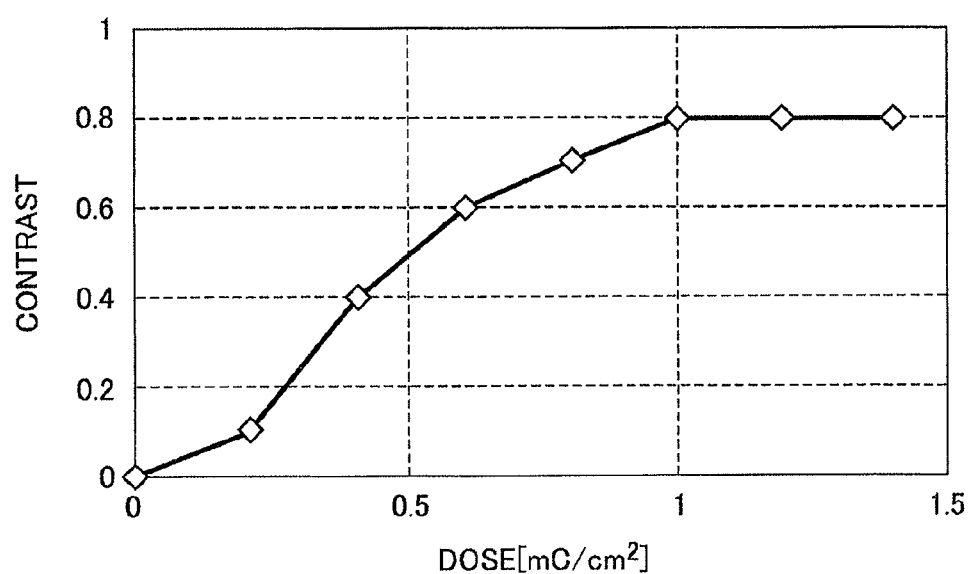
FIG. 30A is a table of results of measurement showing a relationship between a dose of a charged electron beam and contrast obtained by the production test.
FIG. 30B is a graph plotting the results of measurement shown in FIG. 30A.

FIGS. 30A and 30B are diagrams illustrating a correlation between dose and contrast of the charged electron beam obtained by a production test using the sample 200 illustrated in FIG. 28A. FIG. 30A is a table showing results of measuring the correlation between dose and contrast of the charged electron beam, and FIG. 30B is a graph of the results of measurement illustrated in FIG. 30A. Note that, various setting conditions of the electro-optical inspection apparatus and the sample to be measured are as described above, and description thereof is omitted. In addition, the contrast was calculated by Expression (1) described above from the average gradation of the insulation region and the conductive region in the image obtained by imaging the sample surface after irradiating the sample surface with the charged electron beam.

As illustrated in FIGS. 30A and 30B, as dose of the charged electron beam becomes higher, the contrast becomes higher, but the contrast is saturated at a certain dose. In the example illustrated in FIGS. 30A and 30B, the contrast remains to be 0.8 even if the sample surface before imaging is irradiated with the charged electron beam of 1 $mC/cm^2$ or higher in advance. In other words, when the dose of the charged electron beam is 1 $mC/cm^2$ or higher, the contrast is saturated. This means that when the dose of the charged electron beam is 1 $mC/cm^2$ or higher, electrification of the insulation region 203 of the sample surface is saturated to be a negative potential so that stable contrast can be obtained.

Figures 31A, 31B:
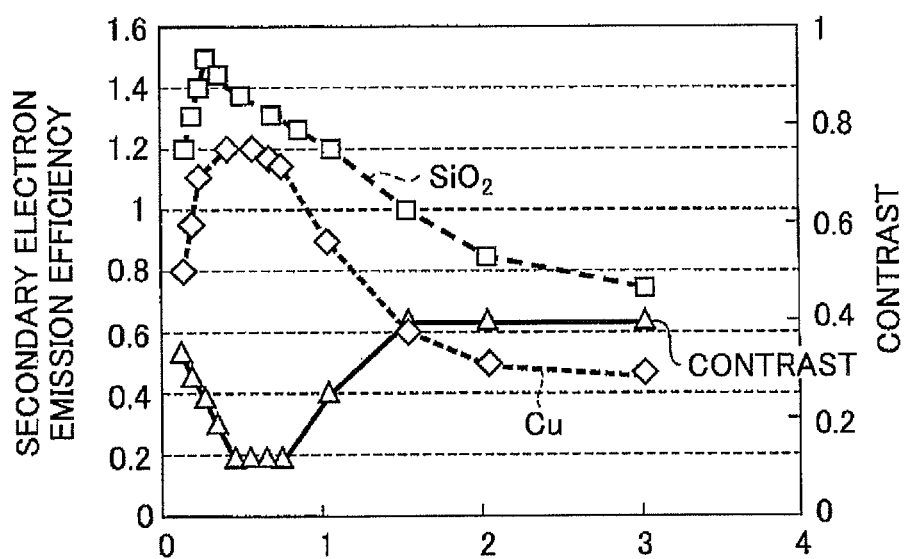
FIG. 31A is a table supplementarily showing that high contrast can be obtained by separating electrons (ec) having structural information of a conductive region from electrons (ei) having structural information of an insulation region, and is a table of results of measurement showing dependence on the landing energy (LE) of secondary electron emission efficiency and contrast of materials of the conductive region (Cu) and the insulation region ($SiO_2$) in a case where the electrons (ec) having the structural information of the conductive region were not separated from the electrons (ei) having the structural information of the insulation region obtained by the production test.
FIG. 31B is a graph plotting the results of measurement shown in FIG. 31A.

FIGS. 31A and 31B are diagrams supplementarily illustrating that high contrast can be obtained by separating the electrons ec having structural information of the conductive region from the electrons ei having structural information of the insulation region 203, and are diagrams illustrating values obtained by a production test using the sample 200 illustrated in FIG. 28A (however, Cu was used instead of W as the conductive material). FIG. 31A is a table showing dependence on the landing energy (LE) of the secondary electron emission efficiency and the contrast of materials of the conductive region (Cu) and the insulation region ($SiO_2$), in the case where the electrons ec having structural information of the conductive region are not separated from the electrons ei having structural information of the insulation region. In addition, FIG. 31B is a graph of this table.

When the electrons ec having structural information of the conductive region are not separated from the electrons ei having structural information of the insulation region, the obtained contrast depends on only the luminance difference corresponding to emission efficiency of the secondary electrons of each material. In other words, the position adjustment of the NA aperture 361 cannot obtain contrast occurring in the image obtained by enhancing electrons having structural information of either region.

According to the results illustrated in FIGS. 31A and 31B, when the electrons ec having structural information of the conductive region are not separated from the electrons ei having structural information of the insulation region, the obtained contrast is approximately 0.4 at most, which is conspicuously lower than the contrast (for example, 0.8 as described above) obtained when the electrons ec having structural information of the conductive region are separated from the electrons ei having structural information of the insulation region.

In other words, as in the present invention, by utilizing the mirror electrons generated in the transition region, the electrons ec having structural information of the conductive region are separated from the electrons ei having structural information of the insulation region, and then an image is obtained under the condition where the luminance of the conductive region is higher than the luminance of the insulation region, or an image is obtained under the opposite condition where the luminance of the insulation region is higher than the luminance of the conductive region. Thus, conspicuously higher contrast can be obtained than the image obtained by sample observation without separating the electrons ec having structural information of the conductive region from the electrons ei having structural information of the insulation region.

Figures 32A, 32B:
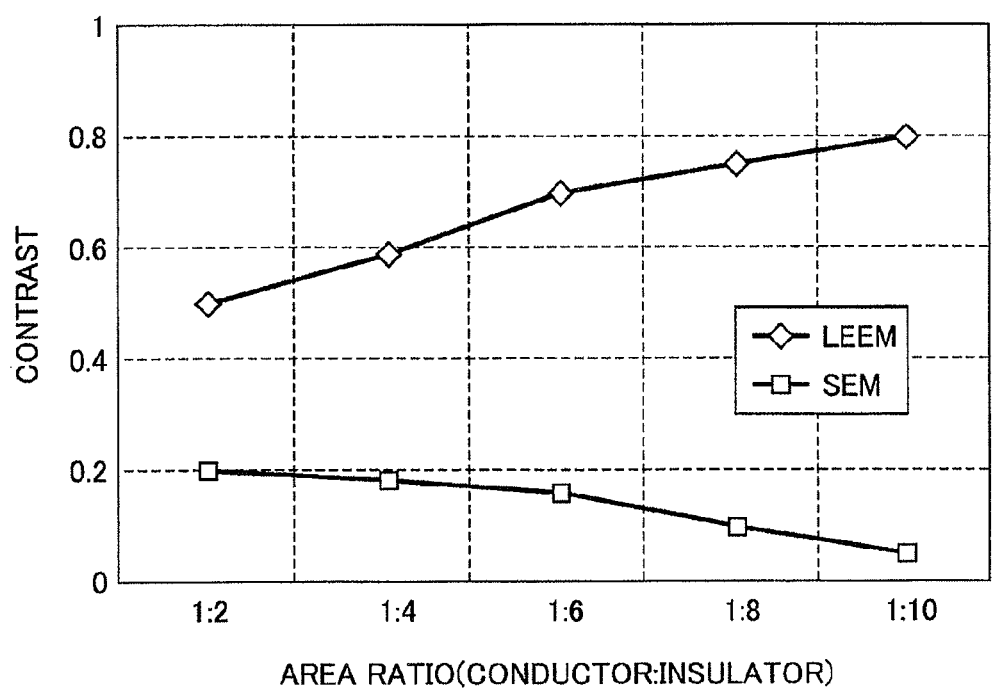
FIG. 32A is a table showing results of measurement of contrast when a ratio of area (pattern width) between the conductive region and the insulation region was changed on the sample surface by the production test, measured in an LEEM type and an SEM type using a low acceleration electron beam apparatus.
FIG. 32B is a graph plotting the results of measurement shown in FIG. 32A.

FIG. 32A is a diagram showing the contrast when the ratio of area (pattern width) between the conductive region 202 and the insulation region 203 of the surface of the sample 200 illustrated in FIG. 28A is changed, in comparison between results of measurement using the mapping projection type low acceleration electron beam apparatus as a low-energy electron microscopy (LEEM) type and results of measurement by a production test using the SEM type. FIG. 32B is a graph of the results of measurement shown in FIG. 32A. Note that, the results of measurement illustrated here are based on the image obtained under the condition where the luminance of the conductive region is higher than the luminance of the insulation region, and are obtained under the above-mentioned various setting conditions, and description thereof is omitted.

According to the LEEM type electro-optical inspection apparatus and sample observation method, mainly the conductive region 202 has high luminance as illustrated in FIG. 27B. Therefore, if the ratio of area of the conductive region 202 is decreased, the contrast increases because of little interference from the surroundings. On the other hand, in the SEM type (for example, the landing energy is approximately 1,000 eV), the insulation material 203 is brighter by the secondary electron emission coefficient of the material. If the ratio increases, a signal of the conductive region 202 is eliminated by spread of the orbit of the secondary electron, and hence the contrast becomes very low.

As illustrated in FIGS. 32A and 32B, when the ratio of area between the conductive region 202 and the insulation region 203 is small, a difference of contrast is relatively small. When the ratio of area between the conductive region and the insulation region is 1:2, the difference of contrast is controlled to be approximately 0.3. However, as the area of the insulation region 203 in the sample surface increases, contrast of the LEEM type is increased, but contrast of the conventional SEM type is decreased. When the ratio of area between the conductive region and the insulation region is 1:10, the difference of contrast reaches 0.75.

In this way, the LEEM type sample observation is effective particularly for observation of the sample 200 having a low ratio of the conductive material 202. In other words, for observation of the contact structure in which a ratio of the insulation material 203 in the sample surface is large, an image with high contrast can be obtained, and hence a large advantage can be obtained. In addition, on the contrary, when an image is obtained under the condition where the luminance of the insulation region is higher than the luminance of the conductive region, observation can be performed effectively also for the sample 200 having a low ratio of the insulation material 203 and a high ratio of the conductive material 202 in the sample surface.

Figure 33:
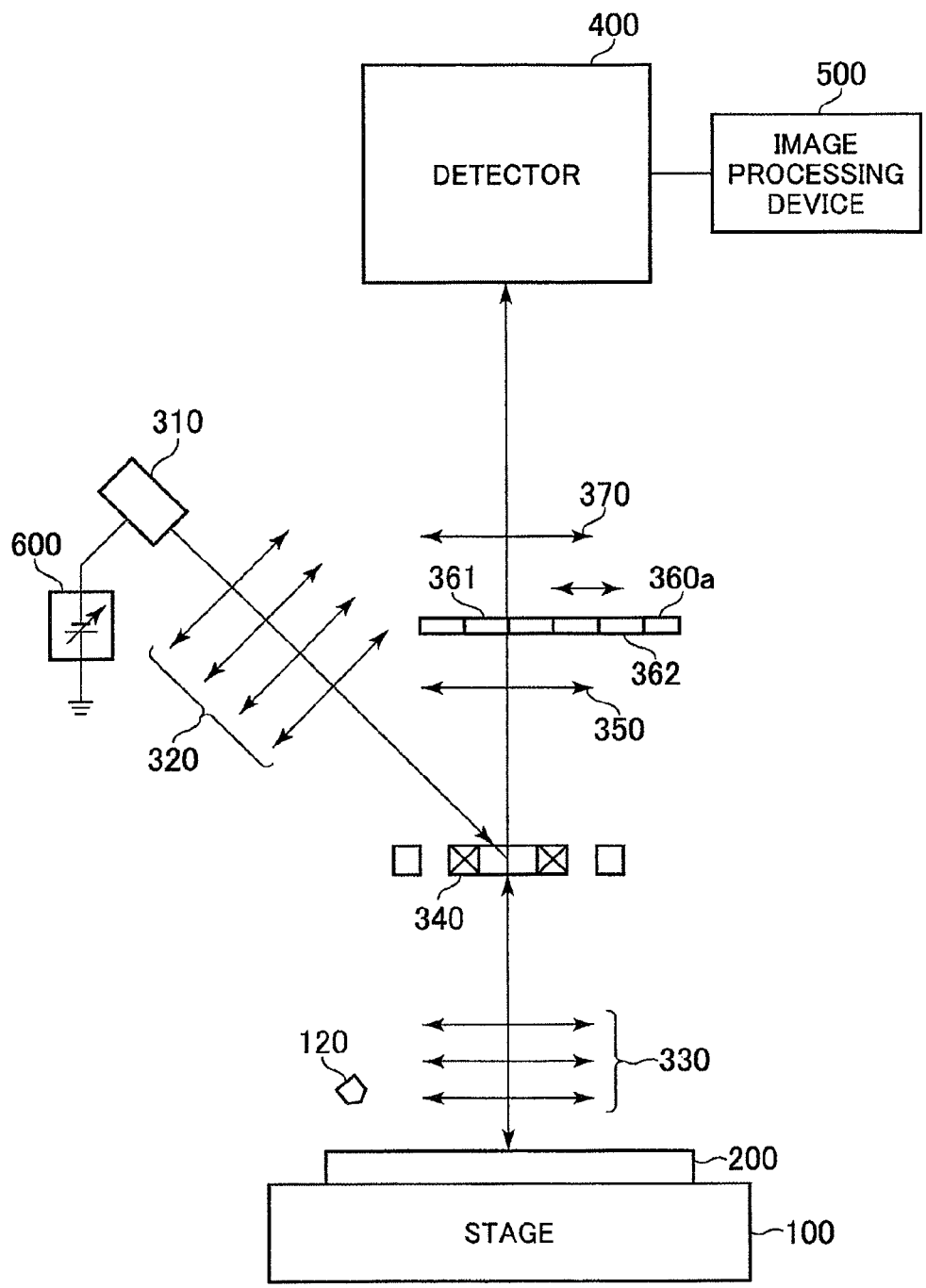
FIG. 33 is a diagram illustrating an example of a general structure of the electro-optical inspection apparatus according to the present invention.

FIG. 33 is a schematic diagram illustrating a second embodiment of the electro-optical inspection apparatus according to the present invention. The second embodiment has the same basic structure as the embodiment illustrated in FIG. 1. In other words, the electro-optical inspection apparatus illustrated in FIG. 33 is the mapping projection type electro-optical inspection apparatus, which includes the electron beam source 310, the primary lens 320, the condenser lens 330, the E×B deflector 340, the transfer lens 350, an NA adjustment aperture plate 360a, the projection lens 370, the detector 400, the image processing device 500, the stage 100, and the energy adjust/supply unit 600 in the same manner as the structure illustrated in FIG. 1. In the electro-optical inspection apparatus illustrated in FIG. 33, the same component as in the electro-optical inspection apparatus illustrated in FIG. 1 is denoted by the same numeral or symbol, and description thereof is omitted.

Although not illustrated in FIG. 33, the electro-optical inspection apparatus of the second embodiment may also include the charged electron beam irradiation means 700 (see FIG. 1) as necessary.

The electro-optical inspection apparatus illustrated in FIG. 33 is different in structure from the electro-optical inspection apparatus illustrated in FIG. 1 in that the NA adjustment aperture plate 360a includes a movable, multi-selectable NA adjusting aperture moving mechanism. In other words, the NA adjustment aperture plate 360a includes a plurality of types of NA apertures 361 and 362 having different aperture diameters, and the NA apertures 361 and 362 determining the numerical aperture (NA) can be adjusted in position (can be switched) in the plane by the NA aperture moving mechanism (not shown).

In the electro-optical inspection apparatus illustrated in FIG. 33, the NA adjustment aperture plate 360a has a plurality of NA apertures 361 and 362 having different sizes, and is moved in the horizontal direction so that the NA aperture 361 and the NA aperture 362 can be switched. Thus, because a desired numerical aperture (NA) can be set, an NA aperture of an optimal numerical aperture (NA) can be selected according to the type of the sample 200, the structure of the sample surface, or other various conditions so that a sample surface image with high material contrast can be obtained.

As described above, because the NA moving mechanism is disposed, signals from the sample surface can be selected effectively so that high contrast can be obtained. In this case, it is further effective to add the content and structure described above with reference to FIGS. 2 to 14. It is necessary to eliminate or reduce as much as possible dust or particles generated by the apparatus itself in ultrafine pattern inspection or foreign matter inspection according to the present invention. It is because that the inspection using this apparatus is usually performed after cleaning or before exposure of the sample, and if dust or particles adhere in this case, the dust or particles cause increase of defects in the exposure process or increase of defects in a process after the cleaning. Therefore, using the method and apparatus described above with reference to FIGS. 2 to 14, the adhesion of the dust or particles can be prevented as much as possible so that reliability of the apparatus can be maintained. In addition, if the apparatus includes the SEM mounted on the same chamber as illustrated in FIG. 2, the generated dust or particles can be confirmed promptly after the inspection. Therefore, efficiency of the process can be improved effectively. In addition, there is an effect of preventing adhesion of dust or particles that may be caused when a sample is put in another independent review apparatus.

Figure 34A:
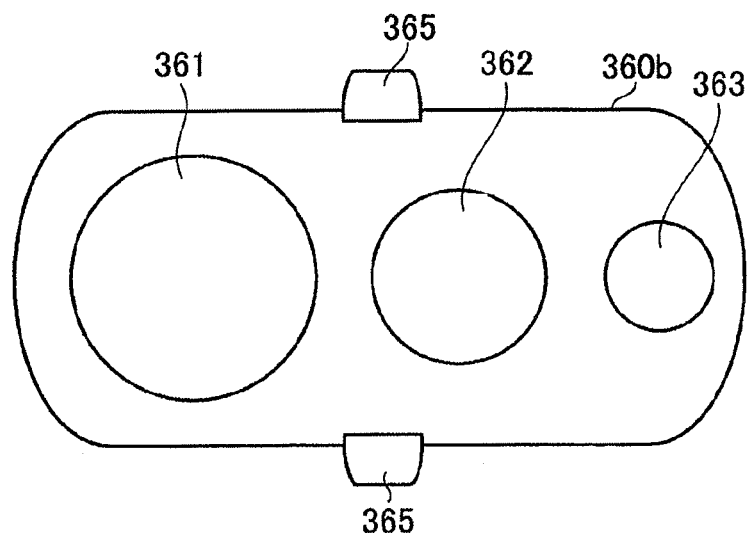
FIG. 34A is a diagram illustrating an embodiment of a movable type NA adjustment aperture plate used in the electro-optical inspection apparatus illustrated in FIG. 33.
Figure 34B:
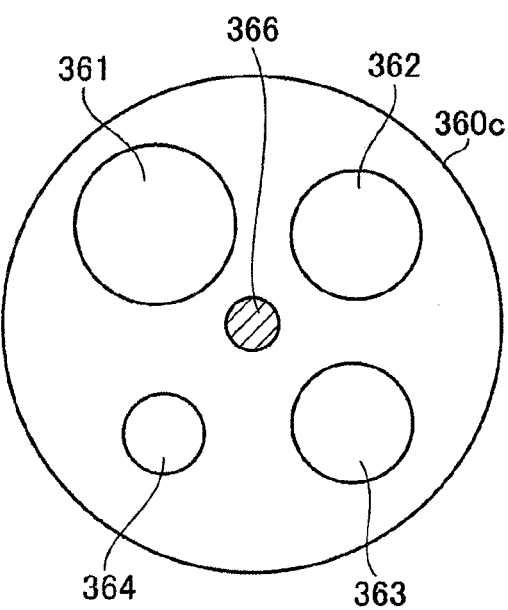
FIG. 34B is a diagram illustrating another embodiment of the movable type NA adjustment aperture plate used in the electro-optical inspection apparatus illustrated in FIG. 33.

FIGS. 34A and 34B are diagrams illustrating an example of a structure of the above-mentioned movable type NA adjustment aperture plate 360a. FIG. 34A is a top view of an example of the aperture plate that is constituted as a sliding type NA adjustment aperture plate 360b, and FIG. 34B is a top view of an example of the aperture plate that is constituted as a rotary type NA adjustment aperture plate 360c.

In FIG. 34A, the NA adjustment aperture plate 360b includes a plurality of NA apertures 361, 362, and 363 having different diameters. In addition, the NA adjustment aperture plate 360b includes a sliding type NA adjusting aperture moving mechanism 365 on both sides in the longitudinal direction. In this way, the plurality of NA apertures 361, 362, and 363 are formed in the rectangular plate-like NA adjustment aperture plate 360b, and the sliding type NA adjusting aperture moving mechanism 365 enables movement in the horizontal direction. Thus, an aperture diameter and an NA aperture position in the NA adjustment aperture plate 360b can be adjusted according to the use. It is possible to obtain an optimal sample surface image according to the type or the use of the sample 200.

The sliding type NA adjusting aperture moving mechanism 365 may have, for example, a structure in which the NA adjustment aperture plate 360b is sandwiched vertically by rail-like members, and a drive mechanism such as a linear motor is disposed, or a structure in which the NA adjustment aperture plate 360b is sandwiched by rotary type rail members, and a rotary type motor rotates the rotary type rail members. The sliding type NA adjusting aperture moving mechanism 365 may have various forms according to the use.

The NA adjustment aperture plate 360c illustrated in FIG. 34B has a plurality of NA apertures 361 to 364 in the disc-like plate with a rotary type NA adjusting aperture moving mechanism 366 disposed at the center thereof. The NA apertures 361 to 364 have different diameters. The NA aperture 361 has a largest diameter, the NA aperture 362 has a smaller diameter than the NA aperture 361, the NA aperture 363 has a smaller diameter than the NA aperture 362, and the NA aperture 364 has a smallest diameter The rotary type NA adjusting aperture moving mechanism 366 uses a rotary type motor or the like as a drive mechanism and may have a structure for switching the aperture diameter of the NA adjustment aperture plate 360c by rotation.

According to the electro-optical inspection apparatus having the structure illustrated in FIGS. 33, 34A, and 34B, the NA adjustment aperture plates 360a to 360c are structured to be selectable among the plurality of NA apertures 361 to 364 and the position can be adjusted so as to support uses and types of the sample 200 flexibly. Thus, an optimal contrast image can be obtained under various conditions. Note that, the number of the NA apertures is not limited to that of the figure, and any number of apertures may be provided.

Figure 35:
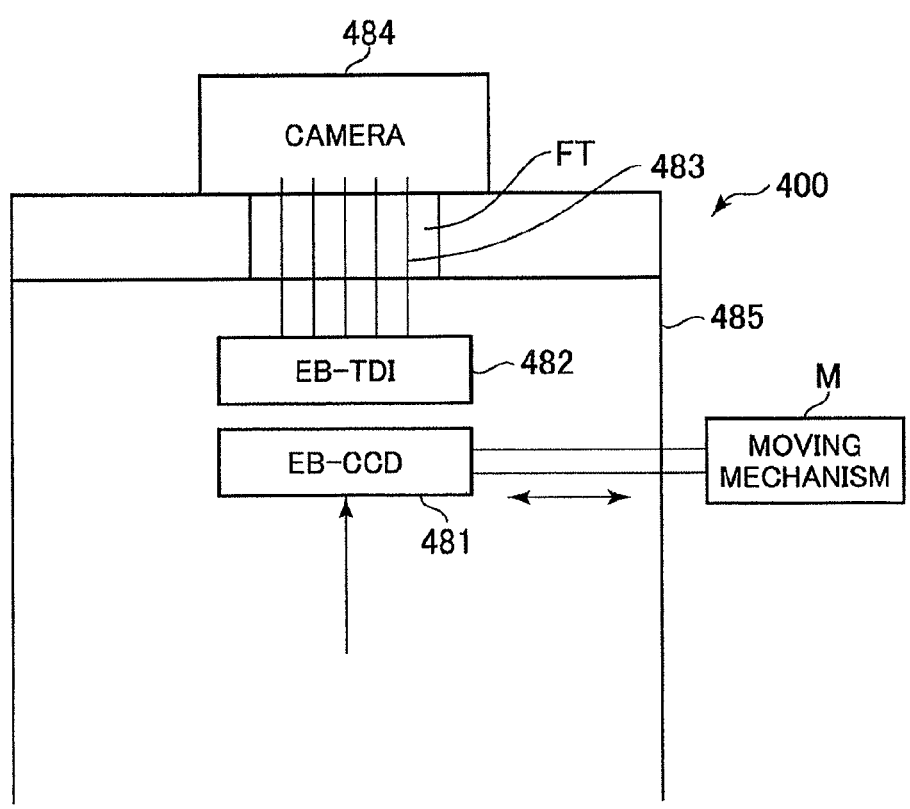
FIG. 35 is a diagram illustrating an example of a structure of a detector that is suitable for high resolution observation according to the present invention.

FIG. 35 is a diagram illustrating an example of a structure of the detector 400 of the electro-optical inspection apparatus illustrated in FIGS. 1 and 33, which is suitable for high resolution observation. When an electron direct incident type EB-CCD or EB-TDI is used as the detector 400, compared with the conventional MCP, fiber optical plate (FOP), fluorescent screen, and TDI, an image having three times higher contrast than the conventional one can be obtained because no deterioration occurs due to MCP and FOP transmission. In particular, when light from the bottom of the hole of the contact structure (202 in FIG. 26A) is detected, the spot (dot) becomes blurred in the conventional detector. In contrast, according to the detector 400 illustrated in FIG. 35, high contrast can be obtained. In addition, because no deterioration of gain occurs due to use of MCP, unevenness of luminance on the effective screen does not occur so that the exchange period is long. Therefore, it is possible to reduce cost and time for maintaining the detector 400. In this way, the EB-CCD and the EB-TDI are preferred for obtaining a high contrast image and in view of durability.

With reference to FIG. 35, an example of the form of using the EB-CCD and the EB-TDI is described. The detector 400 illustrated as an example in FIG. 35 has a structure in which an EB-TDI 482 and an EB-CCD 481 are switched so as to be exchanged according to the use. The EB-CCD 481 and the EB-TDI 482 are electron sensors for receiving an electron beam, and the electrons enter the detection surface directly. The EB-CCD 481 is used for optical axis adjustment of the electron beam and for adjusting and optimizing imaging conditions. On the other hand, when the EB-TDI 482 is used, the EB-CCD 481 is moved away from the optical axis by a moving mechanism M, and imaging is performed by the EB-TDI 482 by using conditions determined when the EB-CCD 481 is used or by referring to the conditions so that the sample surface is observed.

As described above, the detector 400 having the above-mentioned structure can obtain an image of a semiconductor wafer by the EB-TDI 482 using the electro-optical conditions determined when the EB-CCD 481 is used or referring to the conditions. It is also possible to evaluate a defect of the pattern by taking a review image using the EB-CCD 481 after inspection of the sample surface by the EB-TDI 482. In this case, the EB-CCD 481 can accumulate images so that noise can be reduced. Thus, it is possible to take a review image of a defect detection part with a high S/N ratio. In this case, it is further effective to use the EB-CCD 481 having a smaller pixel than the EB-TDI 482. In other words, it is possible to take an image with a large number of pixels with respect to a size of the signal enlarged by a mapping projection optical system. Thus, an image for inspection or classification/determination of the type of the defect or the like can be taken with higher resolution.

Note that, the EB-TDI 482 has a rectangular shape, for example, in which pixels are arranged in a two-dimensional manner so as to receive the electrons directly for forming an electron image. A pixel size thereof is 12 to 16 μm, for example. On the other hand, a pixel size of the EB-CCD 481 is 6 to 8 μm, for example.

In addition, the EB-TDI 482 is formed in a shape of a package 485. The package 485 itself works as a feed-through, and pins 483 of the package are connected to a camera 484 on the air side.

Adopting the structure illustrated in FIG. 35, it is possible to eliminate drawbacks such as an optical conversion loss due to the FOP, optical glass for hermetic seal, an optical lens, or the like, aberration and distortion in optical transmission, deterioration of image resolution due to the aberration and distortion, a detection failure, high cost, and a large scale.

As described above, as in the present invention, by utilizing the mirror electrons generated in the transition region, the electrons ec having structural information of the conductive region are separated from the electrons ei having structural information of the insulation region, and then an image is obtained under the condition where the luminance of the conductive region is higher than the luminance of the insulation region, or an image is obtained under the opposite condition where the luminance of the insulation region is higher than the luminance of the conductive region. Thus, conspicuously higher contrast can be obtained than the image obtained by sample observation without separating the electrons ec having structural information of the conductive region from the electrons ei having structural information of the insulation region.

In addition, it is very effective to use the method and apparatus described above with reference to FIG. 33 and further use the method and apparatus described above with reference to FIG. 35. In the method of using the EB-CCD or the EB-TDI, the deterioration factor due to the detector can be reduced significantly. Therefore, it is possible to obtain an image with little deterioration of contrast and with high contrast. Therefore, a variation of contrast of the image due to a difference of the NA position can be clearly known with high accuracy when forming conditions for obtaining an image having high contrast by the NA position adjustment or performing inspection. Therefore, the NA position adjustment can be performed with high accuracy. Further, because a high contrast image can be obtained, inspection sensitivity in the pattern inspection or the foreign matter inspection can be increased. Therefore, in the apparatus including the SEM in the same chamber as illustrated in FIG. 2, it is possible to perform review of a finer defect in short time even if the defect review is performed based on the inspection result. In addition, it is necessary to prevent dust or particles from adhering by using the apparatus, and it is very effective to use the method and apparatus illustrated in FIGS. 3 to 14 as described above with reference to FIG. 33. The adhesion amount of dust or particles increases only by introducing the sample to another apparatus for review or the like. If the same chamber is used, the number of times of conveying the sample and the number of times of passing through the load lock can be reduced, and operations of the stage can be reduced. Further, on the same stage, the position shift in the review is small (⅕ to 1/20), and a period of time for searching for a defect position or the number of times of changing the field of view (FOV) can be reduced.

However, according to the study performed by the inventors of the present invention, it has been found that if the insulation region and the conductive region are formed on the sample to be observed, and if it is necessary to detect both a short defect and an open defect on the sample surface with high accuracy, there could be a case where one type of defect can be detected easily while the other type of defect can be hardly detected only by obtaining an image under the condition where the luminance of the conductive region is higher than the luminance of the insulation region, or obtaining an image under the opposite condition where the luminance of the insulation region is higher than the luminance of the conductive region.

Specifically, if an image is obtained under the condition where the luminance of the conductive region is higher than the luminance of the insulation region, there is a case where a short defect can be detected easily, but an open defect can be hardly detected. On the contrary, if an image is obtained under the condition where the luminance of the insulation region is higher than the luminance of the conductive region, an open defect can be detected easily, but a short defect can be hardly detected.

Based on this knowledge, according to the sample observation method of the present invention, an image is obtained under the condition where the luminance of the conductive region is higher than the luminance of the insulation region, and another image is obtained under the condition where the luminance of the insulation region is higher than the luminance of the conductive region. Then, based on those images, a short defect and an open defect on the sample surface are both detected with high accuracy.

In other words, in the sample observation method according to the present invention, the sample surface including the insulation region and the conductive region is irradiated with the imaging electron beam having landing energy (LE) adjusted to the transition region in which the electrons having structural information of the sample surface include both the mirror electrons and the secondary electrons. Then, images of the sample surface irradiated with the imaging electron beam are taken under the condition where the luminance of the conductive region is higher than the luminance of the insulation region (Condition A) and under the condition where the luminance of the insulation region is higher than the luminance of the conductive region (Condition B). Note that, those images may be taken first under Condition A and then under Condition B, or first under Condition B and then under Condition A.

Figure 36A:
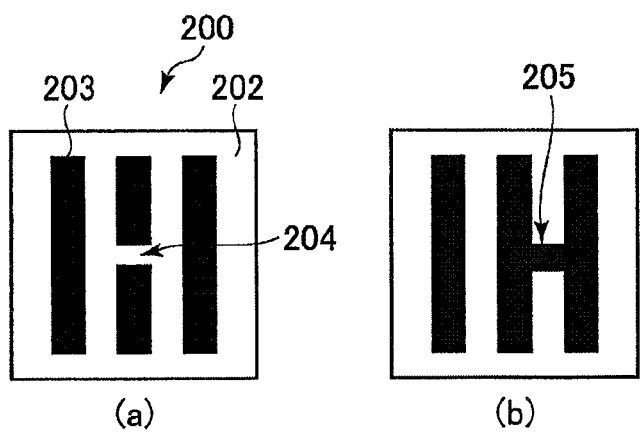
FIG. 36A is a schematic diagram illustrating an image obtained in a condition where a luminance of the conductive region is higher than a luminance of the insulation region (Condition A), and conceptually illustrating manners in which the short defect and the open defect appear.
Figure 36B:
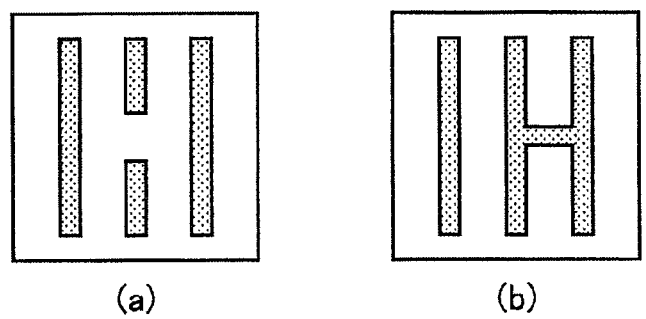
FIG. 36B is a schematic diagram illustrating an image obtained in a condition where the luminance of the insulation region is higher than the luminance of the conductive region (Condition B), and conceptually illustrating manners in which the short defect and the open defect appear.
Figure 36C:
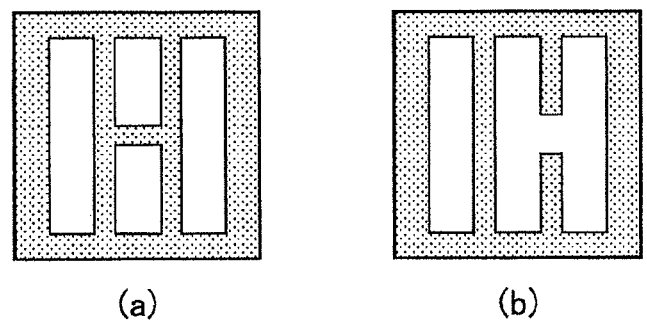
FIG. 36C is a diagram schematically illustrating an image obtained by reversing contrast in the condition where the luminance of the insulation region is higher than the luminance of the conductive region (Condition B), and conceptually illustrating manners in which the short defect and the open defect appear.

FIGS. 36A to 36C are diagrams conceptually illustrating how the short defect and the open defect appear in the image obtained under the condition where the luminance of the conductive region is higher than the luminance of the insulation region (Condition A) and the image obtained under the condition where the luminance of the insulation region is higher than the luminance of the conductive region (Condition B). Here, the short defect is a state where there is a short in a part of the region formed in line of conductive material such as W or Cu (conductive region), and the open defect is a state where there is a break (open) in a part of the region formed in line of conductive material (conductive region).

Specifically, Condition A and Condition B are realized by position adjustment of the NA aperture plate 361 (see FIG. 1) so that many electrons ec having structural information of the conductive region are only guided to the detector 400 or many electrons ei having structural information of the insulation region are only guided to the detector 400.

FIG. 36A is a diagram schematically illustrating the surface of the sample 200 including the conductive material region (conductive region) 202 made of W, Cu, or the like and the insulation material region (insulation region) 203 made of $SiO_2$ or the like. Part (*a*) of FIG. 36A illustrates a state where there is a short defect 204 in a part of the conductive material formed in line, and part (*b*) illustrates a state where there is an open defect 205 in a part of the conductive material formed in line.

In addition, FIG. 36B is a diagram schematically illustrating images of the sample surface irradiated by the imaging electron beam, which are obtained under the condition where the luminance of the conductive region is higher than the luminance of the insulation region (Condition A) by irradiating the above-mentioned sample surface with the imaging electron beam having landing energy (LE) adjusted to the transition region in which the electrons having structural information of the sample surface include both the mirror electrons and the secondary electrons. Parts (*a*) and (*b*) of FIG. 36B correspond to parts (*a*) and (*b*) of FIG. 36A, respectively.

FIG. 36C is a diagram schematically illustrating images of the sample surface obtained under the opposite imaging condition where the luminance of the insulation region is higher than the luminance of the conductive region (Condition B) so that contrast is reversed. Parts (*a*) and (*b*) of FIG. 36C correspond to parts (*a*) and (*b*) of FIG. 36A, respectively.

With reference to FIG. 36B, in the images obtained under the condition where the luminance of the conductive region is higher than the luminance of the insulation region (Condition A), the luminance of the conductive region is relatively high, and hence the short defect is enhanced and is expressed in a larger size than the actual defect size (see part (*a*) of FIG. 36B). On the contrary, because the luminance of the insulation region is relatively low, the open defect is expressed in a smaller size than the actual defect size (see part (*b*) of FIG. 36B).

On the other hand, with reference to FIG. 36C, in the images obtained under the condition where the luminance of the insulation region is higher than the luminance of the conductive region (Condition B), the luminance of the insulation region is relatively high, and hence the short defect is expressed in a smaller size than the actual defect size (see part (*a*) of FIG. 36C). On the contrary, because the luminance of the conductive region is relatively low, the open defect is expressed in a larger size than the actual defect size (see part (*b*) of FIG. 36C).

The same phenomenon occurs also in a case where the defect is incomplete.

Figure 37A:
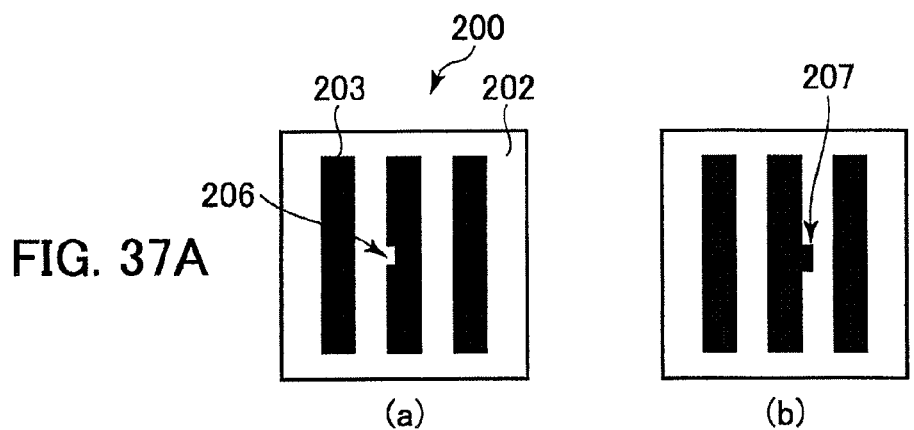
FIG. 37A is a schematic diagram illustrating an image obtained in the condition where the luminance of the conductive region is higher than the luminance of the insulation region (Condition A), and conceptually illustrating manners in which the short defect and the open defect appear.

Part (*a*) of FIG. 37A illustrates a state where there is an incomplete short defect 206 in a part of the conductive material formed in line, and part (*b*) of FIG. 37A illustrates a state where there is an incomplete open defect 207 in a part of the insulation material formed in line.

Figure 37B:
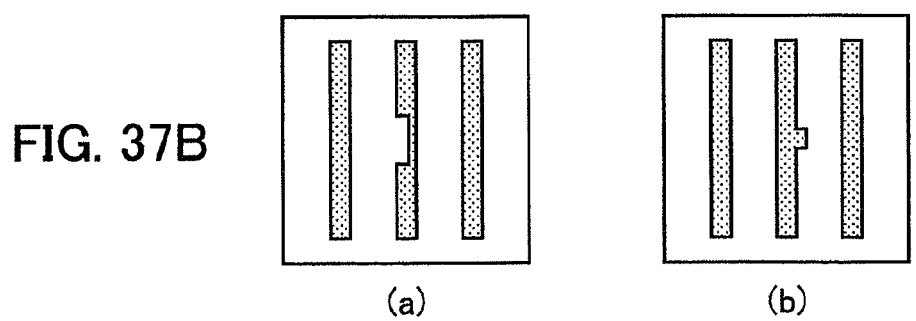
FIG. 37B is a schematic diagram illustrating an image obtained in the condition where the luminance of the insulation region is higher than the luminance of the conductive region (Condition B), and conceptually illustrating manners in which the short defect and the open defect appear.

In addition, FIG. 37B is a diagram schematically illustrating images of the sample surface obtained under the above-mentioned irradiation condition of the imaging electron beam where the luminance of the conductive region is higher than the luminance of the insulation region (Condition A). Parts (*a*) and (*b*) of FIG. 37B correspond to parts (*a*) and (*b*) of FIG. 37A, respectively.

Figure 37C:
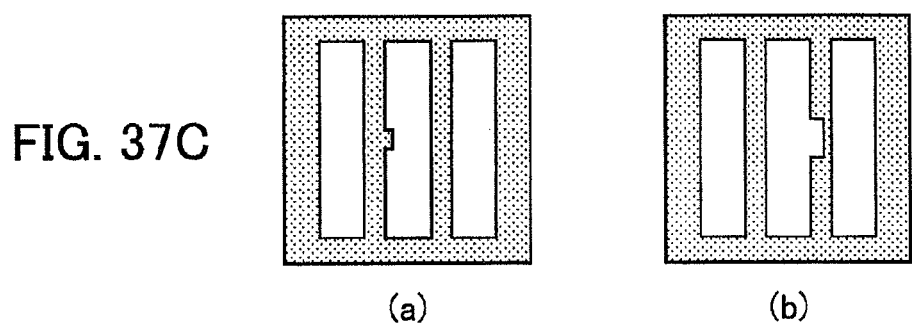
FIG. 37C is a diagram schematically illustrating an image obtained by reversing contrast in the condition where the luminance of the insulation region is higher than the luminance of the conductive region (Condition B), and conceptually illustrating how the short defect and the open defect appear.

In addition, FIG. 37C is a diagram schematically illustrating images of the sample surface obtained under the opposite imaging condition where the luminance of the insulation region is higher than the luminance of the conductive region (Condition B) so that contrast is reversed. Parts (*a*) and (*b*) of FIG. 37C correspond to parts (*a*) and (*b*) of FIG. 37A, respectively.

With reference to FIG. 37B, in the images obtained under the condition where the luminance of the conductive region is higher than the luminance of the insulation region (Condition A), the luminance of the conductive region is relatively high, and hence the incomplete short defect is enhanced and is expressed in a larger size than the actual defect size (see part (*a*) of FIG. 37B). On the contrary, because the luminance of the insulation region is relatively low, the incomplete open defect is expressed in a smaller size than the actual defect size (see part (*b*) of FIG. 37B).

On the other hand, with reference to FIG. 37C, in the images obtained under the condition where the luminance of the insulation region is higher than the luminance of the conductive region (Condition B), the luminance of the insulation region is relatively high, and hence the incomplete short defect is expressed in a smaller size than the actual defect size (see part (*a*) of FIG. 37C). On the contrary, because the luminance of the conductive region is relatively low, the incomplete open defect is expressed in a larger size than the actual defect size (see part (*b*) of FIG. 37B).

The reason why this phenomenon occurs is considered as follows. Specifically, when an image is obtained under the condition where the luminance of the conductive region is higher than the luminance of the insulation region (Condition A), electrons emitted from the conductive material in the vicinity of a short defect or an open defect are diffused, and due to the action, the short defect part is imaged to be wider, while the open defect part is imaged to be narrower. On the contrary, when an image is obtained under the condition where the luminance of the insulation region is higher than the luminance of the conductive region (Condition B), electrons emitted from a short defect or an open defect are diffused, and due to the action, the short defect part is imaged to be narrower, while the open defect part is imaged to be wider.

In this way, an image is obtained under the condition where the luminance of the conductive region is higher than the luminance of the insulation region, and another image is obtained under the condition where the luminance of the insulation region is higher than the luminance of the conductive region. Thus, based on the images having reverse contrast, both a short defect and an open defect on the sample surface can be detected with high accuracy.

Hereinafter, description is given based on a specific example.

The sample used in this example has a pattern of line and space (L&S) similarly to that illustrated in FIGS. 36A to 36C and 37A to 37C. On the surface of the sample, there are formed a region (conductive region) 202 of Cu as conductive material and a region (insulation region) 203 of $SiO_2$ as insulation material, and a width of line and a width of space are both 43 nm.

Figures 38A, 38B:
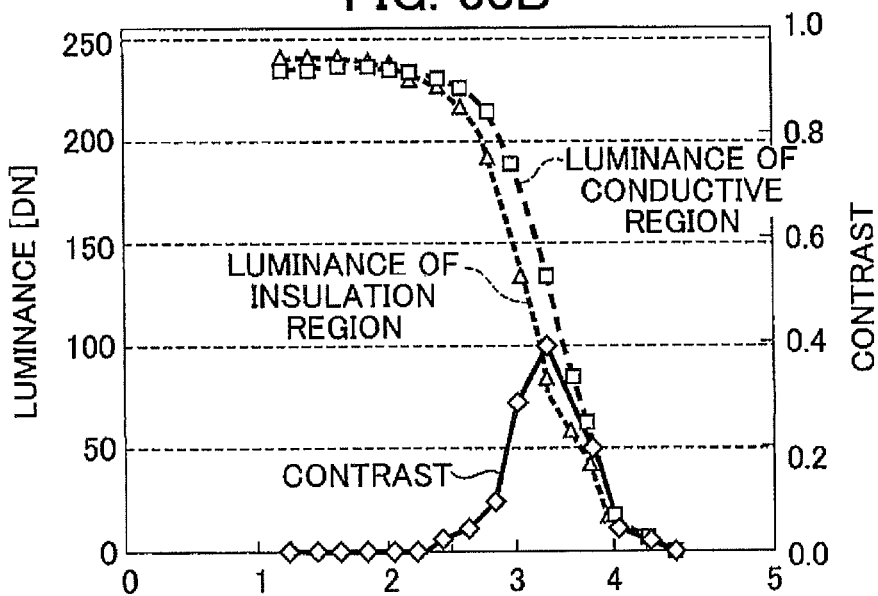
FIG. 38A is a table showing results of measurement performed for determining an optimal value of landing energy (LE) of the imaging electron beam irradiating the sample surface in the production test.
FIG. 38B is a graph plotting the results of measurement shown in FIG. 38A.

FIGS. 38A and 38B show results of experiment performed for determining an optimal value of the landing energy (LE) of the imaging electron beam that irradiates the sample surface. FIG. 38A is a table showing the landing energy (LE), luminance values [DN] of the conductive material and the insulation material, and the contrast. In addition, FIG. 38B is a graph of this table, in which the horizontal axis represents the landing energy (LE), the left vertical axis represents the luminance values [DN] of the conductive material and the insulation material, and the right vertical axis represents the contrast. Note that, imaging in this case was performed by adjusting the center of the NA aperture 361 of the NA adjustment aperture plate 360 (see FIG. 1) to substantially the same position as the center of orbit of the electron ec emitted from the conductive region 202. Note that, [DN] indicating gradation represents "Digital Number", which expresses black and white gradation with 8 bits and is pixel information in which DN=0 means black, while DN=255 means white.

In this example, when the landing energy (LE) is 3.2 eV, the highest contrast (0.41) is obtained.

Figures 39A, 39B:
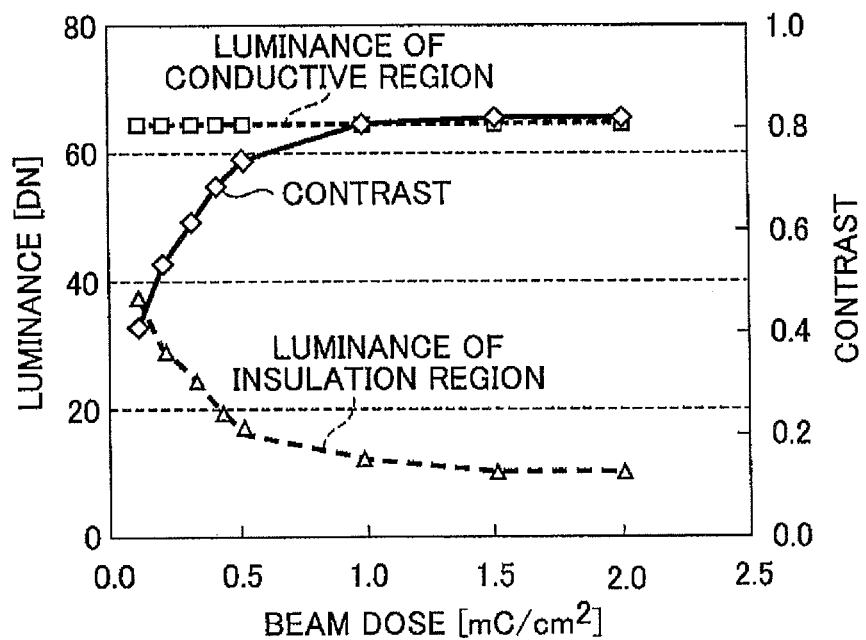
FIG. 39A is a table showing results of measurement performed for determining an optimal value of dose of the charged electron beam irradiating the sample surface in the production test.
FIG. 39B is a graph plotting the results of measurement shown in FIG. 39A.

FIGS. 39A and 39B show results of experiment performed for determining an optimal value of dose of the charged electron beam that irradiates the sample surface. FIG. 39A is a table showing beam dose [$mC/cm^2$], luminance values [DN] of the conductive material and the insulation material, and the contrast. In addition, FIG. 39B is a graph of this table, in which the horizontal axis represents the beam dose [$mC/cm^2$], the left vertical axis represents the luminance values [DN] of the conductive material and the insulation material, and the right vertical axis represents the contrast. Imaging in this case was also performed by adjusting the center of the NA aperture 361 of the NA aperture plate 360 to substantially the same position as the center of orbit of the electron ec emitted from the conductive region 202. The beam dose is defined as a product of beam current density and irradiation time.

In this example, the contrast increases along with the dose, but the contrast is saturated at a dose of approximately 2 $mC/cm^2$. In other words, it is understood that it is sufficient if the dose of the charged electron beam to be irradiated for imaging with high contrast is approximately 2 mC/cm².

In the present invention, the electrons ec having structural information of the conductive region are separated from the electrons ei having structural information of the insulation region so that high contrast is obtained. Thus, a short defect and an open defect are both detected with high sensitivity and high accuracy. Such separation between the electrons ec having structural information of the conductive region and the electrons ei having structural information of the insulation region can be performed by position adjustment of the NA aperture. Therefore, in the present invention, distributions of electrons from the conductive region and the insulation region of the sample surface are directly observed in an NA imaging mode, and hence the position adjustment of the NA aperture can be performed with high accuracy. Hereinafter, an example of a specific procedure is described.

The projection lens 370 disposed between the NA adjustment aperture plate 360 and the detector 400 was set to a predetermined voltage of 5,500V, and a positional relationship at the position of the NA adjustment aperture plate 360 between distributions of the electrons ec having surface structural information of the conductive region 202 and the electrons ei having surface structural information of the insulation region 203 was checked in the NA imaging mode. Specifically, the dose of the charged electron beam was changed so as to check how much the change of the dose caused a shift of the distribution state (center of orbit) of the electrons ei having surface structural information of the insulation region 203 from the distribution state (center of orbit) of the electrons ec having surface structural information of the conductive region 202.

Figures 40A, 40B:
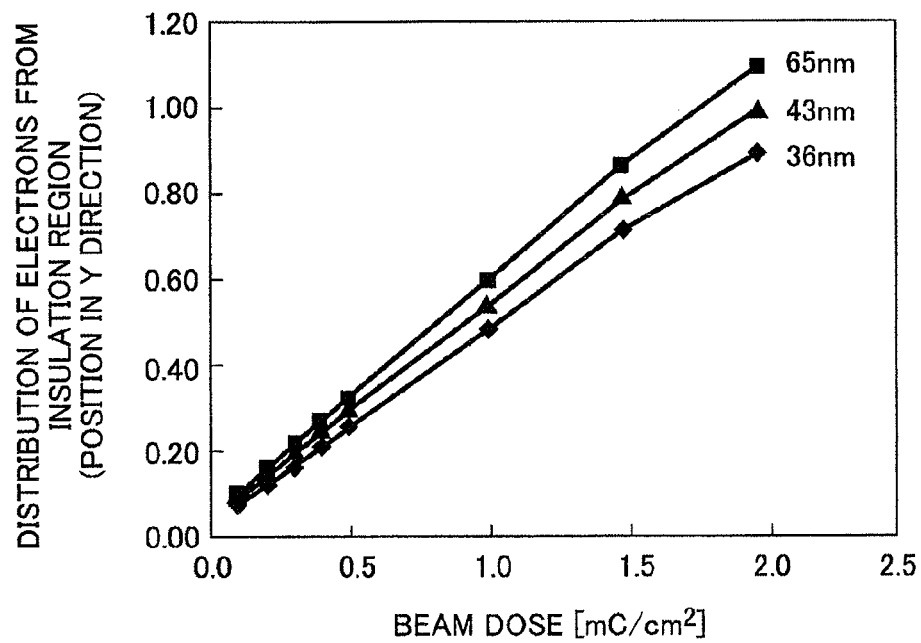
FIG. 40A is a table showing results of measurement of position confirmation of electron distribution by an NA imaging mode, and showing a beam dose [$mC/cm^2$] and a shift of a distribution state of the electron (ei) having surface structural information of the insulation material when the charged electron beam of the dose irradiates, namely a shift from a distribution state of the electron (ec) having surface structural information of the conductive material.
FIG. 40B is a graph plotting the results of measurement shown in FIG. 40A.

FIGS. 40A and 40B are diagrams illustrating results of position confirmation of the electron distribution in the NA imaging mode. FIG. 40A is a table showing the beam dose [mC/cm²] and a shift of a distribution state of the electrons ei having surface structural information of the insulation material 203, namely a shift from a distribution state of the electrons ec having surface structural information of the conductive material 202, when being irradiated with the charged electron beam of the dose. In addition, FIG. 40B is a graph of this table, in which the horizontal axis represents the beam dose [mC/cm²], and the left vertical axis represents a shift of the distribution state of the electrons ei having surface structural information of the insulation material 203. Here, the shift direction was set to the Y direction. Note that, the shift of the distribution state of the electrons ei indicated in the left vertical axis is a normalized value. The normalization of the shift was performed by setting 0 as the position of the NA aperture transmitting the electrons from the conductive material, and setting 1 as the position of the NA aperture of the condition where the contrast was reversed. In addition, based on the results of the experiment for optimizing the dose of the charged electron beam described above, an upper limit value of the irradiation amount of the charged electron beam was set to 2 mC/cm². Further, as a reference, the same experiment was performed on a sample having an L&S width of 35 nm and a sample having an L&S width of 65 nm.

According to the results illustrated in FIGS. 40A and 40B, the dose of the charged electron beam is substantially proportional to a shift of the distribution state of the electrons ei having surface structural information of the insulation region 203. Therefore, considering the results of the experiment for optimizing the dose of the charged electron beam, it is understood that in order to separate the electrons ec having structural information of the conductive region from the electrons ei having structural information of the insulation region so as to obtain high contrast, the irradiation amount of the charged electron beam should be set to approximately 2 mC/cm², and further the NA aperture 361 of the NA adjustment aperture plate 360 should be shifted in the Y direction by a predetermined amount, so that imaging is performed under the condition where the electrons ec having structural information of the conductive region 202 are selectively guided to the detector 400 and under the condition where the electrons ei having structural information of the insulation region 203 are selectively guided to the detector 400.

In addition, according to the results illustrated in FIGS. 40A and 40B, in the sample having a large wiring width (L&S width), a variation of the substrate potential (ΔV) becomes large because of a large volume of the insulation region. Therefore, the shift of the distribution of the electrons ei having surface structural information of the insulation material 203 is also large. On the contrary, as the wiring width (L&S width) decreases, the volume of the insulation material decreases. Therefore, a variation of the substrate potential (ΔV) becomes small so that high contrast can be hardly obtained.

As described above, through the irradiation with the charged electron beam, the electrons ec having structural information of the conductive region can be easily separated from the electrons ei having structural information of the insulation region. As a result, high contrast can be obtained easily. This is because the irradiation with the charged electron beam causes a variation of the substrate potential (ΔV) so that the distribution of the electrons ei having surface structural information of the insulation material is shifted. This means that the shift of the distribution of the electrons ei having surface structural information of the insulation material can be estimated from the variation of the substrate potential (ΔV).

Figures 41A, 41B:
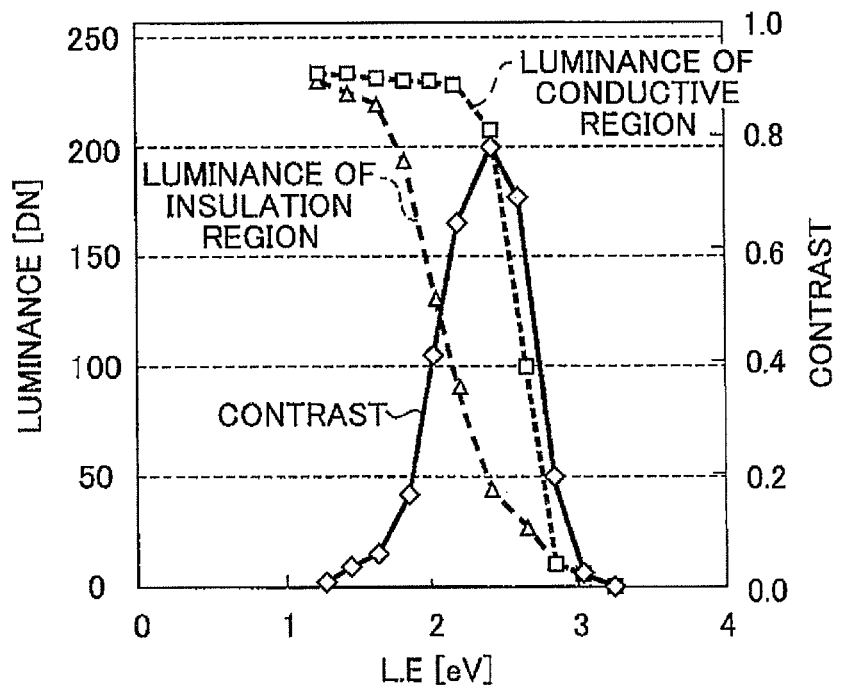
FIG. 41A is a table showing results of measurement performed for determining an optimal value of landing energy (LE) of the imaging electron beam irradiating the sample surface in an electrified state, and showing the landing energy (LE), a luminance [DN] of each of the conductive material and the insulation material, and contrast.
FIG. 41B is a graph plotting the results of measurement shown in FIG. 41A.

FIGS. 41A and 41B show results of experiment performed for determining an optimal value of the landing energy (LE) of the imaging electron beam irradiated to the sample surface in an electrified state. FIG. 41A is a table showing the landing energy (LE), luminance values [DN] of the conductive material and the insulation material, and the contrast. In addition, FIG. 41B is a graph of this table, in which the horizontal axis represents the landing energy (LE), the left vertical axis represents the luminance values [DN] of the conductive material and the insulation material, and the right vertical axis represents the contrast. Note that, imaging in this case was also performed by adjusting the center of the NA aperture 361 of the NA adjustment aperture plate 360 to substantially the same position as the center of orbit of the electron ec emitted from the conductive region 202.

Comparing FIG. 41B with FIG. 38B, it is understood that higher contrast (7.8) was obtained in the case where the sample surface in the electrified state was irradiated with the imaging electron beam (see FIG. 41B) than in the case where the sample surface in a non-electrified state was irradiated with the imaging electron beam (see FIG. 38B). The landing energy (LE) corresponding to this is shifted to the low energy side. This is because, as described above, the substrate potential changed (by approximately 1V) because the insulation region of the sample surface was electrified, and as a result, the center of orbit of the electron ei omitted from the insulation region 203 was conspicuously shifted from the center of orbit of the electron ec emitted from the electrified region 202, and hence the degree of separation between the electrons ec having structural information of the conductive region and the electrons ei having structural information of the insulation region was increased.

Therefore, it is possible to estimate the shift of the center of orbit of the electron ei emitted from the insulation region 203 by knowing in advance how the optimal landing energy (LE) varies due to the electrified state (substrate potential) of the sample surface. In other words, the shift of the center position of orbit of the electron ei can be estimated from the substrate potential. Specifically, a shift of the substrate potential is read from a shift of the landing energy (LE) before and after the electrification. As described above, when the electrified state changes, energy (speed) of the electron changes, and hence the force received when the electron passes through the electromagnetic field generation means (E×B deflector) that is expressed by $F=e\cdot(v\times B)$ also changes. Therefore, an orbit shift when the electron passes through the E×B deflector can be calculated. Further, the shift at the NA aperture position can be calculated from the orbit shift when the electron passes through the E×B deflector. Therefore, an actual shift of the center position of orbit of the electron ei can be verified.

Figures 42A, 42B:
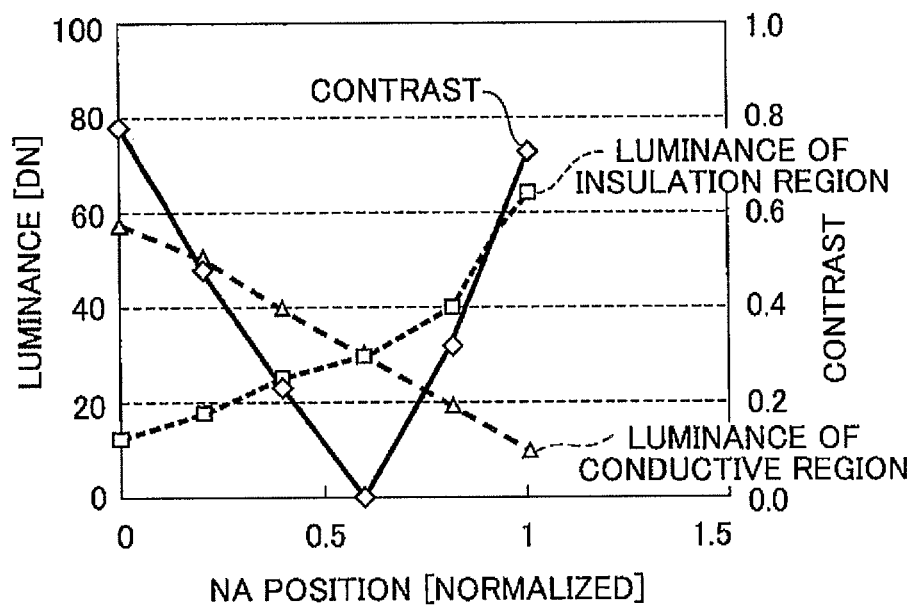
FIG. 42A is a table illustrating the reverse of contrast by NA aperture position adjustment, and showing results of measurement of the luminance [DN] of each of the conductive material and the insulation material and contrast when a center position of the NA aperture is moved from a position substantially the same as the center of orbit of the electron (ec) emitted from the conductive region (normalized position=0) in Y direction (to a normalized position=1.0)
FIG. 42B is a graph plotting the results of measurement shown in FIG. 42A.

FIGS. 42A and 42B are diagrams illustrating reverse of contrast by the NA aperture position adjustment. FIG. 42A is a table showing luminance values [DN] of the conductive material and the insulation material, and the contrast, when the center position of the NA aperture was changed from substantially the same position as the center of orbit of the electron ec emitted from the conductive region (normalized position of 0) to a position in the Y direction (normalized position of 1.0). In addition, FIG. 42B is a graph of this table, in which the horizontal axis represents the center position of the NA aperture [normalized position], the left vertical axis represents the luminance values [DN] of the conductive material and the insulation material, and the right vertical axis represents the contrast. Note that, imaging in this case was performed by irradiating the sample surface with the charged electron beam at 2 mC/cm$^2$, with the center position of the NA aperture where the luminance of the conductive material became maximum being set as a normalized position of 0. Here, the "normalized position" means, as described above, a relative coordinate when the NA aperture position passing through the electrons from the conductive material is set as 0 while the NA aperture position where the contrast is reversed is set as 1.

As illustrated in FIGS. 42A and 42B, as the NA aperture position is shifted in the Y direction from the normalized position of 0, the luminance of the conductive material is decreased while the luminance of the insulation material is increased. As a result, the contrast is decreased gradually. Further, when the center position of the NA aperture is a normalized position of 0.6, the luminance of the conductive material is the same as the luminance of the insulation material so that contrast cannot be obtained. As the NA aperture position is further shifted in the Y direction, the luminance of the conductive material is further decreased while the luminance of the insulation material is further increased. As a result, contrast is reversed and is increased gradually. In this way, by adjusting the NA aperture position, the contrast can be reversed.

Figure 43:
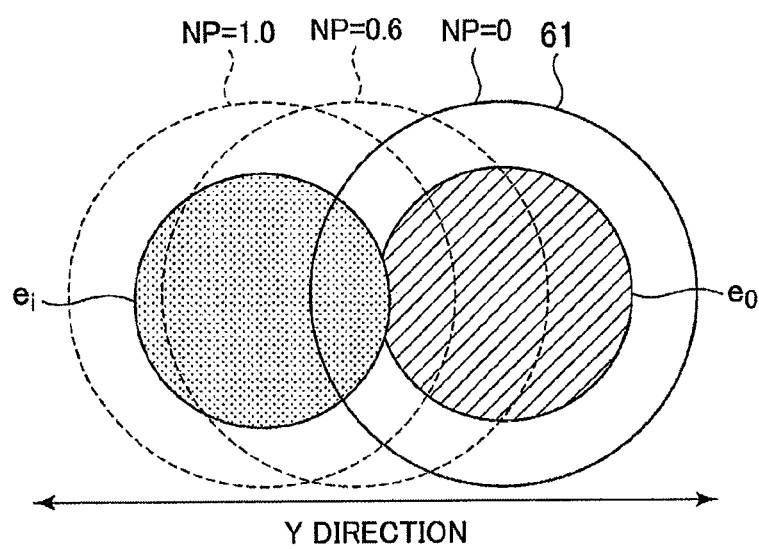
FIG. 43 is a diagram conceptually illustrating the reverse of contrast due to the NA aperture position adjustment.

FIG. 43 is a diagram conceptually illustrating the reverse of contrast due to the NA aperture position adjustment. When the center position of the NA aperture is at substantially the same position as the center of orbit of the electron ec emitted from the conductive region (normalized position NP=0), the electrons ec are mainly guided to the detector. As the center position of the NA aperture is shifted in the Y direction, the amount of the electrons ec that can pass through the NA aperture is decreased while the amount of the electrons ei that can pass through the NA aperture is increased. At a normalized position NP=0.6, the amounts of both the electrons become the same so that there is no difference of luminance and contrast cannot be obtained. As the center position of the NA aperture is further shifted in the Y direction, the amount of the electrons ec that can pass through the NA aperture is further decreased while the amount of the electrons ei that can pass through the NA aperture is further increased. At a normalized position NP=1.0, the amounts of both the electrons are reversed so that the contrast is reversed.

Figure 44:
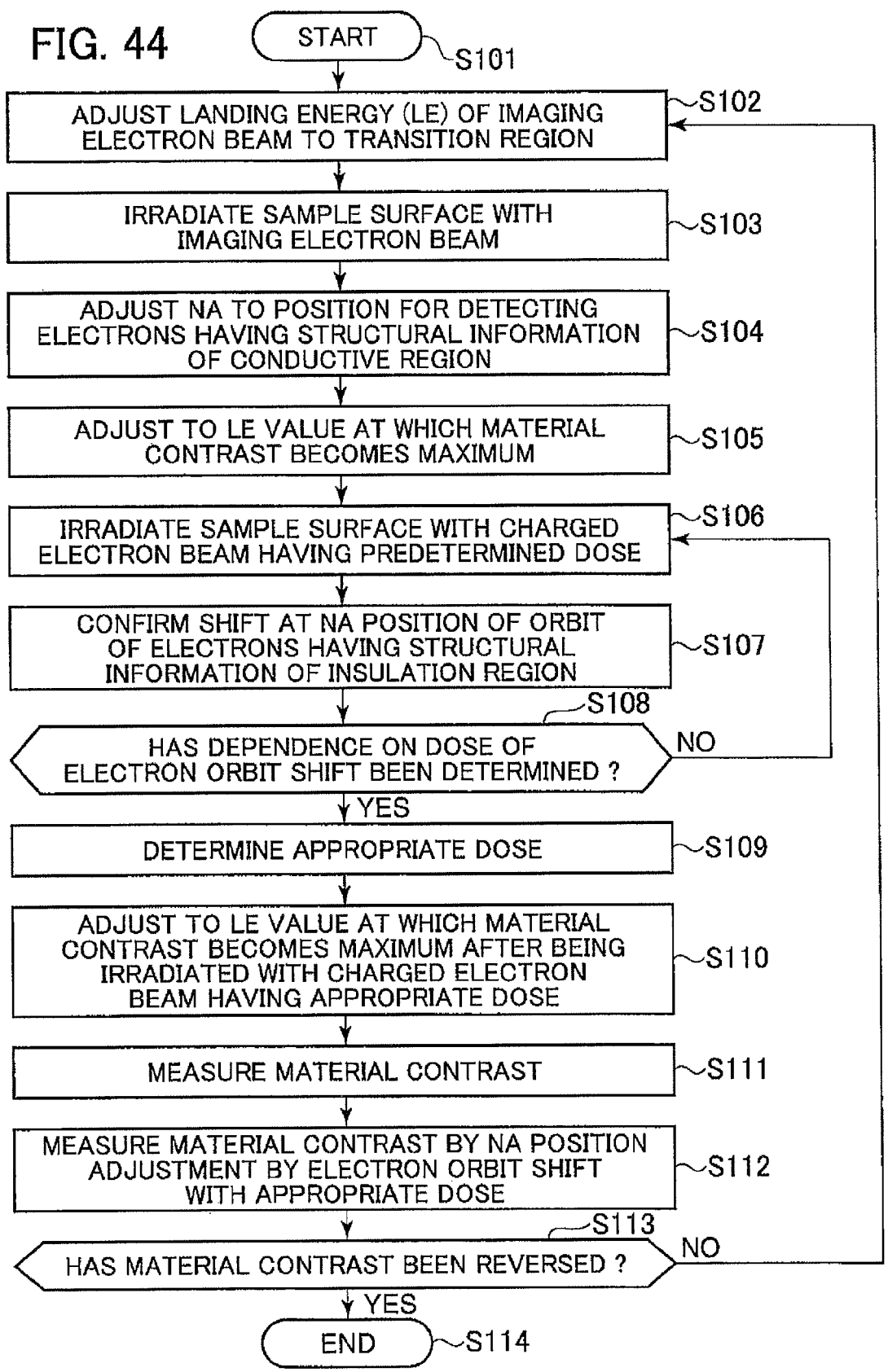
FIG. 44 is a flowchart illustrating, by means of an example, a procedure of determining dependence on the dose of the electron orbit shift, and a procedure of confirming the reverse of material contrast, in a sample observation method of the present invention.

FIG. 44 is a flowchart illustrating, by means of an example, a procedure of determining dependence on the dose of the electron orbit shift, and a procedure of confirming the reverse of the material contrast, in the sample observation method of the present invention. Some steps have been described above and hence details thereof are omitted.

First, the landing energy (LE) of the imaging electron beam is adjusted to the above-mentioned transition region (Step 102), and the sample surface to be observed including the insulation region and the conductive region is irradiated with the imaging electron beam (Step 103).

The NA aperture position is adjusted in the plane by the NA aperture moving mechanism, and hence the center position of the NA aperture is adjusted to the center of orbit of the electron ec having structural information of the conductive region (Step 104). Then, in this state, the landing energy (LE) of the imaging electron beam is adjusted so that a difference of luminance between the insulation region and the conductive region, namely the material contrast, becomes maximum (Step 105).

Next, the sample surface is irradiated with the charged electron beam having a predetermined dose so that the insulation region is electrified (Step 106), and it is checked how much degree the center of orbit of the electron ei from the insulation region in the electrified state is shifted at the NA aperture position (Step 107). After that, Step S106 and Step 107 are repeated, to thereby determine dependence on the dose of the orbit shift of the electron ei from the insulation region in the electrified state (Step 108).

When the dependence on the dose of the orbit shift of the electron ei from the insulation region in the electrified state is determined (Yes in Step 108), an appropriate dose is determined based on the data (Step 109).

After the appropriate dose is determined, the landing energy (LE) of the imaging electron beam is adjusted again. Specifically, the sample surface is irradiated with the charged electron beam of the appropriate dose determined by the above-mentioned procedure, and in this state, the landing energy (LE) for obtaining the maximum material contrast is determined (Step 110). Then, an image of the sample surface irradiated with the imaging electron beam of this landing energy (LE) is obtained to measure the material contrast (Step 111). As described above in relation to Step 107, the center position of the NA aperture in this case is at the center of orbit of the electron ec having structural information of the conductive region. Therefore, the luminance of the obtained image is relatively high in the conductive region and relatively low in the insulation region.

Next, the center position of the NA aperture is moved by the amount of the orbit shift of the electron ei when the irradiation with the charged electron beam of the appropriate dose is performed, so that the center position of the NA aperture coincides with the center of orbit of the electron ei. Then, in this state, the material contrast is measured again (Step 112).

As described above, when this adjustment of the center position of the NA aperture is performed, the material contrast is reversed so that an image must be obtained in which the luminance of the insulation region is relatively high while the luminance of the conductive region is relatively low. Therefore, when the reverse of the material contrast is confirmed (Yes in Step 113), the process is finished (Step 114). When the reverse of the material contrast is not confirmed (No in Step 113), which means a certain problem has occurred in the procedure up to here, the process flow returns to Step 102 and the process is performed again.

According to the above-mentioned procedure, the dependence on the dose of the electron orbit shift is determined and the reverse of the material contrast is confirmed, thereby completing setting of conditions necessary for the sample observation of the present invention.

Figure 45:
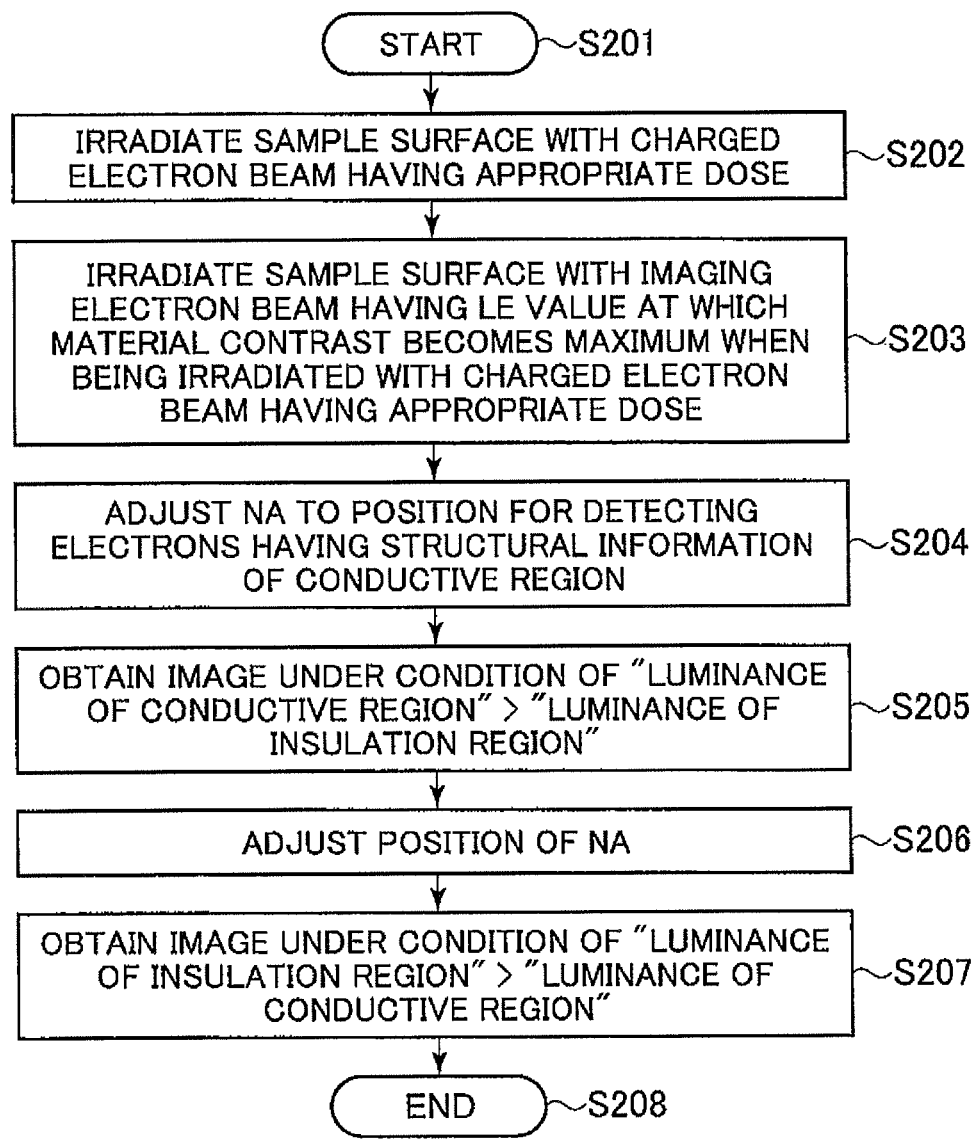
FIG. 45 is a flowchart illustrating, by means of an example, a procedure of the sample observation method of the present invention.

FIG. 45 is a flowchart illustrating, by means of an example, a procedure of the sample observation method of the present invention. Some steps have been described above and hence details thereof are omitted.

The sample observation method according to a preferred aspect of the present invention includes Step 203 in which the sample surface including the insulation region and the conductive region is irradiated with the imaging electron beam having the landing energy (LE) for obtaining the maximum material contrast, and Steps 205 and 207 in which the electrons having structural information of the sample surface irradiated by the imaging electron beam are detected so that a sample surface image is obtained. As described above, the landing energy (LE) of the imaging electron beam is adjusted to the transition region in which the electrons having structural information of the sample surface include both the mirror electrons and the secondary electrons. The steps of obtaining the sample surface image include Step 205 in which an image is obtained under the condition where the luminance of the conductive region is higher than the luminance of the insulation region, and Step 207 in which an image is obtained under the condition where the luminance of the insulation region is higher than the luminance of the conductive region.

As described above, prior to Step 203 of irradiation with the imaging electron beam, the sample surface is irradiated with the charged electron beam of an appropriate dose so that the insulation region is electrified (Step 202). Then, the substrate potential is changed, and as a result, a shift between the center of orbit of the electron ei emitted from the insulation region and the center of orbit of the electron ec emitted from the electrified region is increased. The degree of separation between the electrons ec having structural information of the conductive region and the electrons ei having structural information of the insulation region is also increased. The above-mentioned appropriate dose is determined in advance in Step S109 as described above, and it is preferred that the dose be set so that the electrification of the insulation region by the irradiation with the electron beam is saturated.

In the state where the sample surface is irradiated with the imaging electron beam in Step 203, the center position of the NA aperture is adjusted to the center of orbit of the electron ec having structural information of the conductive region so that the material contrast becomes maximum (Step 204). The image obtained under this condition is an image in which the luminance of the conductive region is relatively high while the luminance of the insulation region is relatively low (Step 205).

Next, the center position of the NA aperture is adjusted to the center of orbit of the electron ei having structural information of the insulation region so that the material contrast becomes maximum (Step 206). The image obtained under this condition is an image in which the luminance of the insulation region is relatively high while the luminance of the conductive region is relatively low (Step 207). In other words, the image obtained under this condition has reverse contrast to the image obtained in Step 205.

Note that, the adjustment of the NA aperture position in Step 206 may be performed so that the NA aperture position is adjusted by the amount of the orbit shift based on the orbit shift of the electron ei determined in advance in Step 107.

Figure 46:
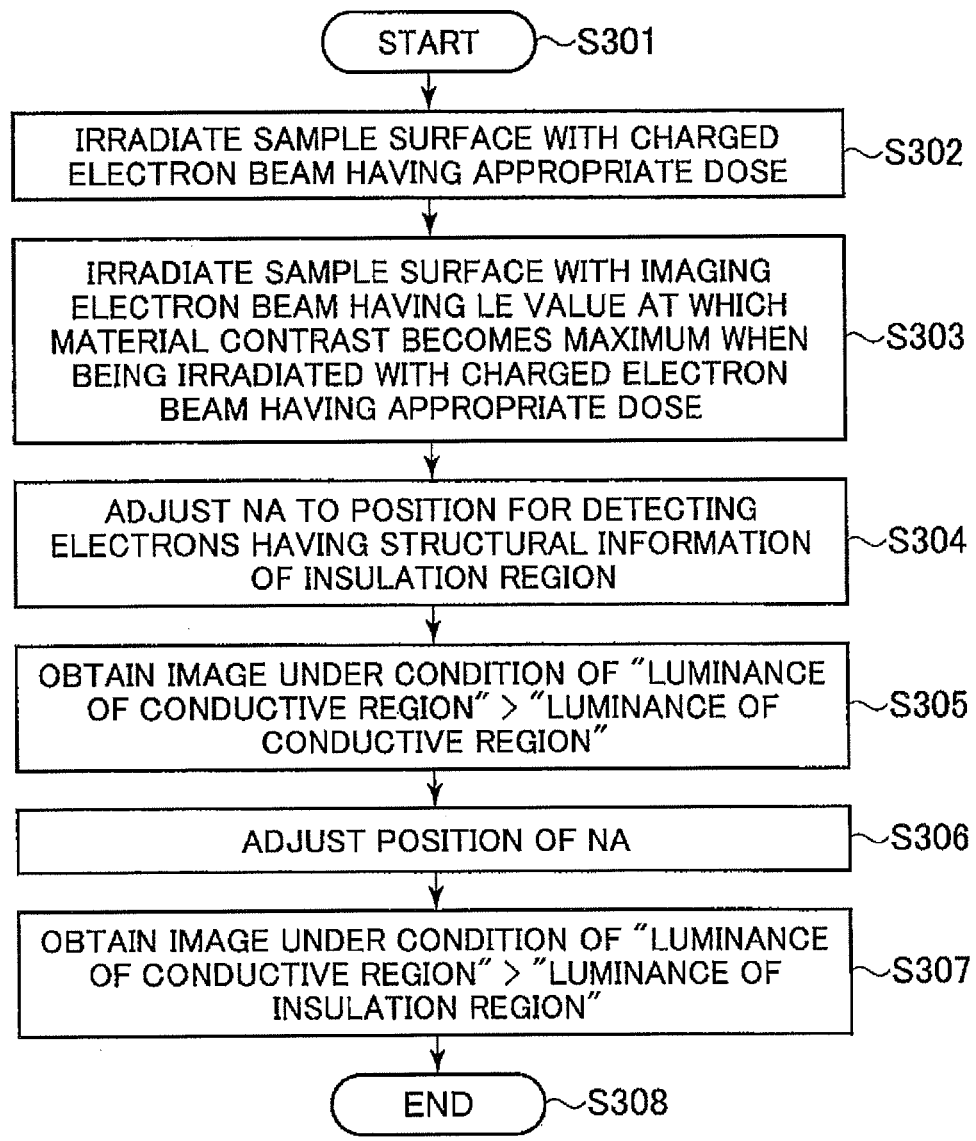
FIG. 46 is a flowchart illustrating another example of the procedure of the sample observation method of the present invention.

FIG. 46 is a flowchart illustrating another example of the procedure of the sample observation method according to the present invention. This procedure is different from the procedure illustrated in FIG. 45 in that, after Step 305 in which an image is obtained under the condition where the luminance of the insulation region is higher than the luminance of the conductive region, Step 307 is performed in which an image is obtained under the condition where the luminance of the conductive region is higher than the luminance of the insulation region.

In other words, the sample observation method according to this aspect includes Step S303 in which the sample surface including the insulation region and the conductive region is irradiated with the imaging electron beam having the landing energy (LE) for obtaining the maximum material contrast, and Steps 305 and 307 in which the electrons having structural information of the sample surface irradiated by the imaging electron beam are detected so that a sample surface image is obtained. The steps of obtaining the sample surface image include Step S305 in which an image is obtained under the condition where the luminance of the insulation region is higher than the luminance of the conductive region, and Step S307 in which an image is obtained under the condition where the luminance of the conductive region is higher than the luminance of the insulation region.

Similarly to the procedure of FIG. 45, prior to Step 303 of irradiation with the imaging electron beam, the sample surface is irradiated with the charged electron beam of an appropriate dose so that the insulation region is electrified (Step 302). Then, the substrate potential is changed, and as a result, a shift between the center of orbit of the electron ei emitted from the insulation region and the center of orbit of the electron ec emitted from the electrified region is increased. The degree of separation between the electrons ec having structural information of the conductive region and the electrons ei having structural information of the insulation region is also increased.

In the state where the sample surface is irradiated with the imaging electron beam in Step S303, the center position of the NA aperture is adjusted to the center of orbit of the electron ei having structural information of the insulation region so that the material contrast becomes maximum (Step 304). The image obtained under this condition is an image in which the luminance of the insulation region is relatively high while the luminance of the conductive region is relatively low (Step 305).

Next, the center position of the NA aperture is adjusted to the center of orbit of the electron ec having structural information of the conductive region so that the material contrast becomes maximum (Step 306). The image obtained under this condition is an image in which the luminance of the conductive region is relatively high while the luminance of the insulation region is relatively low (Step 307). In other words, the image obtained under this condition has reverse contrast to the image obtained in Step 305.

Note that, the adjustment of the NA aperture position in Step 306 may be performed so that the NA aperture position is adjusted in the direction opposite to the shift direction by the amount of the orbit shift based on the orbit shift of the electron ei determined in advance in Step 107.

As described above, when an image is obtained under the condition where the luminance of the conductive region is higher than the luminance of the insulation region, a short defect can be detected easily, but there is a case where it is difficult to detect an open defect. In addition, on the contrary to this, when an image is obtained under the condition where the luminance of the insulation region is higher than the luminance of the conductive region, an open defect can be detected easily, but there is a case where it is difficult to detect a short defect. Therefore, in order to detect both the short defect and the open defect on the sample surface including the insulation region and the conductive region with high accuracy, it is not sufficient to obtain an image only under the condition where the luminance of the conductive region is higher than the luminance of the insulation region, or on the contrary, to obtain an image only under the condition where the luminance of the insulation region is higher than the luminance of the conductive region.

According to the sample observation method of the present invention, an image is obtained under the condition where the luminance of the conductive region is higher than the luminance of the insulation region, and another image is obtained under the condition where the luminance of the insulation region is higher than the luminance of the conductive region. Thus, based on the images, both a short defect and an open defect on the sample surface can be detected with high accuracy.

In other words, by using the sample surface image obtained by the above-mentioned sample observation method according to the present invention, it is possible to detect presence or absence of a short defect with high sensitivity and high accuracy from the image obtained under the condition where the luminance of the conductive region is higher than the luminance of the insulation region, and to detect presence or absence of an open defect with high sensitivity and high accuracy from the image obtained under the condition where the luminance of the insulation region is higher than the luminance of the conductive region. Therefore, the method can be used also as a high-sensitivity and high-accuracy sample inspection method.

Hereinafter, an example is described in which the sample surface defect inspection was performed by the above-mentioned method.

A sample to be observed was prepared similarly to that illustrated in FIGS. 36A to 36C and 37A to 37C, having a line and space (L&S) pattern of a region of Cu as conductive material (conductive region) and a region of $SiO_2$ as insulation material (insulation region). Note that, the line width and the space width were both set to 43 nm. Various sizes of short defects and open defects were formed in a part of the conductive region of the L&S pattern, and those defects were detected.

When the sample observation was performed, an acceleration voltage of the electron source beam was set to −4,005V, and a surface potential of the sample 200 was set to −4,002.6V. Therefore, the landing energy (LE) of the imaging electron beam was 2.4 eV in the transition region in which the electrons having structural information of the sample surface included both the mirror electrons and the secondary electrons. In addition, the aperture diameter of the NA aperture 361 was set to 100 to 300 μm, the insulation region was electrified by being irradiated with the charged electron beam prior to imaging (electrified amount was 2 mC/cm$^2$), and current density of the imaging electron beam was set to 1 mA/cm$^2$. Imaging was performed in this state. Note that, an inspection pixel size for defect inspection was set to 29 nm square by setting the magnification of the electro-optical system lens. In addition, an inspection speed was set to 50 mega pixels per second (MPPS).

FIGS. 47A to 47C are tables showing results of the defect inspection performed in the above-mentioned condition. FIG. 47A is a table showing whether or not a defect could be detected from the image obtained under the condition where the luminance of the conductive region was higher than the luminance of the insulation region. FIG. 47B is a table showing whether or not a defect could be detected from the image obtained under the condition where the luminance of the insulation region was higher than the luminance of the conductive region. FIG. 47C is a table showing whether or not a defect could be detected as a combination of the above-mentioned two defect detection results. In those tables, a circle means that a defect could be detected, a cross means that a defect could not be detected, and a double circle means that a defect could be detected in both inspections.

As understood from those results, according to the image obtained under the condition where the luminance of the conductive region is higher than the luminance of the insulation region, a short defect can be detected with high accuracy, and on the other hand, according to the image obtained under the condition where the luminance of the insulation region is higher than the luminance of the conductive region, an open defect can be detected with high accuracy. This means that an open defect may be overlooked according to the image obtained under the condition where the luminance of the conductive region is higher than the luminance of the insulation region, while a short defect may be overlooked according to the image obtained under the condition where the luminance of the insulation region is higher than the luminance of the conductive region.

In contrast, as in the present invention, if it is determined whether or not a defect exists from an image obtained under the condition where the luminance of the conductive region is higher than the luminance of the insulation region and an image obtained under the condition where the luminance of the insulation region is higher than the luminance of the conductive region, both a short defect and an open defect having a size larger than at least 25 nm can be detected with high sensitivity and high accuracy.

The electro-optical inspection apparatus and the sample observation method of the present invention described above can be used, for instance, in a semiconductor manufacturing process, for observation or inspection of a surface of a semiconductor wafer after processing the semiconductor wafer. Using the electro-optical inspection apparatus and the sample observation method according to the present invention for observing the semiconductor wafer whose sample surface includes an insulation region and a conductive region, an image with high contrast can be obtained for inspecting quality of the semiconductor wafer. Thus, the electro-optical inspection apparatus and the sample observation method of the present invention can be effective means for manufacturing a semiconductor wafer without a defect. In this way, the electro-optical inspection apparatus and the sample observation method according to the present invention can be used appropriately in a semiconductor manufacturing method.

Here, when a scanning type or mapping projection type electron microscope, namely an electro-optical inspection apparatus, is used for wiring inspection or defect inspection of a sample surface, the sample surface may be charged up (electrified) due to friction with air during air conveyance or irradiation with an electron beam in vacuum. When the charge-up occurs on the sample surface, there is a problem that the electron beam irradiating the sample surface is detected as being affected by the secondary electrons charged up in the sample, and hence an image of the sample is blurred.

As a measure against the above-mentioned problem that an image of the sample is blurred because the charge-up occurs on the sample surface, for example, there is proposed a method of inspecting a defect of a sample as described in PCT 1999-046798 (Patent Document 5). In this method of inspecting a defect of a sample, a difference of distance to be focused is converted into a charge-up amount on the sample. In addition, Japanese Patent Application Publication No. 2002-033068 (Patent Document 6) discloses a sample defect inspection, in which a scanning type electron microscope is used, and a retarding voltage is applied to the sample for suppressing the charge-up of the sample.

In a static electricity removing method for the charged-up sample, ionized gas in air or in a certain type of gas is usually used. However, in this static electricity removing method, there is a fear that the sample is charged up again after the removal of static electricity due to friction with air during air conveyance. In addition, when removing static electricity due to the charge-up of the sample by the irradiation with the electron beam in vacuum, it is also necessary to return the sample once to the air side, which is not efficient.

However, in the method disclosed in Patent Document 5, a map indicating a difference of distance to be focused of the charged-up sample (voltage map) is generated, and the focus of the charged-up sample is merely changed based on the map. Therefore, static electricity due to the charge-up on the sample surface is not removed. In addition, in the method disclosed in Patent Document 6, in order to suppress the charge-up of the sample due to the irradiation with the electron beam, a retarding voltage RTD is merely applied. Therefore, there is a fear that the sample surface is charged up again, and static electricity due to the charge-up on the sample surface by natural electrification is not removed.

Hereinafter, an inspection method for a sample surface according to the present invention is described, which is capable of efficiently removing static electricity due to the charge-up on the sample surface caused not only by electrification of an electron beam but also by natural electrification of air.

First, a principle of setting potential distribution on the sample surface according to an embodiment of the present invention is described in detail.

Figure 48:
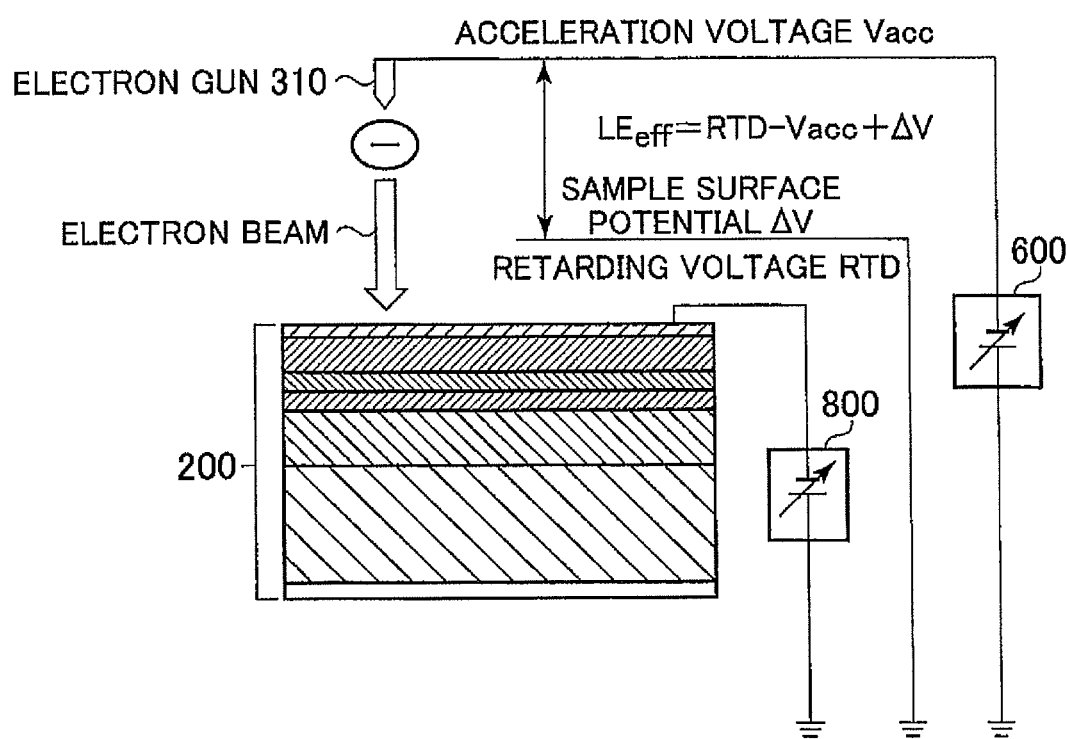
FIG. 48 is a schematic diagram illustrating a structure for controlling a relationship among an acceleration voltage (Vacc), a retarding voltage (RTD), landing energy (LE), and a sample surface potential ($\Delta V$) in the inspection of the sample surface according to the present invention.

FIG. 48 is a conceptual diagram illustrating a relationship among an acceleration voltage Vacc, the retarding voltage RTD, the landing energy LE, and the sample surface potential $\Delta V$ in inspection of the sample surface according to the embodiment of the present invention. In FIG. 48, the sample 200 is placed on the stage 100 of the electro-optical inspection apparatus illustrated in FIG. 1 or 33 (not shown in FIG. 48), and the electron beam EB is irradiated from the electron gun 310 to the sample 200. In order to accelerate the electron beam generated from the electron gun 310 with respect to the ground, a voltage of −4 to −7 kV, for example, is applied to the electron gun 310. This voltage is referred to as an acceleration voltage Vacc. In addition, when a voltage of −4 kV, for example, is applied to the sample 200, the potential $\Delta V$ of the sample 200 viewed from the electron beam EB accelerated with respect to the ground is 0V if the acceleration voltage Vacc is −4 kV, and is −3 kV if the acceleration voltage Vacc is −7 kV. The voltage to be applied to the sample 200 is referred to as a retarding voltage RTD. A value obtained by subtracting the retarding voltage RTD from the acceleration voltage Vacc, namely the potential of the sample 200 viewed from the electron beam EB accelerated with respect to the ground, is the landing energy LE. This landing energy LE is expressed by Expression (2) below.

Landing energy LE=(Retarding Voltage RTD)−(Acceleration Voltage Vacc)     (2)

However, the potential of the sample 200 is not always 0V depending on natural electrification of the sample 200 or pre-irradiation of the sample 200 with an electron beam. Therefore, effective landing energy LEeff is expressed by Expression (3) below where $\Delta V$ represents the sample surface potential.

LEeff=LE+$\Delta V$     (3)

In other words, the effective landing energy LEeff illustrated in FIG. 1 can be expressed by Expression (4) below obtained by substituting Expression (2) into Expression (3), as illustrated in FIG. 48.

$$\text{Effective Landing Energy } LEeff = (\text{Retarding Voltage } RTD) - \\ (\text{Acceleration Voltage } Vacc) + (\text{Sample Surface Potential } \Delta V) \quad (4)$$

Figure 49:
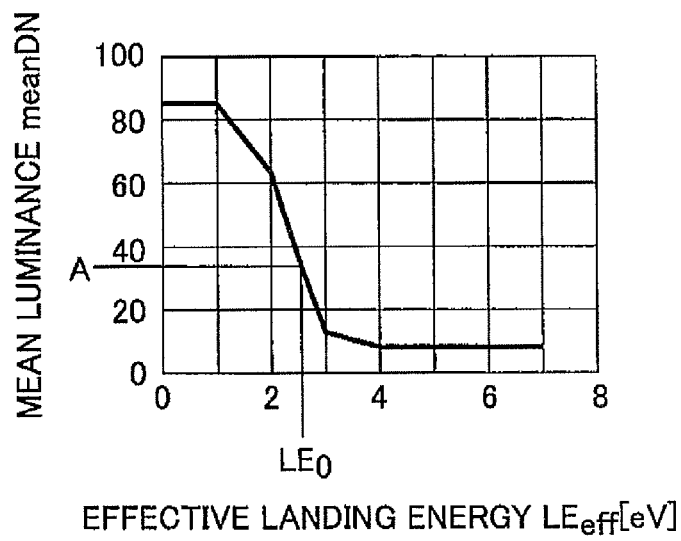
FIG. 49 is a graph illustrating a relationship between mean luminance (meanDN) of the sample surface to be inspected and the landing energy (LE) according to the present invention.

FIG. 49 illustrates an example of a relationship between the effective landing energy LEeff illustrated in FIG. 48 and mean luminance meanDN on the sample surface detected by irradiating the sample surface with the electron beam. FIG. 49 illustrates a relationship between the mean luminance meanDN and the effective landing energy LEeff [eV] when the sample surface is irradiated with the electron beam EB while changing the effective landing energy LEeff thereof from 0 to 7 eV, for example, and the electron beam EB coming back from the sample surface is converted into brightness (luminance) as sample surface image information. In FIG. 2, for example, it is supposed that the potential of the sample 200 before being irradiated with the electron beam EB is a constant value (here, 0 V, for example). The mean luminance meanDN when the sample surface is irradiated with the electron beam EB having the effective landing energy LEeff of 0V is denoted by "A" in FIG. 49. This mean luminance meanDN "A" is referred to as standard luminance, and the effective landing energy LEeff corresponding to the standard luminance A is referred to as a reference landing energy LE0. Here, the mean luminance meanDN of the sample surface is obtained by detecting the electron beam coming back from the sample surface by reflection or excitation by the electron beam irradiated to the sample surface and converting the detected electron beam into luminance. This detected electron beam from the sample surface irradiated by the electron beam includes secondary electrons emitted from the inside of the sample and mirror electrons reflected by the sample surface.

In the relationship between the effective landing energy LEeff and the mean luminance meanDN illustrated in FIG. 49, if the mean luminance meanDN of the sample surface is constant, the effective landing energy LEeff is constant. Then, the sample surface potential $\Delta V$ can be determined from Expression (4) described above. Note that, the relationship between the effective landing energy LEeff and the mean luminance meanDN illustrated in FIG. 49 may be determined, for example, by irradiating the electron beam having the effective landing energy LEeff to the insulation material region of the sample surface and by converting the electron beam coming back from the sample surface into luminance.

Figure 50:
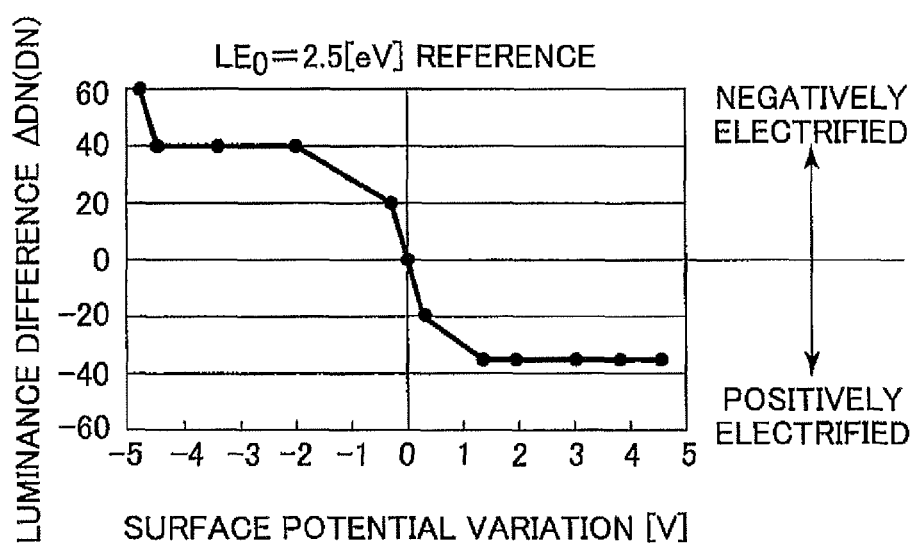
FIG. 50 is a diagram illustrating a relationship between luminance difference ($\Delta DN$) of the sample surface to be inspected and a variation of surface potential according to the present invention.

Next, with reference to FIG. 50, determination of the sample surface potential $\Delta V$ from the relationship between the effective landing energy LEeff and the mean luminance meanDN illustrated in FIG. 49 is described. FIG. 50 is a diagram illustrating a relationship between the sample surface potential ΔV and the luminance difference ΔDN. In FIG. 50, the vertical axis represents the luminance difference ΔDN between the standard luminance A when an arbitrary region of the sample surface is irradiated with the electron beam having the reference landing energy LE0 of 2.5 eV, for example, and the mean luminance meanDN when an arbitrary region of the sample surface is irradiated with the electron beam having the landing energy LE. The horizontal axis represents the sample surface potential ΔV converted by the luminance difference ΔDN.

For instance, it is supposed that an arbitrary region of the sample surface is irradiated with the electron beam, and mean luminance distribution (luminance difference) ΔDN on the sample surface is detected. Here, it is supposed that the luminance difference ΔDN of the arbitrary region of the sample surface is determined by the following expression.

Luminance Difference ΔDN=(Mean Luminance meanDN)−(Standard Luminance A)

Then, the case where the mean luminance distribution (luminance difference) ΔDN is positive, namely, the luminance difference ΔDN is higher than the standard luminance A, and the case where the mean luminance distribution (luminance difference) ΔDN is negative, namely, the luminance difference ΔDN is lower than the standard luminance A are studied. It is supposed that an arbitrary region of the sample surface is irradiated with the electron beam having the reference landing energy LE0 of 2.5 eV, for example. If the mean luminance meanDN is higher than the standard luminance A, it means that the sample surface potential ΔV is shifted to the negative side, namely, the sample surface is electrified negatively as illustrated in FIG. 50. If the mean luminance meanDN is lower than the standard luminance A, it means that the sample surface potential ΔV is shifted to the positive side, namely, the sample surface is electrified positively as illustrated in FIG. 50. Specifically, first, the luminance that is detected when the arbitrary region of the sample surface is irradiated with the electron beam having the reference landing energy LE0 of, for example, 2.5 eV is regarded as 100, for example, and the detected luminance of 100 is referred to as the standard luminance A. Next, the arbitrary region of the sample surface was irradiated with the electron beam whose arbitrary landing energy LE was set to, for example, 3.5 eV, the luminance was 130. In this case, the luminance difference ΔDN between the standard luminance A and the mean luminance meanDN is 30, the sample surface potential ΔV is −1 V from FIG. 50, and it is understood that the sample surface is electrified negatively.

Figure 51:
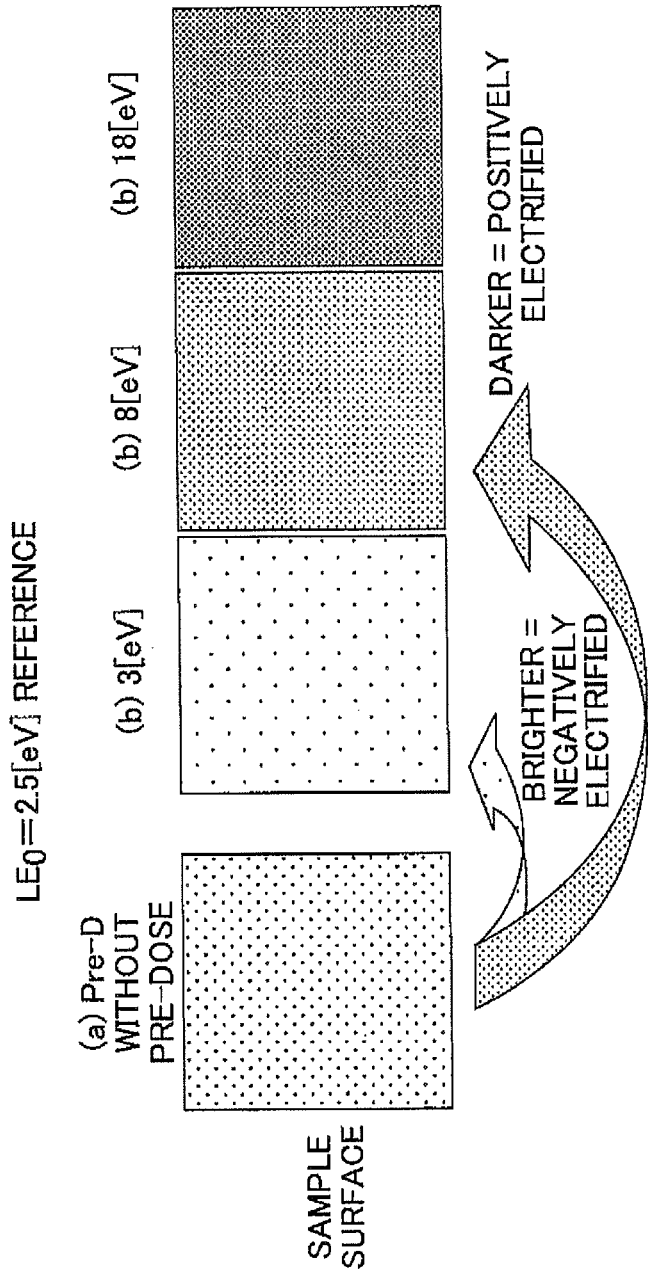
FIG. 51 is a diagram illustrating examples (a) to (d) of image information of the sample surface obtained when the landing energy (LE) to irradiate the sample surface is changed.

Next, with reference to FIG. 51, the luminance difference ΔDN is described, which is detected when the effective landing energy LEeff of the electron beam irradiating an arbitrary region of the sample surface is adjusted. FIG. 51 is a diagram illustrating examples (a) to (d) when the effective landing energy LEeff of the electron beam irradiating the sample surface was changed. Note that, the examples (a) to (d) of FIG. 51 are cases where the sample surface is an oxide.

The image of "WITHOUT PRE-DOSE" illustrated in (a) of FIG. 51 indicates luminance of the sample surface detected when the arbitrary region of the sample surface was irradiated with only the electron beam having the reference landing energy LE0 of 2.5 eV. The luminance in this case is referred to as standard luminance A. The landing energy of the electron beam LE irradiating the arbitrary region of the sample surface in this case is the reference landing energy LE0.

The image of "3 eV" illustrated in (b) of FIG. 51 indicates luminance of the sample surface detected when the same region of the sample surface as in (a) of FIG. 51 was irradiated with the electron beam whose arbitrary landing energy LE was preset to 3 eV, and afterward irradiated with the electron beam whose reference landing energy LE0 was set to 2.5 eV. In this case, the luminance is brighter than the standard luminance A, and it is understood that the sample surface is electrified negatively.

The image of "8 eV" illustrated in (c) of FIG. 51 indicates luminance of the sample surface detected when the same region of the sample surface as in (a) of FIG. 51 described above was irradiated with the electron beam whose arbitrary landing energy LE was preset to 8 eV, and afterward irradiated with the electron beam whose reference landing energy LE0 was set to 2.5 eV. In this case, the luminance is darker than the standard luminance A, and it is understood that the sample surface is electrified positively.

Similarly, the image of "18 eV" illustrated in (d) of FIG. 51 indicates luminance of the sample surface detected when the same region of the sample surface as in (a) of FIG. 51 was irradiated with the electron beam whose arbitrary landing energy LE was preset to 18 eV, and afterward irradiated with the electron beam whose reference landing energy LE0 was set to 2.5 eV. In this case, the luminance is darker than the standard luminance A, and it is understood that the sample surface is electrified positively. In this way, the potential ΔV of the sample surface can be determined by comparing the standard luminance A detected when being irradiated with the reference landing energy LE0 with the luminance detected when the effective landing energy LEeff is adjusted.

Figure 52:
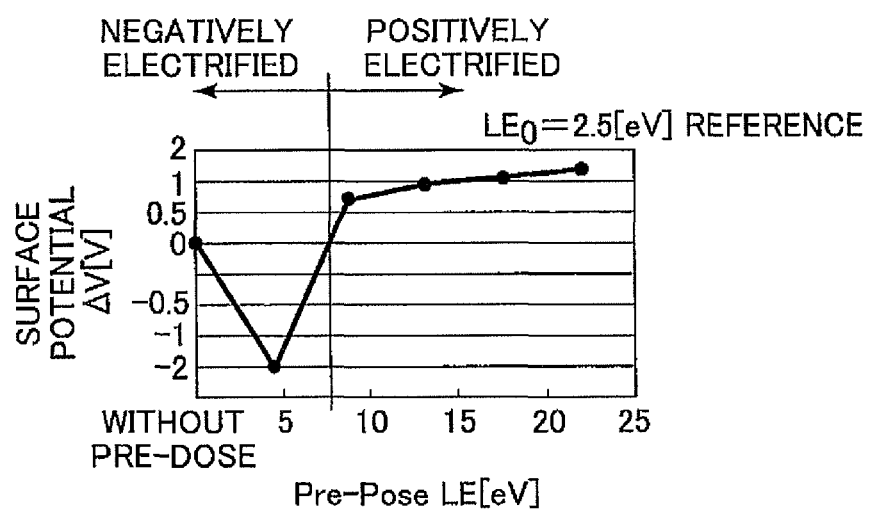
FIG. 52 is a graph illustrating a relationship between the landing energy (LE) and the sample surface potential ($\Delta V$) when the landing energy (LE) to irradiate in advance the sample surface to be inspected is changed according to the present invention.

Next, with reference to FIG. 52, the determination of the sample surface potential ΔV is described, which is made based on the image information (luminance difference ΔDN) detected when the sample surface illustrated in (a) to (d) of FIG. 51 is irradiated with the electron beam whose arbitrary landing energy LE [eV] is set by Pre-Dose. Note that, the sample surface potential ΔV is determined from the luminance difference ΔDN illustrated in FIG. 50.

FIG. 52 is a diagram illustrating a change of the sample surface potential ΔV when an arbitrary region of the sample surface is irradiated with the electron beam while changing the arbitrary landing energy LE, namely, when the "Pre-Dose" is performed and then the electron beam whose reference landing energy LE0 is set is irradiated. In FIG. 52, first, the "Pre-Dose" is performed on an arbitrary region of the sample surface. When this "Pre-Dose" is performed, an arbitrary region of the sample surface is irradiated with the electron beam whose arbitrary landing energy LE is set to 3, 8, 14, and 22 eV, for example. Next, the arbitrary region of the sample surface is irradiated with the electron beam whose reference landing energy LE0 is set to 2.5 eV, for example. The luminance difference ΔDN is determined from the mean luminance meanDN detected by the irradiation with the electron beam including the "Pre-Dose" and the standard luminance A. Then, using this luminance difference ΔDN, the sample surface potential ΔV is determined with reference to FIG. 50.

As to the sample surface potential ΔV determined from the luminance difference ΔDN illustrated in (a) to (d) of FIG. 51, it is understood that the landing energy LE that becomes brighter than the standard luminance A (electrified negatively) and the landing energy LE that becomes darker than the standard luminance A (electrified positively) are present when an arbitrary region of the sample surface is irradiated in advance with the electron beam whose arbitrary landing energy LE is set, namely when the Pre-Dose is performed.

From this, it is understood that a potential of the sample surface can be electrified positively or negatively in advance by adjusting the landing energy LE of the electron beam arbitrarily when being irradiated with the electron beam by the Pre-Dose.

According to the above-mentioned result, the sample surface potential $\Delta V$ can be electrified positively or negatively by changing the effective landing energy LEeff to be set for the electron beam irradiating the sample surface. Thus, it is possible to reset the electrified state of an arbitrary region of the sample surface to a standard potential (or to an arbitrary potential state) by irradiating the region with the electron beam having the luminance difference $\Delta DN$ obtained by subtracting the standard luminance A, which is obtained when the sample surface is irradiated with the electron beam having the reference landing energy LE0, from the mean luminance meanDN, which is obtained when the sample surface is irradiated with the electron beam having an arbitrary landing energy LE, namely the electron beam having the landing energy LE that acts opposite electrification with respect to a result of determination as to whether the sample surface is electrified positively or negatively. The following embodiment has a feature in that the function of removing static electricity of the electrification on the sample surface or setting a potential of the sample surface to an arbitrary potential using this principle is applied to an apparatus for inspecting a sample surface.

Figure 53A:
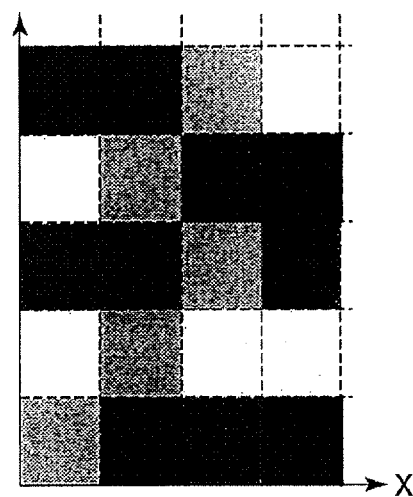
FIG. 53A is a diagram illustrating an example of luminance distribution obtained when the sample surface is irradiated with landing energy (LE0) to be a reference and the landing energy (LE)
Figure 53B:
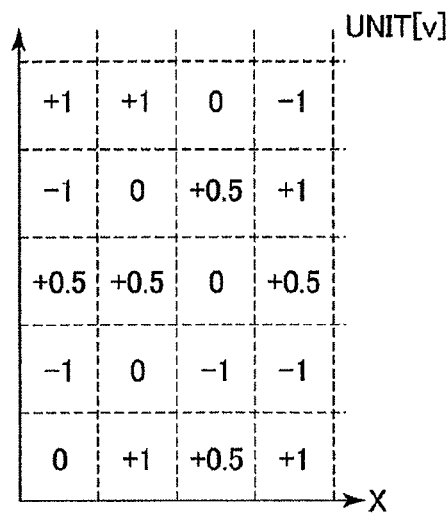
FIG. 53B is a diagram illustrating an example of determining sample surface potential distribution ($\Delta V$) from the luminance distribution illustrated in FIG. 53A.

FIG. 53A is a diagram illustrating, as a brightness distribution, a distribution of the luminance difference $\Delta DN$ obtained when each region of the sample surface is irradiated with the electron beam having an arbitrary landing energy LE, in which brightness (luminance difference $\Delta DN$) distribution of each region is illustrated in the X-Y coordinate system. FIG. 53B illustrates distribution of the potential ($\Delta V$) of each region of the sample surface converted from the luminance difference $\Delta DN$ of each region illustrated in FIG. 53A in the X-Y coordinate system. In the brightness distribution illustrated in FIG. 53A, luminance obtained when each region of the sample surface is irradiated with the electron beam having an arbitrary landing energy LE is regarded as the standard luminance A, and the luminance difference $\Delta DN$ indicating a difference between the standard luminance A and the mean luminance obtained when each arbitrary region of the sample surface is irradiated with the electron beam having the effective landing energy LEeff is illustrated for each region irradiated with the electron beam.

The luminance difference $\Delta DN$ of each region illustrated in FIG. 53A is determined, and a relationship between the sample surface potential $\Delta V$ and the luminance difference $\Delta DN$ illustrated in FIG. 50 is referred to. Thus, the luminance difference $\Delta DN$ of each region from the standard luminance A can be obtained as distribution of the sample surface potential $\Delta V$. FIG. 53B illustrates a case where distribution of the potential $\Delta V$ is −1V, 0V, +0.5V, and +1V, as a result of determination of the sample surface potential $\Delta V$ from the luminance difference $\Delta DN$ of each region illustrated in FIG. 53A.

Using position information (XY coordinates) of each region of the sample surface and potential information of each region of the sample surface obtained from FIGS. 53A and 53B, and also using the potential of the sample surface that can be adjusted by the Pre-Dose illustrated in FIG. 52, thereby irradiating the region in which the sample surface potential $\Delta V$ illustrated in FIG. 53B is +1V with the electron beam having the arbitrary landing energy LE for electrifying the potential of the sample surface to −1V by the Pre-Dose, the region in which the potential $\Delta V$ is +1V can be set to 0V. Similarly, by irradiating other regions electrified to potentials of −1V and +0.5V with the electron beam having an arbitrary landing energy LE by the Pre-Dose, the other regions can be also set to 0V. Further, in addition to setting each region of the potential of the sample surface to 0V uniformly by the Pre-Dose, it is possible to set each region of the potential of the sample surface to an arbitrary potential so as to set a uniform potential distribution.

In addition, by adjusting the effective landing energy LEeff of the electron beam irradiating the sample surface by using the above-mentioned Pre-Dose, it is possible to set the sample surface to a dark field (electrified positively) or a bright field (electrified negatively). The sample surface is set to the dark field mainly for inspecting dust or particles (made of insulation material) on the sample (conductor such as Si or Cr). In this case, the entire sample surface is set to the dark field so that the dust or particles on the sample glitter for detection.

Figure 54:
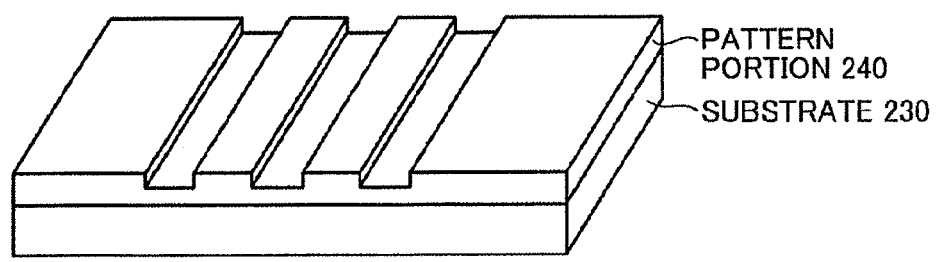
FIG. 54 is a schematic perspective view illustrating an example in which the sample to be inspected is made of at least two materials.

FIG. 54 is a perspective view illustrating a specific example of the sample to be inspected. The sample illustrated in FIG. 54 is an example in which a pattern portion 240 is formed on a substrate 230. If a pattern inspection is mainly performed on this sample, it is necessary to set the sample surface to the bright field. In the pattern inspection of this sample, in order to detect black and white contrast for inspecting a defect or the like of the pattern portion 240 (for example, in the case of inspecting a top surface of the sample made of an oxide under which there is a conductor containing mainly Cr or Si), the effective landing energy LEeff of the electron beam irradiating the entire sample is adjusted so that the portion to be inspected has high brightness according to the material to be detected as "white" (one of different materials constituting the pattern), namely so that the portion to be inspected is set to the bright field.

As described above, in the method of setting the potential distribution of the sample surface according to the embodiment of the present invention, the electron beam having an arbitrary landing energy LE is irradiated to scan the region in which the potential distribution of the sample surface should be known. Then, luminance of the region is detected, and the luminance difference between the standard luminance and the luminance of the scanned region is determined, to thereby determine the (X,Y) distribution of the luminance difference $\Delta DN$ of each scanned region. As to this (X,Y) distribution of the luminance difference $\Delta DN$, a difference from the standard luminance is determined, and hence it is possible to determine a shift of the landing energy LE from the reference landing energy LE0 corresponding to the standard luminance in a certain region, namely a variation of the potential $\Delta V$ [V] of the sample surface in a certain region. In addition, the above-mentioned Pre-Dose may be performed according to the variation of the potential $\Delta V$ [V] of the sample surface so that the potential distribution of the sample surface can be adjusted.

Here, a principle of electrifying the sample surface potential $\Delta V$ to a positive potential or a negative potential is described. An electron density Je is calculated from an electron current value of the electron gun for generating the primary electron beam irradiating the sample surface. Based on this current density Je and a blanking release time TS (time while the electron beam is irradiated) of a blanking signal (for stopping the electron beam), the dose of the sample surface is expressed by Expression (5) below. Note that, blanking of the blanking signal means that the primary electron beam is temporarily broken when the sample surface is not irradiated with the primary electron beam.

$$\text{Dose}=Js \cdot \tau s \quad (5)$$

When sample surface information, for example, a thickness of resist (for example, insulation material such as oxide) is denoted by d, and a specific dielectric constant of the resist is denoted by $\in r$, capacitance C0 per unit area of the sample surface is expressed by Expression (6) below.

$$C0 = \in r \cdot \in 0 \cdot S/d \quad (6)$$

In Expression (6), S denotes a unit area of 1 cm$^2$, and $\in 0$ denotes a dielectric constant of vacuum.

In addition, because C0V=Q holds, Q is expressed by Expression (7) below.

$$Q = C0 \cdot \Delta V \quad (7)$$

In Expression (7), Q denotes a total electron amount irradiating the sample surface. When the sample surface is irradiated with the electron beam having the landing energy LE [keV], the total electron amount Q is expressed by Expression (8) below, where η denotes a secondary electron emission ratio.

$$Q = \text{Dose} \cdot (1-\eta) \quad (8)$$

Here, based on Expressions (7) and (8), the following expression holds.

$$Q = \text{Dose} \cdot (1-\eta) = C0 \cdot \Delta V$$

By solving this expression with respect to the secondary electron emission ratio η, Expression (9) below is obtained.

$$\eta = 1 - (C0 \cdot \Delta V)/\text{Dose} \quad (9)$$

Expression (9) indicates that the secondary electron emission ratio η is uniquely related to a specific dielectric constant $\in r$ of the substance forming the sample surface.

In other words, when Expression (6) is substituted into Expression (9) so as to solve with respect to the specific dielectric constant $\in r$ of the substance, a relationship between the secondary electron emission ratio η and the specific dielectric constant $\in r$ of the substance can be expressed by Expression (10) below.

$$\eta = 1 - \{(\in 0 \cdot S \cdot \Delta V)/(d \cdot \text{Dose})\} \cdot \in r \quad (10)$$

In addition, as illustrated in FIG. 50, an increase of potential of the sample surface can correspond to the detected mean luminance. Therefore, the potential distribution of the sample surface can be known oppositely from the distribution of the luminance difference ΔDN (cross sectional gradation or the like) inspected from the electron beam irradiation condition or the like.

Figure 55A:
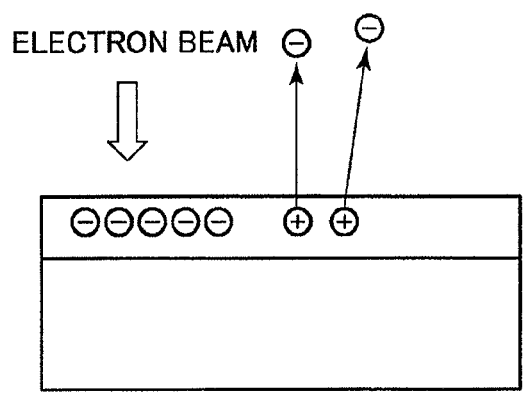
FIG. 55A is a schematic diagram illustrating a model of transmittance of electrons through the sample in the thickness direction.
Figure 55B:
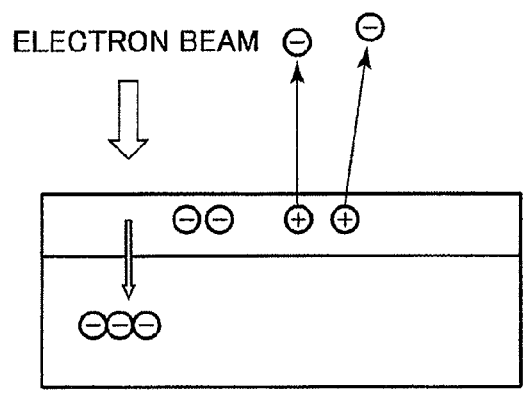
FIG. 55B is a schematic diagram illustrating a model of transmittance of electrons through the sample in the thickness direction.

Next, with reference to FIGS. 55A and 55B that are conceptual diagrams illustrating a model of transmittance of electrons through the sample in the thickness direction, the transmittance is described.

First, with reference to FIG. 55A, there is described a case where the secondary electron emission ratio η of the sample is smaller than 1. As illustrated in FIG. 55A, if the amount of the secondary electrons emitted from the sample surface due to electrons entering the sample surface is smaller than the amount of the entering electrons, the total electron amount Q accumulated inside the sample is negative as a whole. Therefore, when the amount of the electrons entering the sample surface is denoted by Dose_in, and the amount of the secondary electrons emitted from the sample surface is denoted by Dose_out, the total electron amount Q is expressed by Expression (11) below.

$$Q = \text{Dose\_in} - \text{Dose\_out} < 0 \quad (11)$$

Based on the relationship expressed in Expression (10), the secondary electron emission ratio η is expressed by Expression (12) below.

$$\eta = \text{Dose\_out}/\text{Dose\_in} \quad (12)$$

Based on Expression (11), a variation of the potential ΔV generated on the sample surface is expressed by Expression (13) below.

$$\text{Dose\_in}(1-\eta) < 0 \quad (13)$$

In addition, as illustrated in FIG. 55B, in relation to the electron energy of the primary electron beam irradiated from the electron gun and a thickness of the sample, when a part of the primary electrons penetrates (passes through) the sample, the total electron amount Q accumulated inside the sample is expressed by Expression (14) below, where the amount of the penetrating primary electrons is denoted by Dose_th.

$$Q = \text{Dose\_in} - \text{Dose\_out} - \text{Dose\_th} \quad (14)$$

Next, the transmittance a of the primary electrons is expressed by α=Dose_th/Dose_in. Then, the total electron amount Q that is accumulated inside the sample is expressed by Expression (15) below.

$$Q = \text{Dose\_in}(1-\eta-\alpha) \quad (15)$$

Here, as to an increase of the sample surface potential ΔV, the transmittance a can be expressed by Expression (16) below from a relationship between Expressions (15) and (7).

$$\alpha = 1 - \eta - (\Delta V \cdot C0/\text{Dose}) \quad (16)$$

(where, Dose_th=Dose)

Q is 0 in the case of FIG. 55B, and hence the transmittance a can be determined by Expression (17) below.

$$\alpha = 1 - \eta \quad (17)$$

The transmittance a is a function of landing energy LE of the electron beam for irradiation and a thickness t of the sample (in particular, a thickness of the resist), and hence an increase of the sample surface potential ΔV can be 0 under the condition satisfying f(LE, t)=1−η where α=f(LE, t). Thus, an influence of the charge up (electrification) of the sample surface can be minimized. On the contrary, if the thickness t of the sample is known, the transmittance a can be controlled by combination with the landing energy LE, and hence the condition can be used differently so that the sample surface is electrified positively if f(LE, t)=α>1−η holds, while the sample surface is electrified negatively if f(LE, t)=α<1−η holds. Using this principle, it is possible to equalize the potential distributions by examining a potential distribution existing locally on the sample surface and by irradiating with the electron beam having the landing energy LE for canceling the potential.

As described above, in a sample surface observation apparatus or a sample surface inspection apparatus using an electron beam for inspecting a sample, energy of the electron beam irradiating the sample is set according to physical properties of the surface material occupying most of the sample surface to be observed or inspected. In this setting, by setting the energy of the electron beam so that f(LE, t)=1−η holds as described above, an influence of electrification of the sample surface can be minimized so that a clear image or an inspection result with high sensitivity can be obtained. For instance, when the electron beam irradiates a sample surface of a sample having regions of different thicknesses t made of the same material, if the secondary electron emission ration η of the sample surface can be determined first by irradiating the primary electron beam having a condition (α=0) such that the electron beam cannot penetrate absolutely, it is possible to calculate the transmittance α of the electron beam in the region having a small thickness t made of the same material (such thickness that the irradiated electron beam can penetrate). In addition, by using the above-mentioned parameters such as the luminance difference (ΔDN), the dose, and the variation of the sample surface potential ΔV, it is also possible to examine the distribution of capacitance C of the sample surface, the distribution of the secondary electron emission ratio η, and the distribution of the thickness t of the sample.

Figure 56:
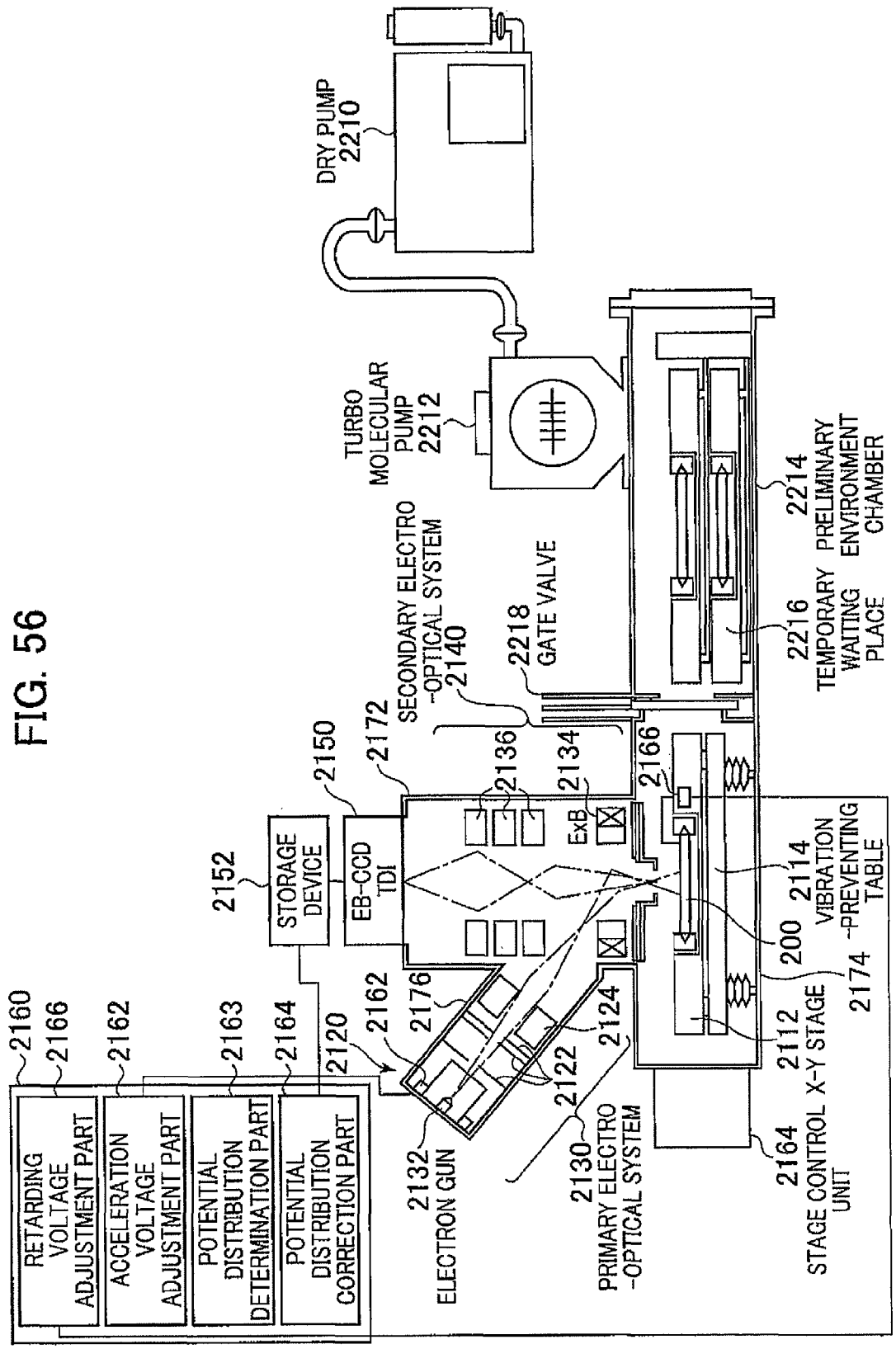
FIG. 56 is a general schematic diagram illustrating a sample observation system of a second embodiment according to the present invention.
Figure 57:
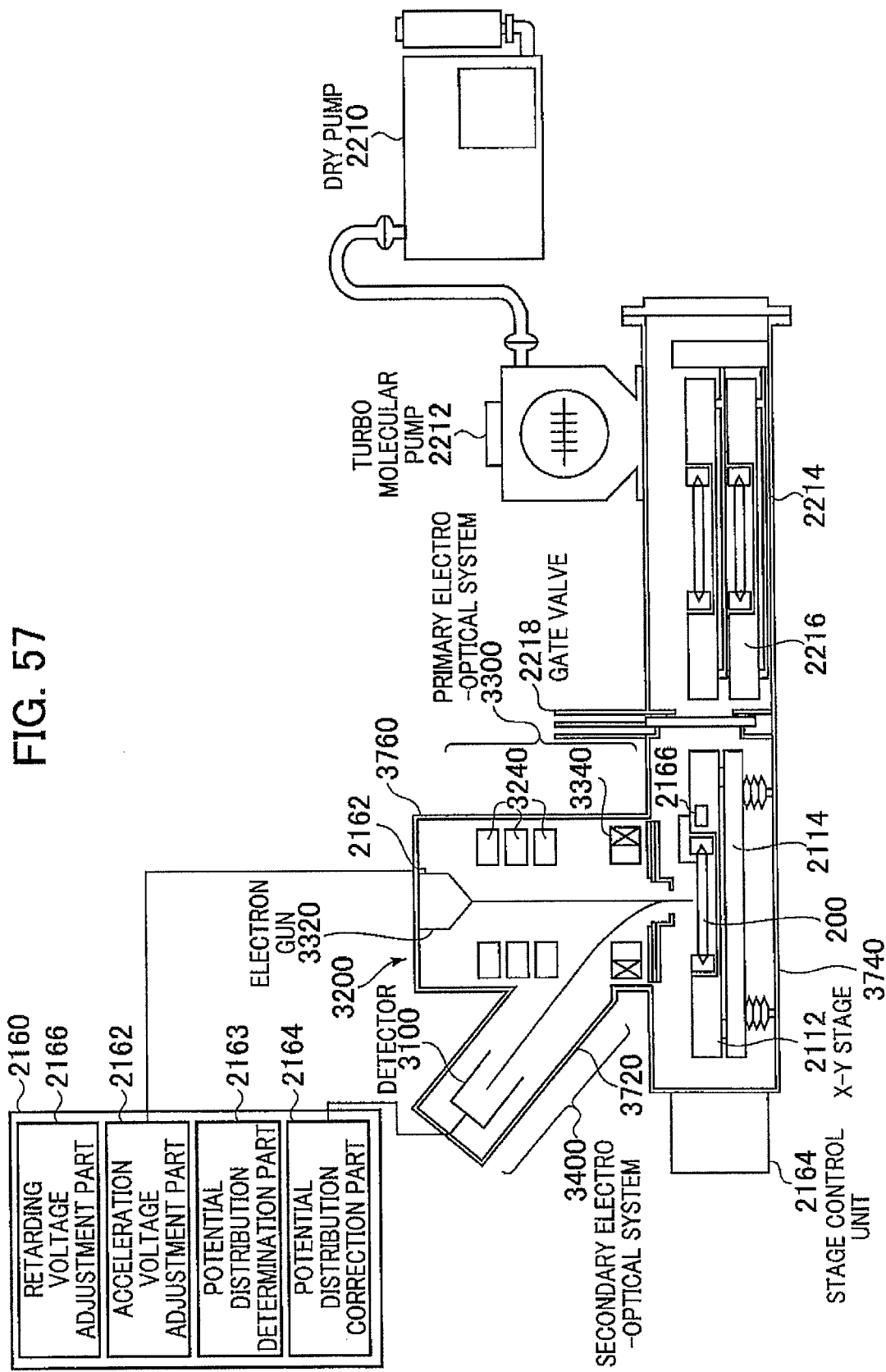
FIG. 57 is a general schematic diagram illustrating a sample observation system of a third embodiment according to the present invention.

FIGS. 56 and 57 are diagrams schematically illustrating sample observation systems of second and third embodiments according to the present invention, in which potential distribution of the sample surface can be adjusted based on the method of adjusting the potential of the sample surface under the above-mentioned principle. FIG. 56 illustrates a structural example in the case where a mapping projection type electron microscope is used as the electro-optical inspection apparatus, and FIG. 57 illustrates a structural example in the case where a scanning electron microscope (SEM) is used as the electro-optical inspection apparatus.

In the sample observation system illustrated in FIG. 56, a mapping projection type electron microscope 2100 includes an electron beam generating source 2120 for generating a primary electron beam, a primary electro-optical system 2130 for guiding the primary electron beam to the sample 200, a secondary electro-optical system 2140 for guiding a secondary electron beam from the sample 200 due to irradiation with the primary electron beam to an image sensor 2150, the image sensor 2150 for obtaining an image of the secondary electron beam from the sample 200 due to irradiation with the primary electron beam, and an X-Y stage 2112 on which the sample 200 is placed and which is capable of moving at least in one direction, which are housed in vacuum chambers 2172, 2174, and 2176.

A thermal electron emission type electron gun 2132 is used as the electron beam generating source 2120. This thermal electron emission type electron gun 2132 uses mainly lanthanum hexaboride (LaB$_6$), but it is possible to use a filament made of tungsten, or a cathode made of a tungsten-based compound such as thoriated tungsten (Th—W) or tungsten carbide (W2C), or made of oxide such as (barium (Ba), strontium (Sr), or calcium (Ca))CO$_3$.

The primary electro-optical system 2130 is means for guiding the first electron beam generated from the thermal electron emission type electron gun 2132 to the sample 200, and includes an aperture 2122 and an electrostatic lens 2124.

The first electron beam generated from the thermal electron emission type electron gun 2132 has a circular, elliptical, or rectangular cross section formed by the aperture 2122 and the electrostatic lens 2124 of the primary electro-optical system 2130, and is guided to the sample 200 for irradiation. It is desired that a size (beam diameter) of the first electron beam formed in a circular, elliptical, or rectangular shape be generally slightly larger than an element area of the TDI, the EB-TDI, the CCD, or the EB-CCD as the image sensor 2150. In addition, the size of the primary electron beam may be adjusted for each image sensor 2150, or may be set conforming to a size of the largest image sensor 2150.

As to the primary electron beam, a combination of the acceleration voltage Vacc for accelerating to arbitrary energy in the primary electro-optical system 2130 and the retarding voltage RTD is adjusted so as to adjust the landing energy LE of the first electron beam when the sample 200 is irradiated. The acceleration voltage Vacc is adjusted by an acceleration voltage adjustment part 2162, for example, and the retarding voltage RTD is adjusted by a sample voltage adjustment part 2166 disposed in the X-Y stage 2112, for example. The combination of the acceleration voltage Vacc for setting energy of the primary electron beam and the retarding voltage RTD is changed according to desired information obtained from the sample 200.

For instance, when a secondary electron image of the sample 200 is obtained, the acceleration voltage Vacc is set to 100 eV to a few thousands eV, for example, and the retarding voltage RTD is set to a set voltage of the secondary electro-optical system 2140 (straight propagation condition of an E×B filter 2134 of the secondary electro-optical system 2140). In the case of obtaining an electron (mirror electron) image generated by perfectly elastic collision between the primary electron beam irradiating the sample 200 and material of the sample 200, the retarding voltage RTD is adjusted. In addition, in the case of obtaining an image of mirror electrons as reflection of the primary electron beam that irradiates the sample and is reflected in the vicinity of the surface of the sample 200 due to an influence of the electrified surface potential of the sample 200, the landing energy LE is set to 0 eV to a few tens eV. In other words, by changing the combination of the acceleration voltage Vacc and the retarding voltage RTD, it is possible to obtain a relationship between the landing energy LE and the luminance difference as illustrated in FIG. 2.

The X-Y stage 2112 is a support table for supporting the sample 200 and can move at least in the horizontal direction. The X-Y stage 2112 is supported on a vibration-preventing table 2114 so that vibration from the floor is not transmitted to the X-Y stage 2112 by action of the vibration-preventing table 2114. In addition, action of the X-Y stage 2112 is controlled by an external stage control unit 2164. The X-Y stage 2112 is provided with the sample voltage adjustment part 2166 for adjusting the retarding voltage RTD to be applied to the sample 200 as described above. The retarding voltage RTD to be applied to the sample 200 is adjusted so as to adjust the landing energy LE of the primary electron beam together with the acceleration voltage Vacc.

The secondary electro-optical system 2140 includes the E×B filter 2134 and a plurality of electrostatic lenses 2136. In the case of the mapping projection type electron microscope illustrated in FIG. 56, the primary electro-optical system 2130 is disposed obliquely to the optical axis of the secondary electro-optical system 2140. The primary electron beam generated from the thermal electron emission type electron gun 2132 irradiates the sample 200 perpendicularly or substantially perpendicularly by action of the E×B filter 2134 constituted of an electric field and a magnetic field, and the secondary electron beam coming back from the sample 200 propagates straight through the E×B filter 2134 of the secondary electro-optical system 2140 in the vertical direction in the figure so as to be guided to the image sensor 2150 by action of the plurality of electrostatic lenses 2136. Note that, the E×B filter 2134 is included in both the primary electro-optical system 2130 and the secondary electro-optical system 2140. Here, in the E×B filter 2134, the magnetic field and the electric field are orthogonal. The electric field is denoted by E, the magnetic field is denoted by B, and a speed of a charged particle (electron beam in this embodiment) is denoted by v. Then, the E×B filter 2134 allows only charged particles satisfying the Wien condition of E=vB to propagate straight and bends orbits of other charged particles. In other words, the E×B filter 2134 generates a force FB due to the magnetic field and a force FE due to the electric field with respect to the primary electron beam so that the orbit of the primary electron beam is bent and guided to the sample. On the other hand, with respect to the secondary electron beam, the E×B filter 2134 generates the force FB due to the magnetic field and the force FE due to the electric field that act in opposite directions. Therefore, the forces are cancelled by each other, and hence the secondary electron beam is guided to the image sensor 2150.

The image sensor 2150 can also perform scan imaging by time delay integration (TDI). Before the TDI, there are disposed the micro channel plate (MCP) for amplifying the electron, the fluorescent screen for converting the amplified electron into light, a fiber optic plate (FOP) for guiding the light to the TDI, and the like. In addition, instead of the TDI, it is possible to use the EB-TDI that can directly receive the electrons (second electron beam) and convert the same to an image. In addition, in the case of taking a still image other than a scan image, it is possible to use a charge coupled device (CCD) instead of the TDI and to use an EB-CCD instead of the EB-TDI. Further, it is possible to dispose the EB-CCD before the TDI so as to use the TDI for the scan image and to use the EB-CCD for the still image. As the image sensor 2150, various types of image sensors can be used, which can detect the electrons (second electron beam) generated from the sample surface simultaneously by a plurality of pixels as a plane.

The image sensor 2150 is connected to a storage device 2152. The storage device 2152 is connected to a control part 2160. The control part 2160 includes the retarding voltage adjustment part 2166 and the acceleration voltage adjustment part 2162.

The X-Y stage control unit 2164 is controlled by the control part 2160 so as to control the moving direction and the moving distance of the X-Y stage 2112 so that the surface of the sample 200 on the X-Y stage 2112 is located at a desired position with respect to the irradiating electron beam.

Next to the vacuum chamber 2174 housing the X-Y stage 2112, there is disposed a preliminary environmental chamber 2214 that can communicate with the vacuum chamber 2174 via a gate valve 2218 that is opened and closed. The preliminary environment chamber 2214 includes a temporary waiting place 2216 for the sample 200 before and after the inspection to wait. In addition, the preliminary environment chamber 2214 is provided with a dry pump 2210 and a turbo molecular pump 2212 that can perform vacuum evacuation so that the vacuum chambers 2172, 2174, and 2176 and the preliminary environment chamber 2214 can be evacuated to vacuum. Note that, the turbo molecular pump 2212 and the dry pump 2210 may further be disposed in each of the vacuum chambers 2172, 2174, and 2176 as necessary.

The storage device 2152 stores sample surface image information obtained by the image sensor 2150. The sample surface image information stored in the storage device 2152 is output to the control part 2160. The control part 2160 controls the retarding voltage adjustment part 2166 and the acceleration voltage adjustment part 2162 so as to adjust the effective landing energy LEeff with respect to the primary electron beam, and controls the stage control unit 2164 so as to control a moving position of the X-Y stage 2112 so that an arbitrary region of the sample surface is irradiated with the primary electron beam. The image sensor 2150 detects the secondary electron beam coming back from the sample surface, and outputs the detected sample surface image to the storage device 2152 to store the sample surface image. The storage device 2152 outputs the stored image to the control part 2160. In the control part 2160, a potential distribution determination part 2163 determines the potential distribution of the sample surface based on the sample surface image input from the storage device 2152, and a potential distribution correction part 2164 adjusts the potential distribution of the sample surface to an arbitrary potential distribution based on the determined potential distribution.

The potential distribution determination part 2163 determines the potential distribution of the surface of the sample 200 using the method described above as the principle. The potential distribution correction part 2164 adjusts the potential distribution of the surface of the sample 200 to an arbitrary potential distribution using the method described above as the principle.

Here, the adjustment method of the potential distribution of the sample surface performed by the control part 2160 is described with reference to a flowchart illustrated in FIG. 58. As illustrated in Step S401 of FIG. 58, the retarding voltage adjustment part 2166 and the acceleration voltage adjustment part 2162 perform adjustment of the effective landing energy LEeff to be set for the primary electron beam irradiating the sample 200 to be inspected. The surface of the sample 200 is irradiated with the primary electron beam for which the effective landing energy LEeff is set, and the secondary electron beam coming back from the surface of the sample 200 is detected by the image sensor 2150. The detected sample surface image is converted into the mean luminance. The sample 200 to be inspected is conveyed from the temporary waiting place 2216 of the preliminary environment chamber 2214 into the vacuum chamber 2174 when the gate valve 2218 is opened and closed. Then, the surface of the conveyed sample 200 is irradiated with the primary electron beam for which the effective landing energy LEeff adjusted by the acceleration voltage adjustment part 2162 and the retarding voltage adjustment part 2166 is set. The irradiation of the primary electron beam having the effective landing energy LEeff set therefor corresponds to the above-mentioned Pre-Dose. The primary electron beam having the effective landing energy LEeff set therefor irradiates the region to be inspected of the surface of the sample 200 or the entire region of the surface of the sample 200 with a magnification that is the same as the magnification specified by the inspection recipe (characteristic and material of the sample (mask)). The secondary electron beam coming back from the sample 200 due to the irradiation of the primary electron beam is detected by the image sensor 2150, and the detected image is converted into the mean luminance so that the luminance distribution having potential distribution and position information of the sample 200 is obtained.

Next, the primary electron beam having the reference landing energy LE0 set therefor irradiates the region to be inspected of the surface of the sample 200 or the entire region of the surface of the sample 200. The luminance difference $\Delta DN$ is determined from the standard luminance A and the mean luminance meanDN detected by the electron beam irradiation including the "Pre-Dose" described above, and the potential $\Delta V$ of the region to be inspected or the entire region of the surface of the sample 200 is determined from the graph of FIG. 50 using the luminance difference $\Delta DN$.

Next, in Step S402, as to the obtained luminance distribution of the sample 200, the potential distribution determination part 2163 of the control part 2160 determines the luminance difference $\Delta DN$ from a difference between the mean luminance meanDN and the standard luminance A of the sample surface. Then, with reference to the graph of FIG. 50, the potential $\Delta V$ is converted from the luminance difference $\Delta DN$ for each region to be measured of the surface of the sample 200.

Next, in Step S403, correction of the potential distribution of the sample 200 is performed, in which the retarding voltage adjustment part 2166 and the acceleration voltage adjustment part 2162 adjust the landing energy LE to cancel the potential of each region of the sample 200 or to electrify the same to an arbitrary potential based on the obtained potential ΔV and the position information (X-Y coordinates) of the region to be measured of the surface of the sample 200. In Step S401, the sample surface is irradiated with the primary electron beam again while the landing energy LE is adjusted for each region of the sample 200 irradiated with the primary electron beam, and hence the static electricity of the electrified sample 200 is removed or set to an arbitrary potential. The potentials of the inspection regions of the sample 200 are all equalized by the removal of static electricity or potential setting, and a variation of the sensitivity due to a difference of the electrified state among the inspection regions of the sample hardly occurs in the image detected when being irradiated with the primary electron beam. In addition, even in the case where the sample is inspected repeatedly, a variation of the potential distribution hardly occurs among the inspection regions.

When the sample 200 is inspected, an influence of the electrification can be removed again by the adjustment of the retarding voltage RTD. In addition, when the potential of the surface of the sample 200 is adjusted by the retarding voltage RTD, the dose to the sample can be known from the current density of the electron gun and the inspection speed of the inspection apparatus. Therefore, an increase of potential of the surface of the sample 200 can be determined in advance by one inspection, and the effective landing energy LEeff can be constant by correcting the increase of potential by adjustment of the retarding voltage RTD. In other words, the luminance difference ΔDN between the mean luminance and the standard luminance of the surface of the sample 200 is converted into the potential distribution, and the converted potential distribution is used so that the potential of the surface of the sample 200 can be set to be uniform (static electricity is removed to 0V), or can be set to an arbitrary potential (a positive potential or a negative potential).

Next, the case where the sample 200 to be inspected is exchanged or the sample 200 is inspected again is described. When the sample 200 is exchanged or inspected again, there are a case where the potential distribution of the sample surface is changed and further a case where the entire potential distribution of the sample surface is changed. Therefore, when the sample is exchanged or the same sample is inspected again, it is necessary to adjust the landing energy LE for each inspection. In this case, luminance of an arbitrary region of the surface of the sample 200 is checked, and using the luminance distribution of the sample 200 described above, the landing energy LE is adjusted based on a difference between the mean luminance meanDN and the standard luminance A obtained from the luminance distribution. Thus, the potential distribution of the surface of the sample 200 can be adjusted again to be uniform.

As described above, as to the effective landing energy LEeff, optimized parameters other than the landing energy LE (for example, the NA position and the size of the inspection apparatus, the Wien condition, and the current density) are set according to the inspection recipe (characteristics or the like of the sample (mask)). Thus, the inspection with good reproducibility can be realized.

Note that, the electro-optical inspection apparatus is used in a case where a defect of the sample surface pattern is inspected, in a case where dust or particles on the sample surface are detected, in a case where dust or particles on a multilayered film formed on the sample surface or a portion having different thickness partially or locally are/is detected, and further in a case where both shapes of a pattern formed on the sample surface (see FIG. 54) and a pattern formed in a multilayered film are detected so that the sample potentials are compared. In each case, the inspection can be performed with the effective landing energy LEeff suitable for the inspection of the sample surface, and the inspection can also be performed by the irradiation with the charged particles (electron beam) having the landing energy LE of different combinations or the same combination a plurality of times. Note that, the electron beam to irradiate the sample surface is not limited to a charged particle beam but can be a beam that generates a potential difference on the sample surface and can expect that the electron beam comes back from the sample, for example, a high speed atom beam.

If the electron beam irradiates the sample surface a plurality of times, and if dust or particles on the sample are inspected, for example, the inspection is performed by irradiating the sample surface for the first time with the electron beam for which the effective landing energy LEeff is set to 10 eV to 30 eV, for example, so as to electrify slightly positively based on information obtained from the potential distribution of the sample surface, and next irradiating the sample surface with the electron beam for which the landing energy LE is set to 3.5 eV, for example, so that the luminance of dust or particles on the sample can be maximum. Then, dust or particles on the sample can be detected with high sensitivity.

In addition, when the sample surface pattern inspection is performed, if the sample surface is made of at last two types of materials, the inspection is performed in the following manner. The sample surface is irradiated for the first time with the electron beam for which the effective landing energy LEeff is set to 2 eV to 7 eV, for example, so that one of the materials becomes bright, namely to electrify to a slightly negative potential, based on information obtained from the "potential distribution of the sample surface" (see FIG. 50). Then, the landing energy LE for the inspection is set so that a difference of luminance between one of the materials and the other material generated by the first irradiation, namely the contrast becomes maximum. For instance, the landing energy LE is set to 2 eV to 5 eV, and the electron beam for which the above-mentioned landing energy LE is set irradiates the sample surface. Then, the potential distribution of the sample surface can be inspected with high sensitivity.

Figure 58:
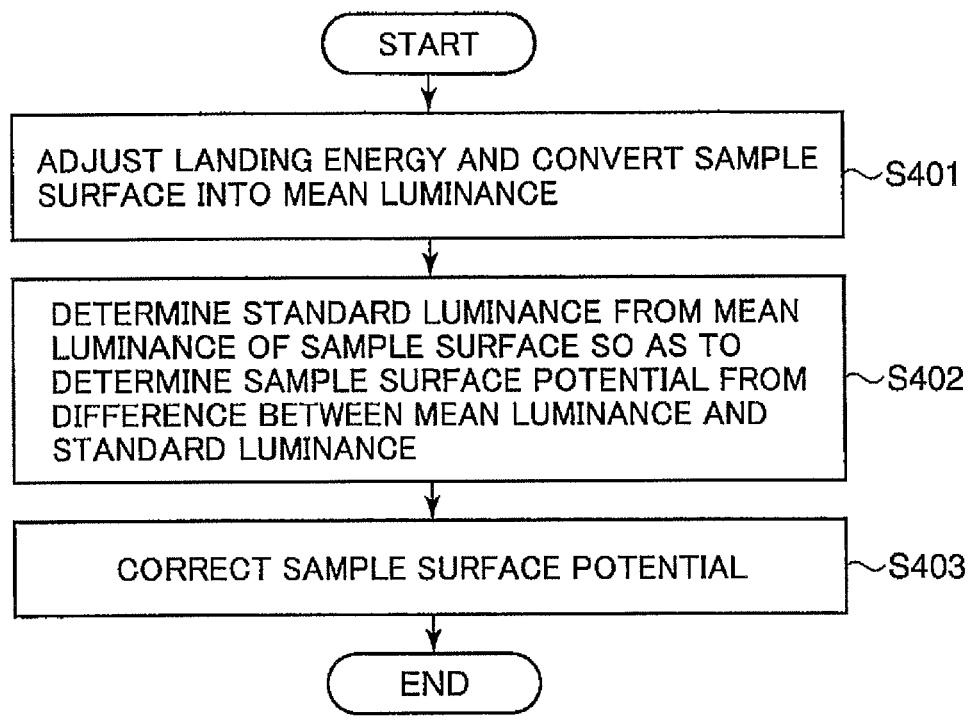
FIG. 58 is a flowchart illustrating an example of an adjustment method of potential distribution on the sample surface according to the present invention.

The adjustment method of the potential distribution of the sample surface illustrated in FIG. 58 can be performed also in the sample observation system illustrated in FIG. 2. In other words, if the system control part 950 of the system illustrated in FIG. 2 is structured to be capable of performing the same function as the control part 2160 of the sample observation system illustrated in FIG. 56, the potential distribution can be adjusted.

In the sample observation system illustrated in FIG. 57, a scanning electron microscope (SEM) 3200 is used as the electro-optical inspection apparatus as described above. The SEM 3200 includes a thermal electron emission type electron gun 3320 as the electron beam generating source for generating the primary electron beam, a primary electro-optical system 3300 for guiding the primary electron beam to the sample 200 to be scanned, a secondary electro-optical system 3400 having a detector 3100 for detecting the secondary electron beam coming back from the sample surface when the primary electron beam scans the sample surface, and the X-Y stage 2112 on which the sample 200 is placed and which is capable of moving at least in one direction. Those components are housed in vacuum chambers 3720, 3740, and 3760, respectively.

The thermal electron emission type electron gun 3320 uses mainly $LaB_6$, but it is possible to use a filament made of tungsten, or a cathode made of a tungsten-based compound such as Th—W or W2C, or made of oxide such as BaCO$_3$, SrCO$_3$, or CaCO$_3$.

The primary electro-optical system 3300 is means for guiding the primary electron beam generated from the thermal electron emission type electron gun 3320 to the sample 200, and includes an E×B filter 3340, and a plurality of electrostatic lenses or electromagnetic lenses 3240. In the case of the SEM 3200 illustrated in FIG. 57, the secondary electro-optical system 3400 is disposed obliquely to the optical axis of the primary electro-optical system 3300. The primary electron beam generated from the electron gun 3320 is condensed by the plurality of electromagnetic lenses 3240 to be a thin electron beam and irradiates the sample 200 perpendicularly or substantially perpendicularly by action of the E×B filter 3340 constituted of an electric field and a magnetic field. The secondary electron beam coming back from the sample 200 propagates straight through the E×B filter 3340 of the primary electro-optical system 3400 in the left direction in the figure so as to be guided to the detector 3100. Note that, the E×B filter 3340 is included in both the primary electro-optical system 3300 and the secondary electro-optical system 3400.

The secondary electro-optical system 3400 includes the detector 3100 for detecting the secondary electron beam coming back from the sample surface. As the detector 3100, a secondary electron multiplier tube is mainly used. The detector 3100 is connected to a control part 3160.

In FIG. 57, the element denoted by the same numeral or symbol as in FIG. 56 is the same element as in FIG. 56, and detailed description thereof is omitted.

The sample observation systems of FIGS. 56 and 57 are used in a case where a defect of the pattern is inspected, in a case where dust or particles on the sample are detected, in a case where dust or particles on a multilayered film formed on the sample or a portion having different thickness partially or locally are/is detected, and further in a case where both shapes of a pattern formed on the sample (see FIG. 54) and a pattern formed in a multilayered film are detected so that the sample potentials are compared. In each case, the inspection can be performed with the effective landing energy LEeff suitable for the inspection of the sample surface, and the inspection can also be performed by the irradiation with the charged particles (electron beam) having the landing energy LE of different combinations or the same combination a plurality of times. In this case, the electron beam to irradiate the sample surface is not limited to a charged particle beam but can be a beam that generates a potential difference on the sample surface and can expect that the electron beam comes back from the sample, for example, a high speed atom beam.

As described above, the foreign matter adhesion prevention method and the electron beam inspection method of the present invention are described with reference to various embodiments. According to these foreign matter adhesion prevention method and the electro-optical inspection apparatus of the present invention, dust or particles such as particles coming toward the sample can be blocked by the dust collecting electrode disposed to surround the periphery of the sample. Therefore, it is possible to prevent the dust or particles such as particles from adhering to the sample surface. In addition, because adhesion of dust or particles such as particles to the sample surface can be prevented, it is possible to perform inspection of, in particular, an ultrafine pattern of 100 nm or smaller, a structural evaluation, an enlarged observation, a material evaluation, electrically conductive state, and the like of the sample surface with high accuracy and high efficiency.

In addition, according to the present invention, even if an insulation region and a conductive region are formed on the sample surface, a high contrast image of the sample surface can be obtained, and it is easy to classify a type of the defect (a short defect or an open defect). In addition, according to the present invention, static electricity due to charge-up on the sample surface can be removed efficiently. Therefore, blurring of a sample image due to the charge-up can be prevented. Thus, together with an effect of preventing adhesion of the dust or particles, it is possible to perform inspection with very high accuracy.

While the present invention has been described above in detail with reference to the exemplary embodiments, it is to be understood that the invention is not limited to the above-mentioned exemplary embodiments, and various modifications and replacement may be made thereto.

What is claimed is:

1. An electro-optical inspection apparatus for inspecting a surface of a sample using an electron beam, the electro-optical inspection apparatus comprising:

an electron beam source;

a primary electro-optical system comprising at least a primary lens for inducing a primary electron beam emitted from the electron beam source;

a stage for mounting the sample thereon, the surface of the sample being irradiated with the primary electron beam induced through the primary electro-optical system;

a secondary electro-optical system comprising at least a secondary lens and an aperture for defining a numerical aperture (NA), and for inducing secondary electrons and mirror electrons, the secondary electrons being emitted from the sample surface when irradiating the sample surface with the primary electron beam, and the mirror electrons being reflected from the sample surface and a vicinity thereof when irradiating the sample surface with the primary electron beam;

a detector for detecting at least either of the secondary electrons or the mirror electrons induced through the secondary electro-optical system;

a first power source for supplying a first voltage to the sample mounted on the stage;

an energy control means for setting an energy of the primary electron beam directed to the sample surface and an energy supplied to the sample such that electrons directed from the sample surface to the detector are within a transition band which contains the mirror electrons and the secondary electrons;

an aperture adjustment mechanism for adjusting a location of at least the aperture on a plane perpendicular to an axis of the secondary electro-optical system, so that electrons from a conductive material region of the sample surface and electrons from a nonconductive material region of the sample surface are selectively induced to the detector;

a first electrode located to surround the sample mounted on the stage, the first electrode for collecting dust or particles;

a second power source for supplying a second voltage to the first electrode, wherein the second voltage has a same polarity as that of the first voltage and an absolute value which is equal to or larger than that of the first voltage;

a first terminal plate comprising at least two terminals, one of the at least two terminals being connected to the first power source and another of the at least two terminals being connected to the second power source;

a cable including two electrical wires, first ends of the two electrical wires being connected to the at least two terminals of the first terminal plate, respectively;

a box containing the first terminal plate therein, a portion of the cable, and a second electrode for collecting dust or particles in the box, the portion of the cable contained in the box being supported to be flexibly bendable; and a second terminal plate fixed at the stage and comprising at least two terminals connected to second ends of the two electrical wires, the at least two terminals of the second terminal plate to supply the first and second voltages to the sample and the first electrode, wherein a portion of the cable between the box and the second terminal plate is supported to extend linearly, and the portion of the cable contained in the box bends or extends as the stage is moved.

2. The apparatus according to claim 1, further comprising:
a second electrode located to surround the first electrode, the second electrode for collecting dust or particles; and
a third power source for supplying a third voltage to the second electrode, wherein the third voltage has a same polarity as that of the first voltage and an absolute value which is equal to or larger than that of the first voltage.

3. The apparatus according to claim 1, further comprising:
a plate located over the sample mounted on the stage to cover the sample, the plate having an aperture through which an electron beam passes to/from the sample surface.

4. The apparatus according to claim 1, further comprising:
a cover surrounding the stage for preventing dust or particles from flowing to the stage.

5. The apparatus according to claim 1, further comprising:
a chamber capable of being evacuated and containing the stage therein; and
a device for performing electrolytic dissociation of gases in the chamber during a process of vacuuming the chamber to eliminate static electricity which exists on structures in the chamber and materials on the structures.

6. The apparatus according to claim 1, further comprising:
a chamber capable of being evacuated and containing the stage therein, inner walls of the chamber having at least a hole, or comprising mesh-metallic plates attached thereto, the mesh-metallic plates being supplied with a predetermined voltage.

7. The apparatus according to claim 1, wherein the secondary electro-optical system comprises a plurality of apertures having different diameters, respectively, the aperture adjustment mechanism selects one of the apertures and adjusts its location of the selected one of the apertures such that the electrons from either of the conductive material region and the nonconductive material region pass through the selected aperture to the detector.

8. The apparatus according to claim 1, wherein the detector comprises EB-CCD(s) or EB-TDI(s).

* * * * *